United States Patent
Knowles et al.

(10) Patent No.: US 7,061,961 B2
(45) Date of Patent: Jun. 13, 2006

(54) VERY NARROW BAND, TWO CHAMBER, HIGH REP-RATE GAS DISCHARGE LASER SYSTEM

(75) Inventors: David S. Knowles, San Diego, CA (US); Daniel J. W. Brown, San Diego, CA (US); Herve A. Besaucele, San Diego, CA (US); David W. Myers, Poway, CA (US); Alexander I. Ershov, San Diego, CA (US); William N. Partlo, Poway, CA (US); Richard L. Sandstrom, Encinitas, CA (US); Palash P. Das, Vista, CA (US); Stuart L. Anderson, San Diego, CA (US); Igor V. Fomenkov, San Diego, CA (US); Richard C. Ujazdowski, Poway, CA (US); Eckehard D. Onkels, San Diego, CA (US); Richard M. Ness, San Diego, CA (US); Scot T. Smith, Winter Springs, FL (US); William G. Hulburd, San Diego, CA (US); Jeffrey Oicles, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 55 days.

(21) Appl. No.: 11/199,691

(22) Filed: Aug. 9, 2005

(65) Prior Publication Data

US 2005/0271109 A1    Dec. 8, 2005

Related U.S. Application Data

(63) Continuation of application No. 10/627,215, filed on Jul. 24, 2003, which is a continuation of application No. 10/012,002, filed on Nov. 30, 2001, now Pat. No. 6,625,191, which is a continuation-in-part of application No. 10/006,913, filed on Nov. 29, 2001, now Pat. No. 6,535,531, which is a continuation-in-part of application No. 09/943,343, filed on Aug. 29, 2001, now Pat. No. 6,567,450, which is a continuation-in-part of application No. 09/854,097, filed on May 11, 2001, now Pat. No. 6,757,316, which is a continuation-in-part of application No. 09/848,043, filed on May 3, 2001, now Pat. No. 6,549,551, which is a continuation-in-part of application No. 09/794,782, filed on Feb. 27, 2001, now Pat. No. 6,532,247, which is a continuation-in-part of application No. 09/684,629, filed on Oct. 6, 2000, now Pat. No. 6,442,181, which is a continuation-in-part of application No. 09/597,812, filed on Jun. 19, 2000, now Pat. No. 6,529,531, which is a continuation-in-part of application No. 09/501,160, filed on Feb. 9, 2000, now Pat. No. 6,621,846, which is a continuation-in-part of application No. 09/459,165, filed on Dec. 10, 1999, now Pat. No. 6,370,174.

(51) Int. Cl.
*H01S 3/22* (2006.01)

(52) U.S. Cl. .................. 372/57; 372/55; 372/58; 372/59; 372/60

(58) Field of Classification Search ............. 372/55, 372/57–60
See application file for complete search history.

(56) References Cited

U.S. PATENT DOCUMENTS

| | | | |
|---|---|---|---|
| 4,223,279 A | 9/1980 | Bradford, Jr. et al. | 331/94.5 |
| 4,455,658 A | 6/1984 | Sutter et al. | 372/38 |
| 4,550,408 A | 10/1985 | Karning et al. | 372/58 |
| 4,891,820 A | 1/1990 | Rando et al. | 372/93 |
| 4,959,840 A | 9/1990 | Akins et al. | 372/57 |
| 5,005,180 A | 4/1991 | Edelman et al. | 372/57 |
| 5,023,884 A | 6/1991 | Akins et al. | 372/57 |
| 5,025,445 A | 6/1991 | Anderson et al. | 372/20 |
| 5,025,446 A | 6/1991 | Kuizenga | 372/21 |
| 5,189,678 A | 2/1993 | Ball et al. | 372/28 |
| 5,313,481 A | 5/1994 | Cook et al. | 372/37 |
| 5,315,611 A | 5/1994 | Ball et al. | 372/56 |
| 5,359,620 A | 10/1994 | Akins | 372/58 |
| 5,448,580 A | 9/1995 | Birx et al. | 372/38 |
| 5,471,965 A | 12/1995 | Kapich | 123/565 |
| 5,852,621 A | 12/1998 | Sandstrom | 372/25 |

| | | | |
|---|---|---|---|
| 5,953,360 A | 9/1999 | Vitruk et al. | 372/87 |
| 5,978,394 A | 11/1999 | Newman et al. | 372/32 |
| 6,005,879 A | 12/1999 | Sandstrom et al. | 372/25 |
| 6,016,325 A | 1/2000 | Ness et al. | 372/38 |
| 6,018,537 A | 1/2000 | Hofmann et al. | 372/25 |
| 6,028,880 A | 2/2000 | Carlesi et al. | 372/58 |
| 6,067,311 A | 5/2000 | Morton et al. | 372/57 |
| 6,094,448 A | 7/2000 | Fomenkov et al. | 372/102 |
| 6,104,735 A | 8/2000 | Webb | 372/37 |
| 6,128,323 A | 10/2000 | Myers et al. | 372/38 |
| 6,151,349 A | 11/2000 | Gong et al. | 372/58 |
| 6,164,116 A | 12/2000 | Rice et al. | 73/1.72 |
| 6,192,064 B1 | 2/2001 | Algots et al. | 372/99 |
| 6,208,674 B1 | 3/2001 | Webb et al. | 372/57 |
| 6,208,675 B1 | 3/2001 | Webb | 372/58 |
| 6,219,368 B1 | 4/2001 | Govorkov | 372/59 |
| 6,240,117 B1 | 5/2001 | Gong et al. | 372/58 |
| 6,370,174 B1* | 4/2002 | Onkels et al. | 372/38.04 |
| 6,414,979 B1 | 7/2002 | Ujazdowski et al. | 372/87 |
| 6,442,181 B1* | 8/2002 | Oliver et al. | 372/25 |
| 6,466,602 B1* | 10/2002 | Fleurov et al. | 372/87 |
| 6,477,193 B1 | 11/2002 | Oliver et al. | 372/58 |
| 6,529,531 B1* | 3/2003 | Everage et al. | 372/20 |
| 6,532,247 B1* | 3/2003 | Spangler et al. | 372/57 |
| 6,535,531 B1* | 3/2003 | Smith et al. | 372/25 |
| 6,538,737 B1 | 3/2003 | Sandstrom et al. | 356/334 |
| 6,549,551 B1* | 4/2003 | Ness et al. | 372/38.07 |
| 6,567,450 B1* | 5/2003 | Myers et al. | 372/55 |
| 6,584,132 B1* | 6/2003 | Morton | 372/57 |
| 6,621,846 B1* | 9/2003 | Sandstrom et al. | 372/57 |
| 6,625,191 B1* | 9/2003 | Knowles et al. | 372/55 |
| 6,671,294 B1 | 12/2003 | Kroyan et al. | 372/20 |
| 6,757,316 B1* | 6/2004 | Newman et al. | 372/57 |
| 6,795,474 B1 | 9/2004 | Partlo et al. | 372/57 |
| 2002/0114370 A1* | 8/2002 | Onkels et al. | 372/55 |
| 2004/0047385 A1* | 3/2004 | Knowles et al. | 372/55 |

\* cited by examiner

*Primary Examiner*—Min Sun Oh Harvey
*Assistant Examiner*—Delma R. Flores-Ruiz
(74) *Attorney, Agent, or Firm*—William Cray

(57) ABSTRACT

An oscillator-amplifier gas discharge laser system and method is disclosed which may comprise a first laser unit which may comprise a first discharge region which may contain an excimer or molecular fluorine lasing gas medium; a first pair of electrodes defining the first discharge region containing the lasing gas medium, a line narrowing unit for narrowing a spectral bandwidth of output laser light pulse beam pulses produced in said first discharge region; a second laser unit which may comprise a second discharge chamber which may contain an excimer or molecular fluorine lasing gas medium; a second pair of electrodes defining the second discharge region containing the lasing gas medium; a pulse power system providing electrical pulses to the first pair of electrodes and to the second pair of electrodes producing gas discharges in the lasing gas medium between the respective first and second pair of electrodes, and laser parameter control mechanism modifying a selected parameter of a selected laser output light pulse beam pulse produced by said gas discharge laser system by controlling the timing of the occurrence of the gas discharge between the first pair of electrodes and the occurrence of the gas discharge between the second pair of electrodes.

20 Claims, 61 Drawing Sheets

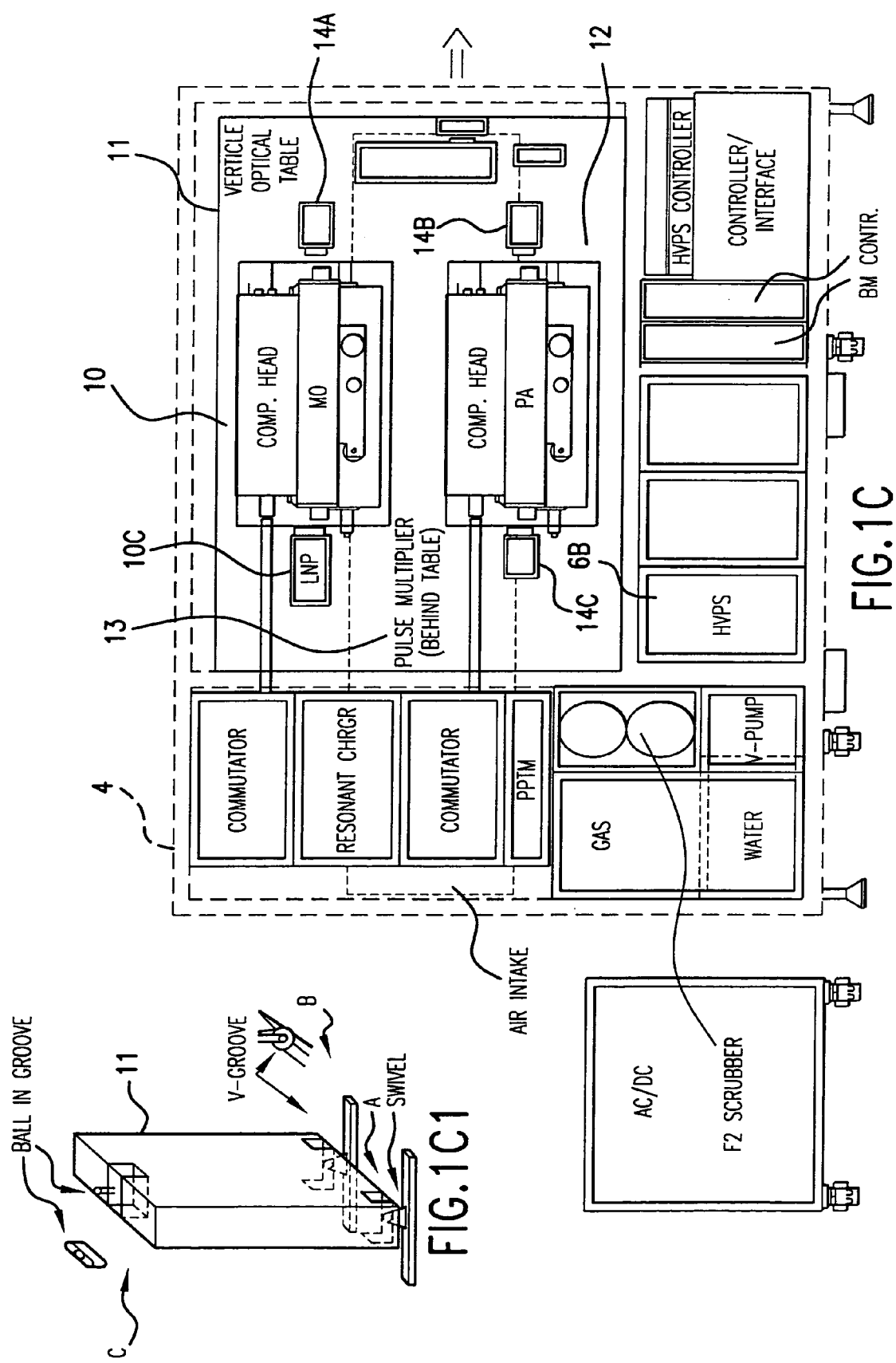

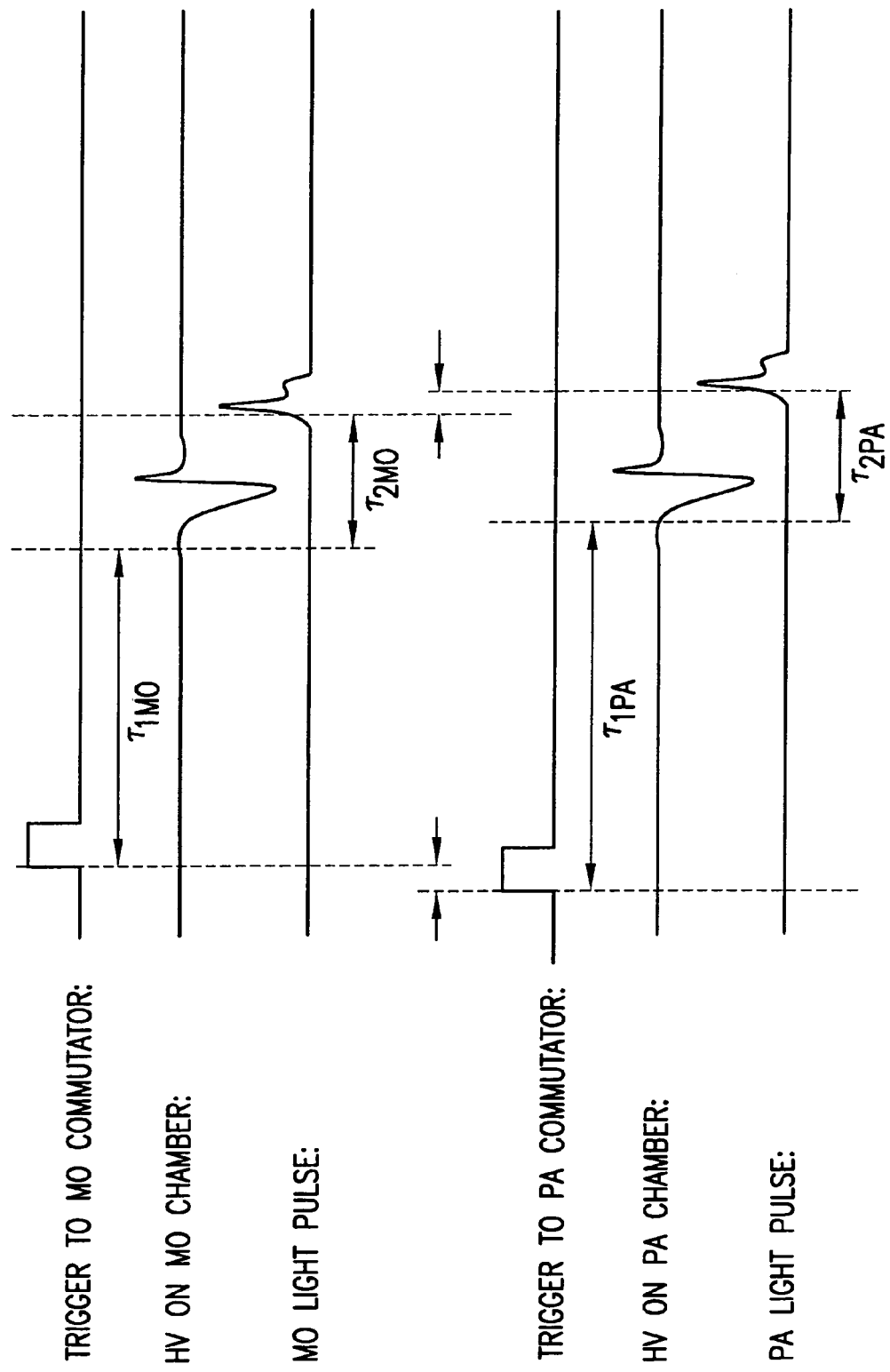

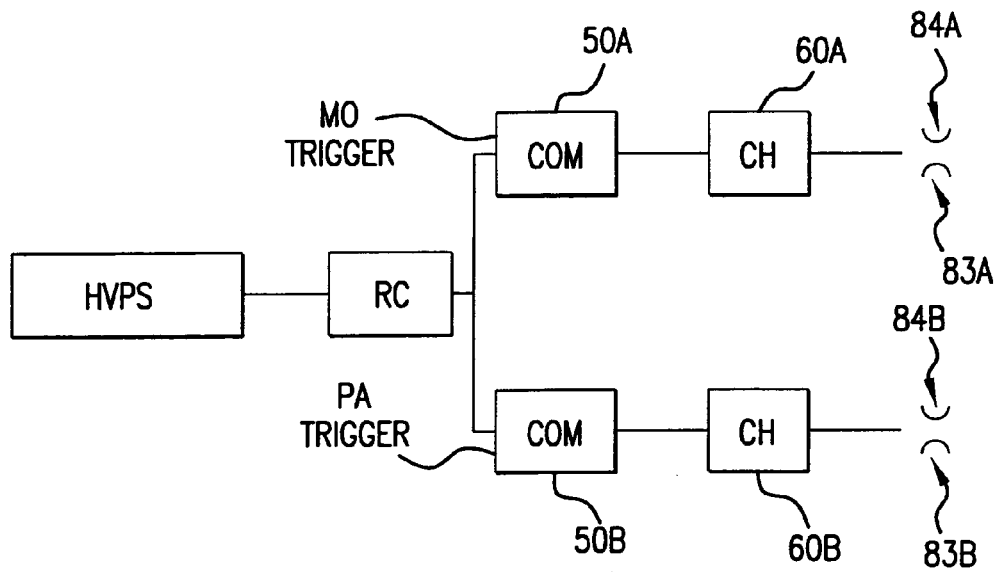
FIG.5C1
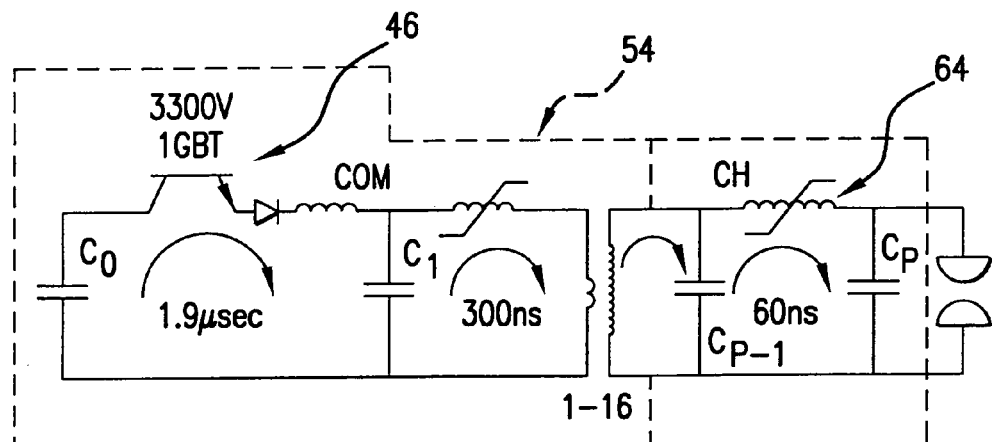
FIG.5C2
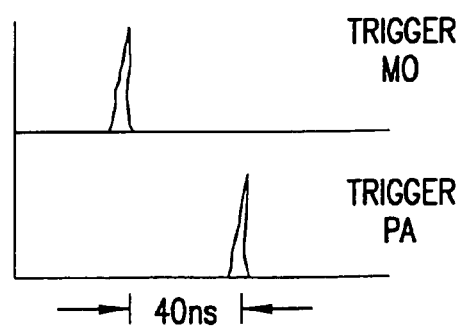
FIG.5C3

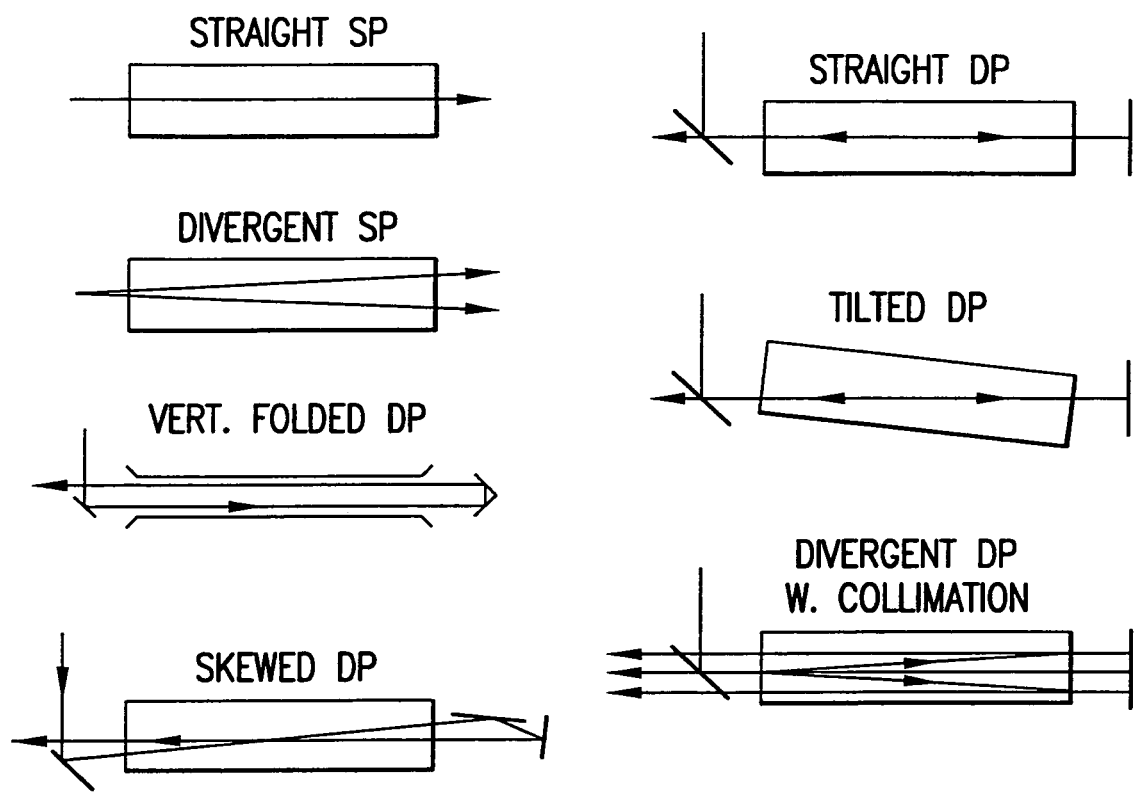
FIG.6A1

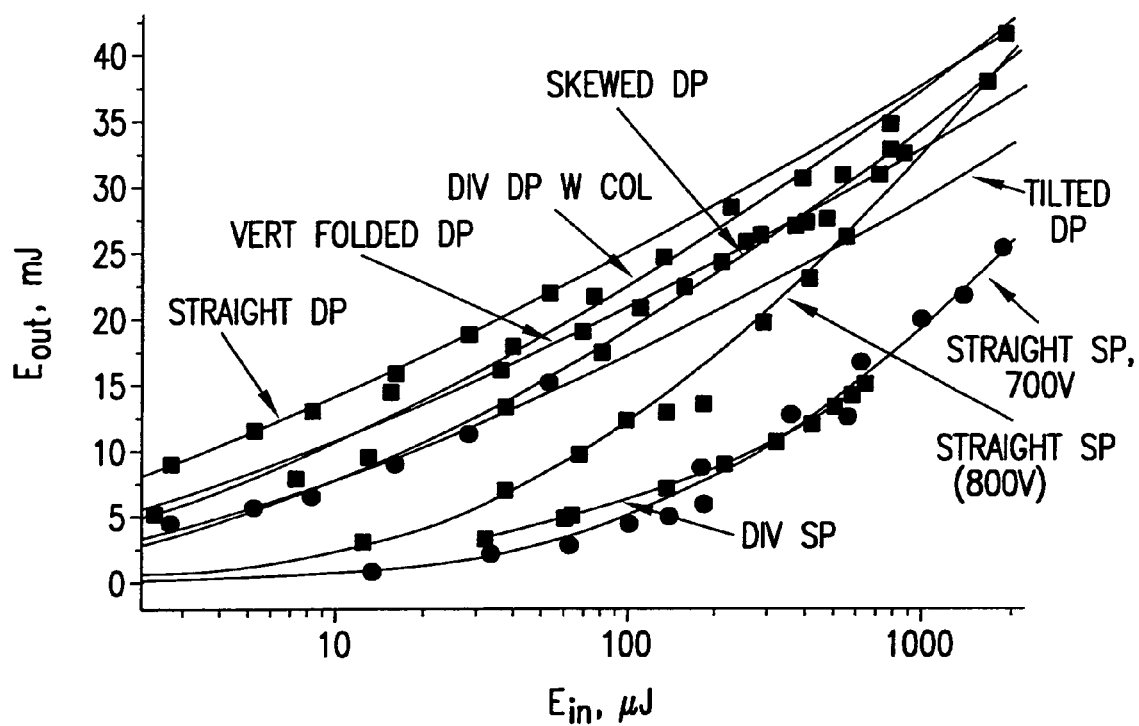
FIG.6A2

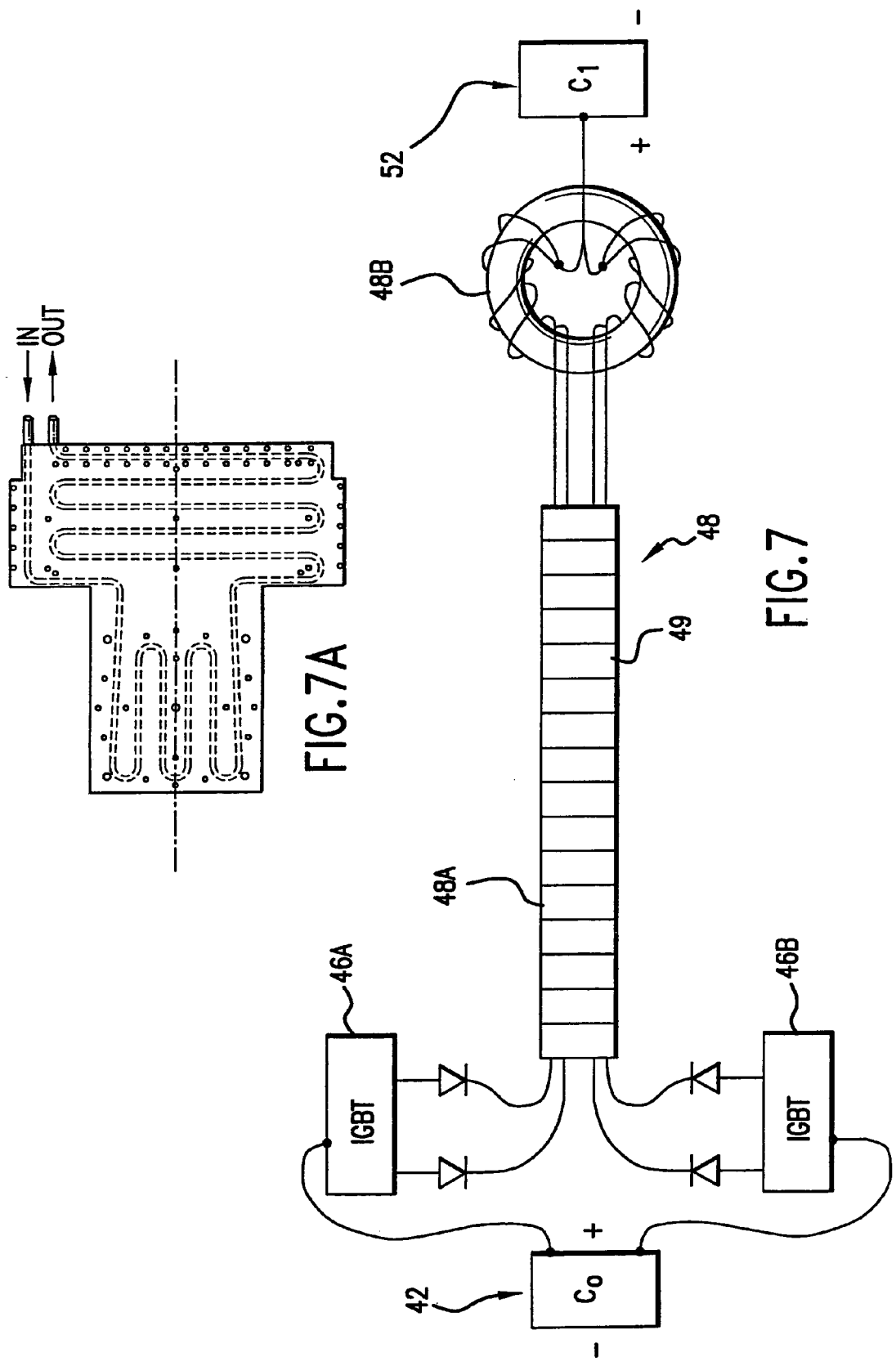

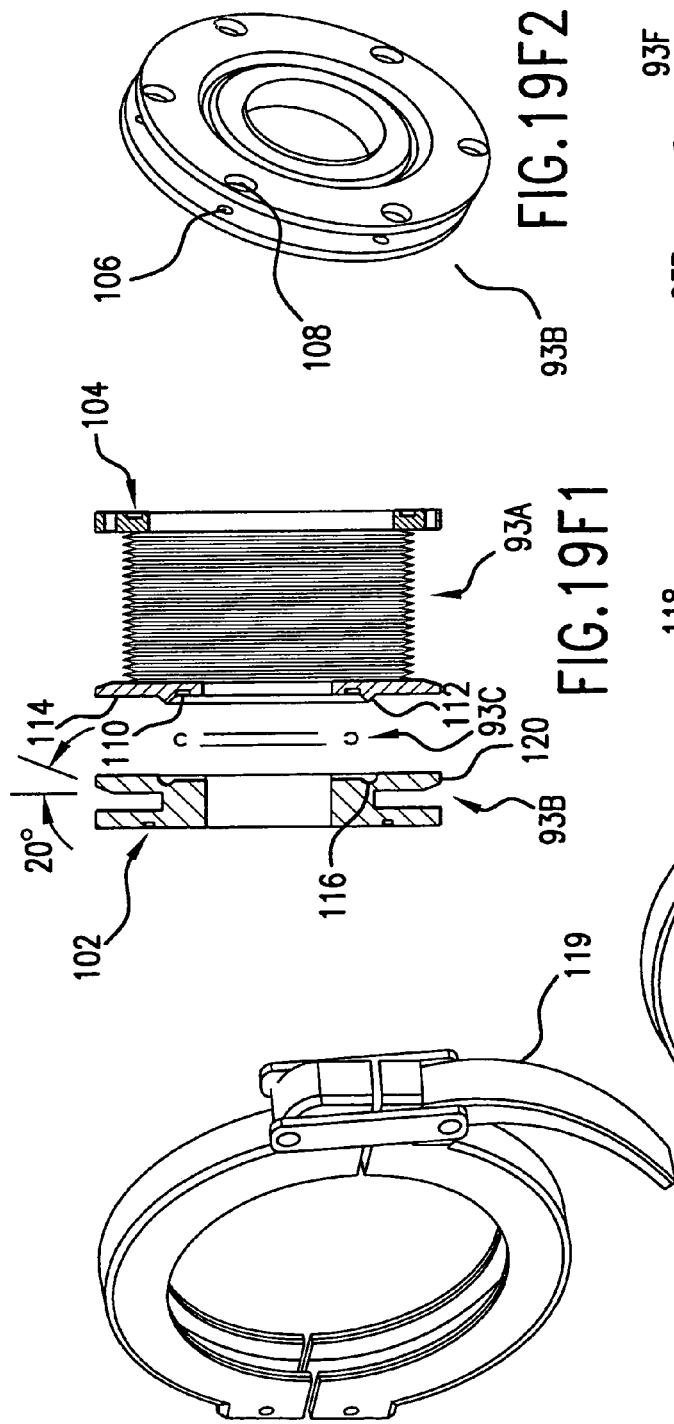
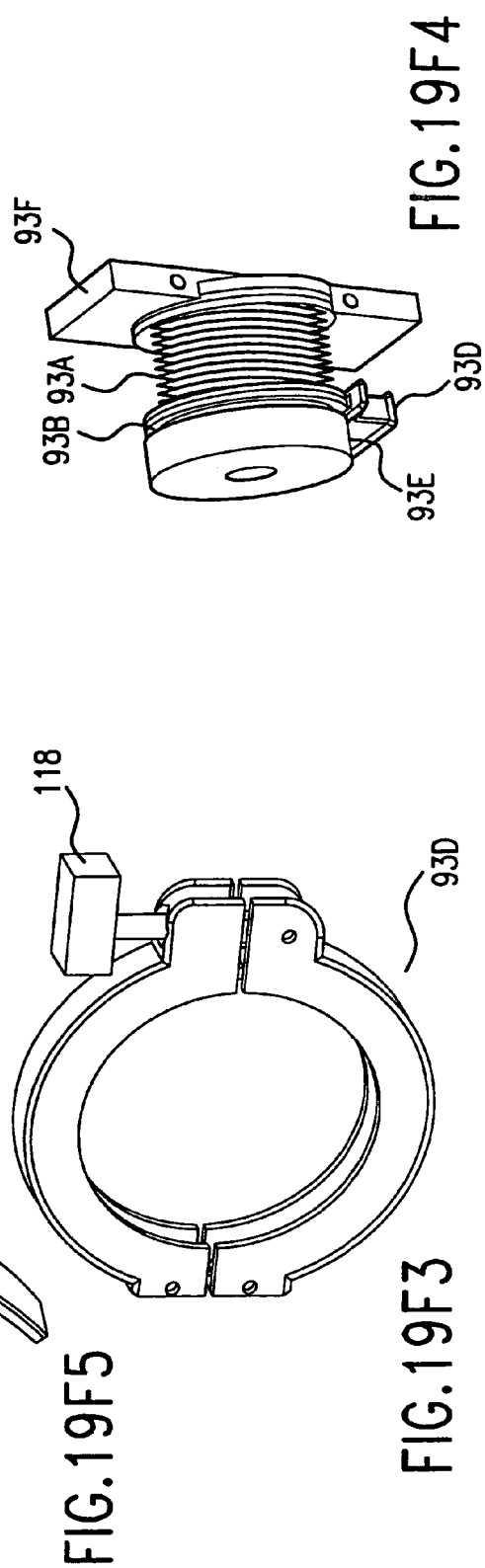

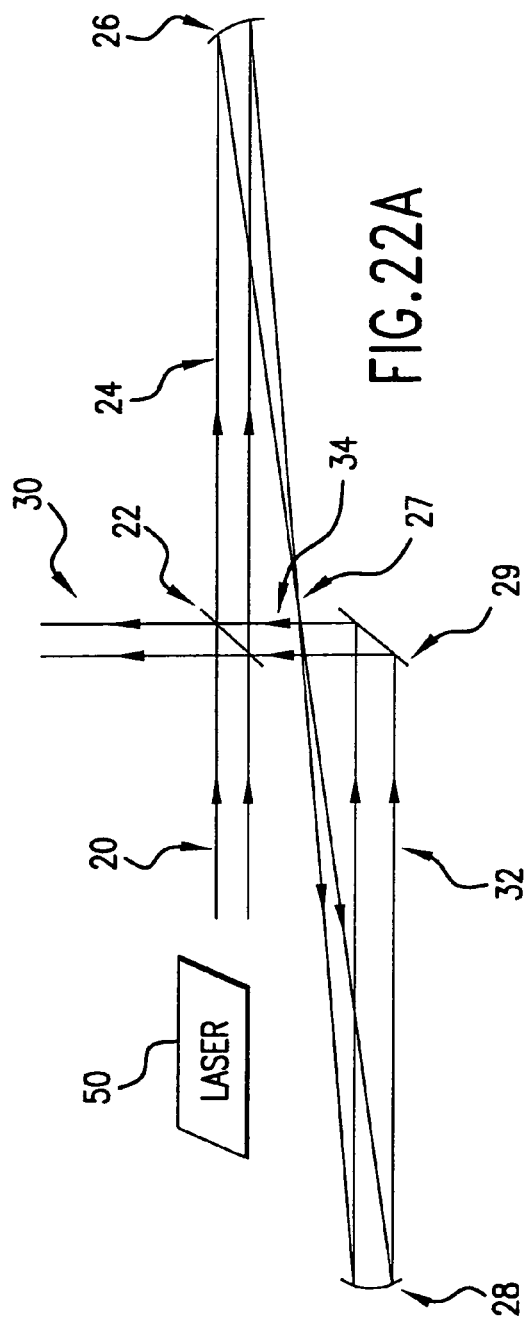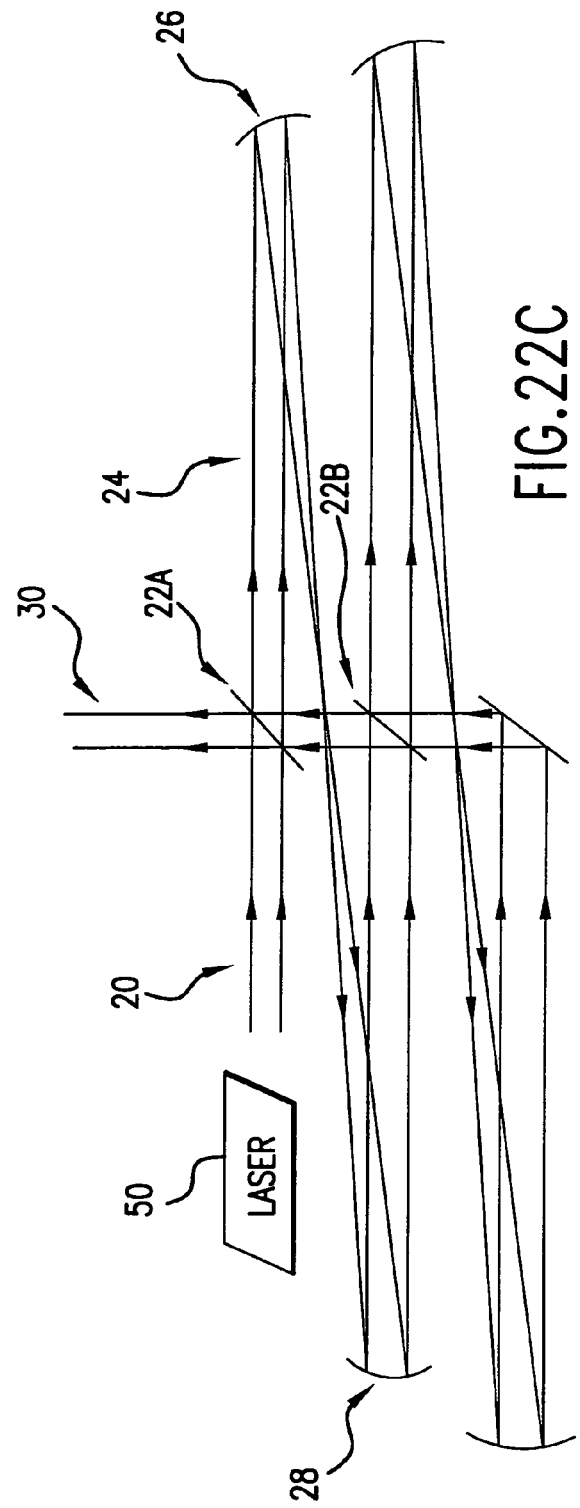

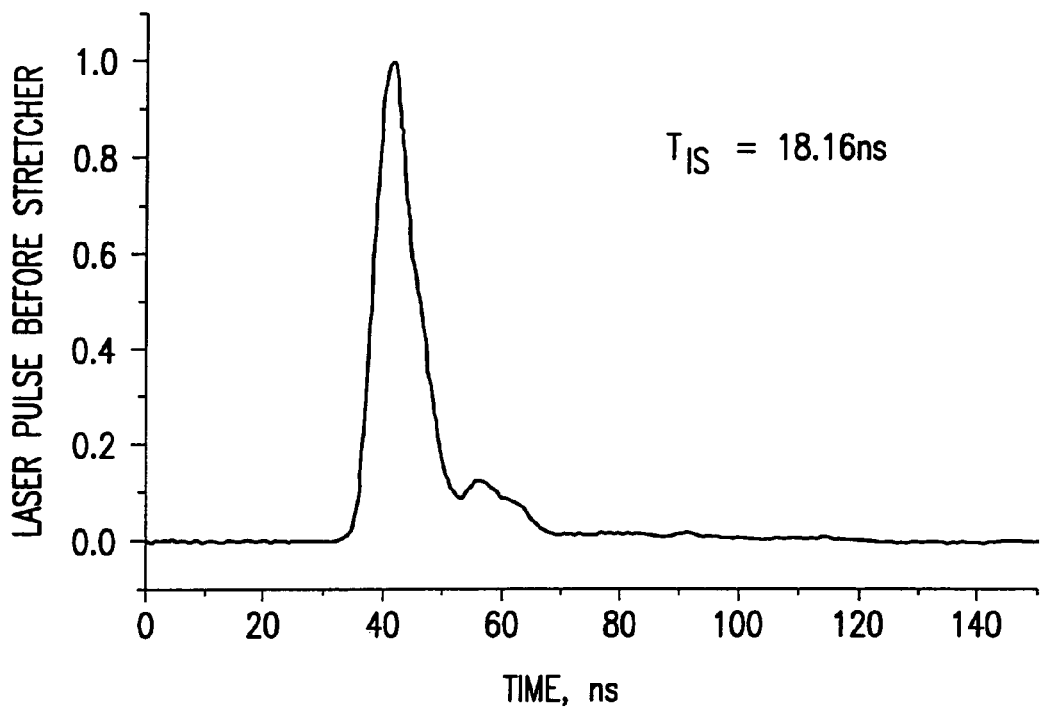
FIG.22B1
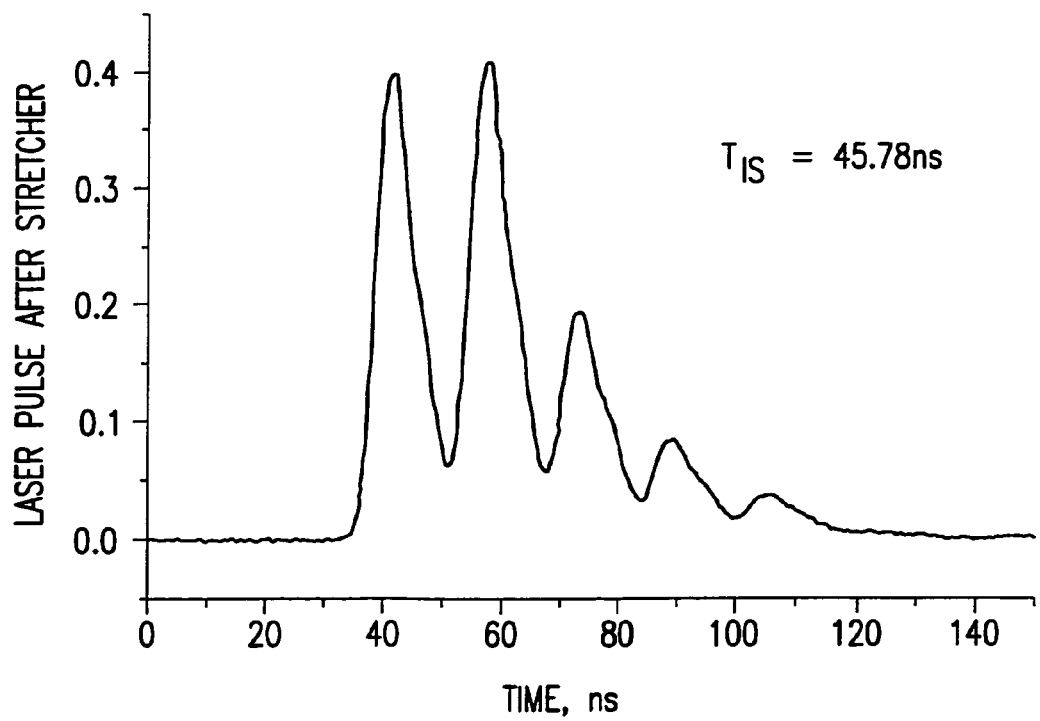
FIG.22B2

VERY NARROW BAND, TWO CHAMBER, HIGH REP-RATE GAS DISCHARGE LASER SYSTEM

CROSS-REFERENCE TO RELATED APPLICATIONS

The present invention is a continuation of Ser. No. 10/627,215, filed Jul. 24, 2003, which is a continuation of U.S. Ser. No. 10/012,002 filed Nov. 30, 2001, now U.S. Pat. No. 6,625,191, which is a continuation-in-part of U.S. Ser. No. 10/006,913 filed Nov. 29, 2001, which issued on Mar. 18, 2003 as U.S. Pat. No. 6,535,531, Ser. No. 09/943,343 filed Aug. 29, 2001, which issued on May 20, 2003 as U.S. Pat. No. 6,567,450, Ser. No. 09/854,097, filed May 11, 2001, now U.S. Pat. No. 6,757,316, Ser. No. 09/848,043 filed May 3, 2001, which issued on Apr. 15, 2003 as U.S. Pat. No. 6,549,551, Ser. No. 09/459,165, which issued on Apr. 9, 2002 as U.S. Pat. No. 6,370,174, Ser. No. 09/794,782, which issued on Mar. 11, 2003 as U.S. Pat. No. 6,532,241, Ser. No. 09/771,789 filed Jan. 29, 2001, which issued on Mar. 25, 2003 as U.S. Pat. No. 6,539,042, Ser. No. 09/768,753 filed Jan. 23, 2001, which issued on Jul. 2, 2002 as U.S. Pat. No. 6,414,979, Ser. No. 09/684,629, which issued on Aug. 27, 2002 as U.S. Pat. No. 6,442,181, Ser. No. 09/597,812, which issued on Mar. 4, 2003 as U.S. Pat. No. 6,529,531 and Ser. No. 09/473,852, filed Dec. 27, 1999 now U.S. Pat. No. 6,539,046. This invention relates to electric discharge gas lasers and in particular to very narrow band high repetition rate injection seeded gas discharge lasers.

BACKGROUND OF THE INVENTION

An oscillator-amplifier gas discharge laser system and method is disclosed which may comprise a first-laser unit which may comprise a first discharge region which may contain an excimer or molecular fluorine lasing gas medium; a first pair of electrodes defining the first discharge region containing the lasing gas medium, a line narrowing unit for narrowing a spectral bandwidth of output laser light pulse beam pulses produced in said first discharge region; a second laser unit which may comprise a second discharge chamber which may contain an excimer or molecular fluorine lasing gas medium; a second pair of electrodes defining the second discharge region containing the lasing gas medium; a pulse power system providing electrical pulses to the first pair of electrodes and to the second pair of electrodes producing gas discharges in the lasing gas medium between the respective first and second pair of electrodes, and laser parameter control mechanism modifying a selected parameter of a selected laser output light pulse beam pulse produced by said gas discharge laser system by controlling the timing of the occurrence of the gas discharge between the first pair of electrodes and the occurrence of the gas discharge between the second pair of electrodes.

Electric Discharge Gas Lasers

Electric discharge gas lasers are well known and have been available since soon after lasers were invented in the 1960s. A high voltage discharge between two electrodes excites a laser gas to produce a gaseous gain medium. A resonance cavity containing the gain medium permits stimulated amplification of light which is then extracted from the cavity in the form of a laser beam. Many of these electric discharge gas lasers are operated in a pulse mode.

Excimer Lasers

Excimer lasers are a particular type of electric discharge gas laser and they have been known since the mid 1970s. A description of an excimer laser, useful for integrated circuit lithography, is described in U.S. Pat. No. 5,023,884 issued Jun. 11, 1991 entitled "Compact Excimer Laser." This patent has been assigned to Applicants' employer, and the patent is hereby incorporated herein by reference. The excimer laser described in Patent '884 is a high repetition rate pulse laser. These excimer lasers, when used for integrated circuit lithography, are typically operated in an integrated circuit fabrication line "around-the-clock" producing many thousands of valuable integrated circuits per hour; therefore, down-time can be very expensive. For this reason most of the components are organized into modules which can be replaced within a few minutes. Excimer lasers used for lithography typically must have its output beam reduced in bandwidth to a fraction of a picometer. This "line-narrowing" is typically accomplished in a line narrowing module (called a "line narrowing package" or "LNP") which forms the back of the laser's resonant cavity. This LNP is comprised of delicate optical elements including prisms, mirrors and a grating. Electric discharge gas lasers of the type described in Patent '884 utilize an electric pulse power system to produce the electrical discharges, between the two electrodes. In such prior art systems, a direct current power supply charges a capacitor bank called "the charging capacitor" or "$C_0$" to a predetermined and controlled voltage called the "charging voltage" for each pulse. The magnitude of this charging voltage may be in the range of about 500 to 1000 volts in these prior art units. After $C_0$ has been charged to the predetermined voltage, a solid state switch is closed allowing the electrical energy stored on $C_0$ to ring very quickly through a series of magnetic compression circuits and a voltage transformer to produce high voltage electrical potential in the range of about 16,000 volts (or greater) across the electrodes which produce the discharges which lasts about 20 to 50 ns.

Major Advances In Lithography Light Sources

Excimer lasers such as described in the '884 patent have during the period 1989 to 2001 become the primary light source for integrated circuit lithography. More than 1000 of these lasers are currently in use in the most modern integrated circuit fabrication plants. Almost all of these lasers have the basic design features described in the '884 patent. This is:
(1) a single, pulse power system for providing electrical pulses across the electrodes at pulse rates of about 100 to 2500 pulses per second;
(2) a single resonant cavity comprised of a partially reflecting mirror-type output coupler and a line narrowing unit consisting of a prism beam expander, a tuning mirror and a grating;
(3) a single discharge chamber containing a laser gas (either KrF or ArF), two elongated electrodes and a tangential fan for circulating the laser gas between the two electrodes fast enough to clear the discharge region between pulses, and
(4) a beam monitor for monitoring pulse energy, wavelength and bandwidth of output pulses with a feedback control system for controlling pulse energy, energy dose and wavelength on a pulse-to-pulse basis.

During the 1989–2001 period, output power of these lasers has increased gradually and beam quality specifications for pulse energy stability, wavelength stability and bandwidth have also become increasingly tighter. Operating parameters for a popular lithography laser model used widely in integrated circuit fabrication include pulse energy at 8 mJ, pulse rate at 2,500 pulses per second (providing an average beam power of up to about 20 watts), bandwidth at about 0.5 pm (FWHM) and pulse energy stability at +/−0.35%.

There is a need for further improvements in these beam parameters. Integrated circuit fabricators desire better control over wavelength, bandwidth, higher beam power with more precise control over pulse energy. Some improvements can be provided with the basic design as described in the '884 patent; however, major improvements with that basic design may not be feasible. For example, with a single discharge chamber precise control of pulse energy may adversely affect wavelength and/or bandwidth and vice versa especially at very high pulse repetition rates.

Injection Seeding

A well-known technique for reducing the band-width of gas discharge laser systems (including excimer laser systems) involves the injection of a narrow band "seed" beam into a gain medium. In one such system, a laser producing the seed beam called a "master oscillator" is designed to provide a very narrow bandwidth beam in a first gain medium, and that beam is used as a seed beam in a second gain medium. If the second gain medium functions as a power amplifier, the system is referred to as a master oscillator, power amplifier (MOPA) system. If the second gain medium itself has a resonance cavity (in which laser oscillations take place), the system is referred to as an injection seeded oscillator (ISO) system or a master oscillator, power oscillator (MOPO) system in which case the seed laser is called the master oscillator and the downstream system is called the power oscillator. Laser systems comprised of two separate systems tend to be substantially more expensive, larger and more complicated than comparable single chamber laser systems. Therefore, commercial application of these two chamber laser systems has been limited.

What is needed is a better laser design for a pulse gas discharge laser for operation at repetition rates in the range of about 4,000 pulses per second or greater, permitting precise control of all beam quality parameters including wavelength, bandwidth and pulse energy.

SUMMARY OF THE INVENTION

The present invention provides an injection seeded modular gas discharge laser system capable of producing high quality pulsed laser beams at pulse rates of about 4,000 Hz or greater and at pulse energies of about 5 to 10 mJ or greater for integrated outputs of about 20 to 40 Watts or greater. Two separate discharge chambers are provided, one of which is a part of a master oscillator producing a very narrow band seed beam which is amplified in the second discharge chamber. The chambers can be controlled separately permitting optimization of wavelength parameters in the master oscillator and optimization of pulse energy parameters in the amplifying chamber. A preferred embodiment is an ArF excimer laser system configured as a MOPA and specifically designed for use as a light source for integrated circuit lithography. In this preferred embodiment, both of the chambers and the laser optics are mounted on a vertical optical table within a laser enclosure. In the preferred MOPA embodiment, each chamber comprises a single tangential fan providing sufficient gas flow to permit operation at pulse rates of 4000 Hz or greater by clearing debris from the discharge region in less time than the approximately 0.25 milliseconds between pulses. The master oscillator is equipped with a line narrowing package having a very fast tuning mirror capable of controlling centerline wavelength on a pulse-to-pulse basis at repetition rates of 4000 Hz or greater and providing a bandwidth of less than 0.2 pm (FWHM). This preferred embodiment also includes a pulse multiplying module dividing each pulse from the power amplifier into either two or four pulses in order to reduce substantially deterioration rates of lithography optics. Other preferred embodiments are configured as KrF or $F_2$ MOPA laser systems. Preferred embodiments of this invention utilize a "three wavelength platform". This includes an enclosure optics table and general equipment layout that is the same for each of the three types of discharge laser systems expected to be in substantial use for integrated circuit fabrication during the early part of the $21^{st}$ century, i.e., KrF, ArF, and $F_2$ lasers.

BRIEF DESCRIPTION OF THE DRAWINGS

FIGS. 1C and 1C1 show a second preferred embodiment.
FIGS. 4, 4A, 4B and 4C show features of a preferred pulse power system.
FIGS. 5A, 5B, 5C1, 5C2, 5C3 and 5D show additional pulse power features.
FIGS. 6A1 and 6A2 show various MOPA configurations and test results.
FIGS. 7, 7A, 8, 9A, 9B, 10, 10A, 11, 12, 12A, 12B show features of pulse power components.
FIGS. 19, 19A–19E, 19F1–19F5 and 19G show features of a purge system.
FIGS. 22A, 22B1–22B2, and 22C–22D show features of a pulse multiplier unit.

DETAILED DESCRIPTION OF PREFERRED EMBODIMENTS

First Preferred Embodiment

Three Wavelength Platform

First General Layout

Figure 1:
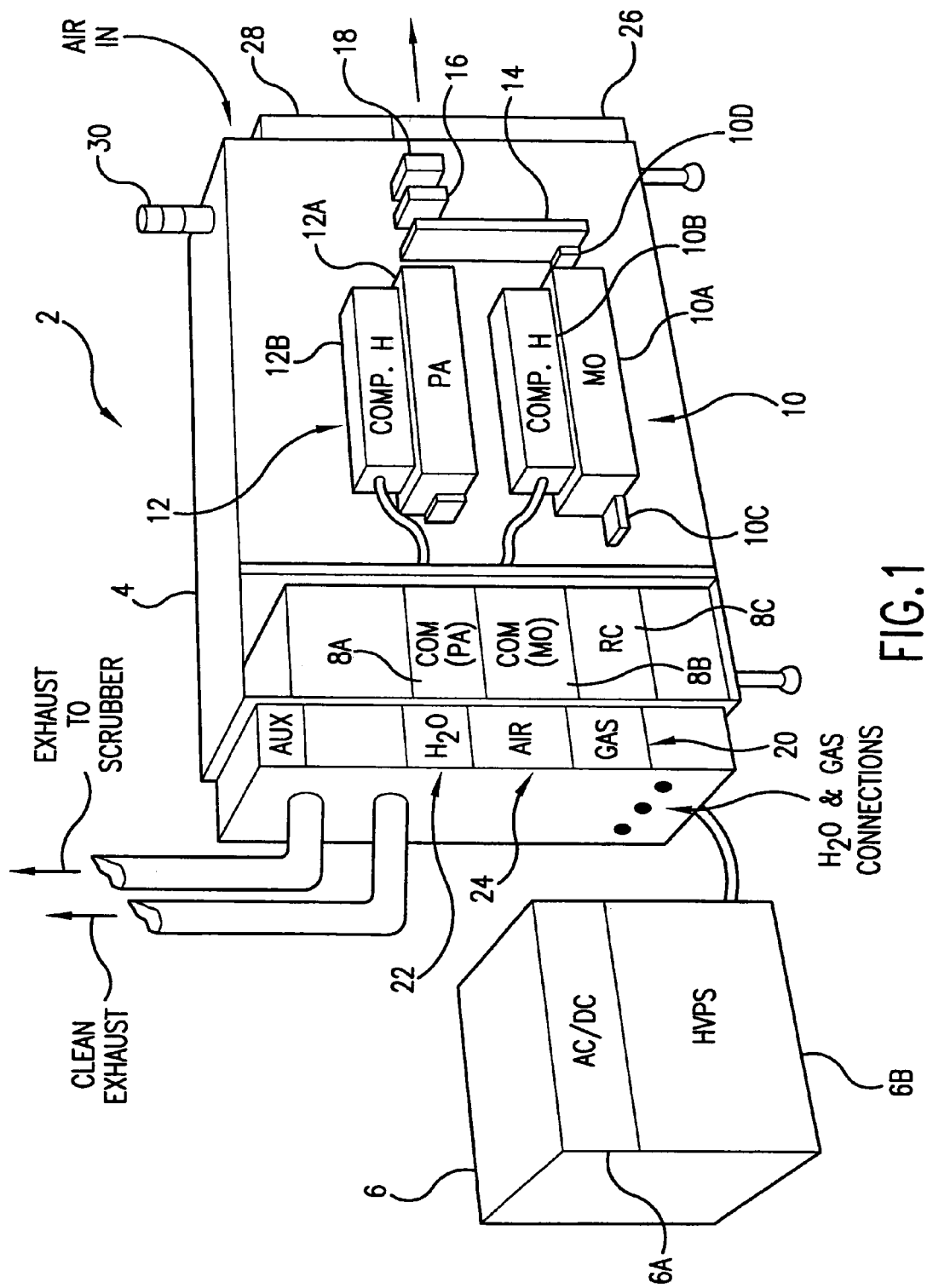
FIG. 1 is a perspective drawing of a preferred embodiment of the present invention.

FIG. 1 is a perspective view of a first preferred embodiment of the present invention. This embodiment is an injection seeded narrow band excimer laser system configured as a MOPA laser system. It is specially designed for use as a light source for integrated circuit lithography. The major improvement in the present invention as exemplified in this embodiment over the prior art lithography lasers is the utilization of injection seeding and in particular a master oscillator-power amplifier (MOPA) configuration with two separate discharge chambers.

This first preferred embodiment is an argon-fluoride (ArF) excimer laser system; however, the system utilizes a modular platform configuration which is designed to accommodate either krypton-fluoride (KrF), ArF or fluorine ($F_2$) laser components. This platform design permits use of the same basic cabinet and many of the laser system modules and components for either of these three types of lasers. Applicants refer to this platform as their "three wavelength platform" since the three laser designs produce laser beams with wavelengths of about 248 nm for KrF, about 193 nm for ArF and about 157.63 for $F_2$. This platform is also designed with interface components to make the laser systems at each of the three wavelengths compatible with modern lithography tools of all the major makers of such tools. Preferred ArF product options includes:

| Rep Rate | Pulse Energy | Pulse Duration |
|---|---|---|
| 4 kHz | 7 mJ | 60 ns |
| 4 kHz | 7 mJ | 100 ns |
| 4 kHz | 10 mJ | 60 ns |
| 4 kHz | 12 mJ | 30 ns |

The major components of this preferred laser system 2 are identified in FIG. 1. These include:

(1) laser system frame 4 which is designed to house all modules of the laser except the AC/DC power supply module,
(2) the AC/DC high voltage power supply module 6,
(3) a resonant charger module 7 for charging two charging capacitor banks to about 1000 volts at rates of 4000 charges per second,
(4) two commutator modules 8A and 8B each comprising one of the charging capacitor banks referred to above and each comprising a commutator circuit for forming very short high voltage electrical pulses, of about 16,000 volts and about 1 :s duration from the energy stored on the charging capacitor banks,
(5) two discharge chamber modules mounted in a top bottom configuration in frame 4 consisting of a master oscillator module 10 and a power amplifier module 12. Each module includes a discharge chamber 10A and 12A and a compression head 10B and 12B mounted on top of the chamber. The compression head compresses (time-wise) the electrical pulses from the commutator module from about 1 :s to about 50 ns with a corresponding increase in current,
(6) master oscillator optics including line narrowing package 10C and output coupler unit 10D,
(7) a wavefront engineering box 14 including optics and instruments for shaping and directing the seed beam into the power amplifier, and monitoring the MO output power,
(8) beam stabilizer module 16 including wavelength, bandwidth and energy monitors,
(9) shutter module 18,
(10) an auxiliary cabinet in which are located a gas control module 20, a cooling water distribution module 22 and an air ventilation module 24,
(11) a customer interface module 26,
(12) a laser control module 28, and
(13) a status lamp 30

This preferred embodiment which is described in great detail herein is an ArF MOPA configuration as stated above. Some of the changes needed to convert this specific configuration to other configurations are the following. The MOPA design can be converted to MOPO design by creating a resonance cavity around the second discharge chamber. Many techniques are available to do this some of which are discussed in the patent applications incorporated by reference herein. KrF laser designs tend to be very similar to ArF designs, so most of the features described herein are directly applicable to KrF. In fact, the preferred grating used for ArF operation works also for KrF since the wavelengths of both lasers correspond to integer multiples of the line spacing of the grating.

When this design is used for $F_2$ lasers either MOPA or MOPO, preferably a line selector unit is used instead of the LNP described herein since the natural $F_2$ spectrum comprises two primary lines one of which is selected and the other of which is deselected.

U-Shaped Optical Table

Figure 1A:
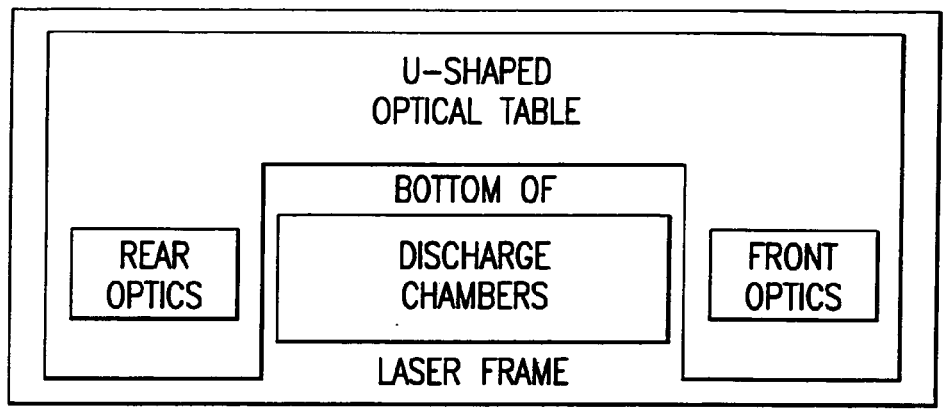
FIGS. 1A and 1B show a U-shaped optical table.
Figure 1B:
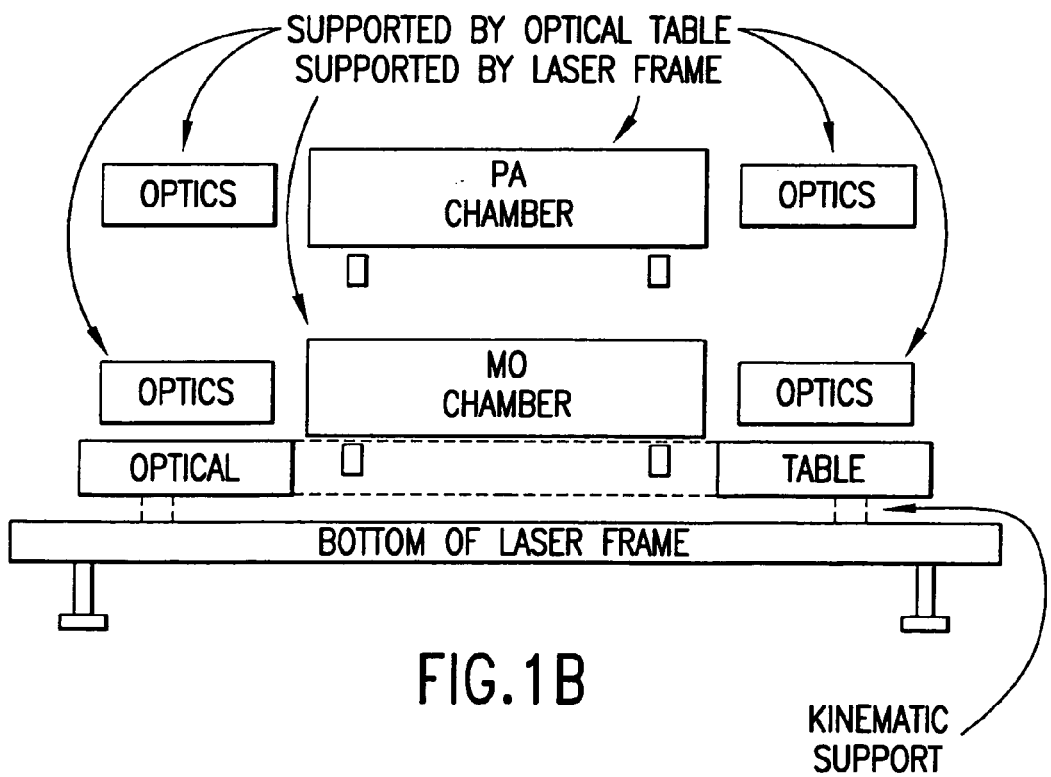

Preferably the optics of both the MO and the PA are mounted on a U-shaped optical table as shown in FIGS. 1A and 1B. The U-shaped optical table is kinematically mounted to the base of the laser in the manner described in U.S. Pat. No. 5,863,017 incorporated herein by reference. Both chambers of the MO and the PA are not mounted on the table but each is supported by three wheels (two on one side and one on the other) on rails supported from the bottom frame of chamber 2. (The wheel and rails are preferably arranged as described in U.S. Pat. No. 6,109,574 incorporated herein by reference.) This arrangement provides isolation of the optics from chamber caused vibrations.

Second General Layout

A second general layout shown in FIG. 1C is similar to the first general layout described above but including the following features:

(1) the two chambers and the laser optics are mounted on a vertical optical table 11 which is kinematically mounted (as described in a following section) within the laser cabinet 4. The chambers are supported on stiff cantilever arms bolted to the optical table. In this design the master oscillator 10 is mounted above the power amplifier 12.

(2) The high voltage power supply 6B is contained within laser cabinet 4. This two chamber-ArF 4000 Hz needs only a single 1200 volt power supply. The laser cabinet, however, is provided with space for two additional high voltage power supplies which will be needed for a two chamber, 6000 Hz, $F_2$ laser system. One additional HVPS will be utilized for a 6000 Hz ArF system.

(3) Each of the two laser chambers and the pulse power supplies for the chambers are substantially identical to the chamber and pulse power supply utilized in a 4000 Hz single chamber laser system described U.S. patent application Ser. No. 09/854,097 which has been incorporated herein by reference.

(4) A pulse multiplier module 13 located behind the optical table 11 is included in this embodiment to stretch the duration of the pulse exiting the power amplifier.

(5) The master oscillator beam output optics 14A directs the output beam from the MO to the power amplifier input-output optics 14B and for two passes through the power amplifier 12 via power amplifier rear optics 14C. The first pass is at a small angle with the electrodes and the second pass is aligned with the electrodes, all as described below. The entire beam path through the laser system including the pulse stretcher is enclosed in vacuum compatible enclosures (not shown) and the enclosures are purged with nitrogen or helium.

Third General Layout

Figure 1D:
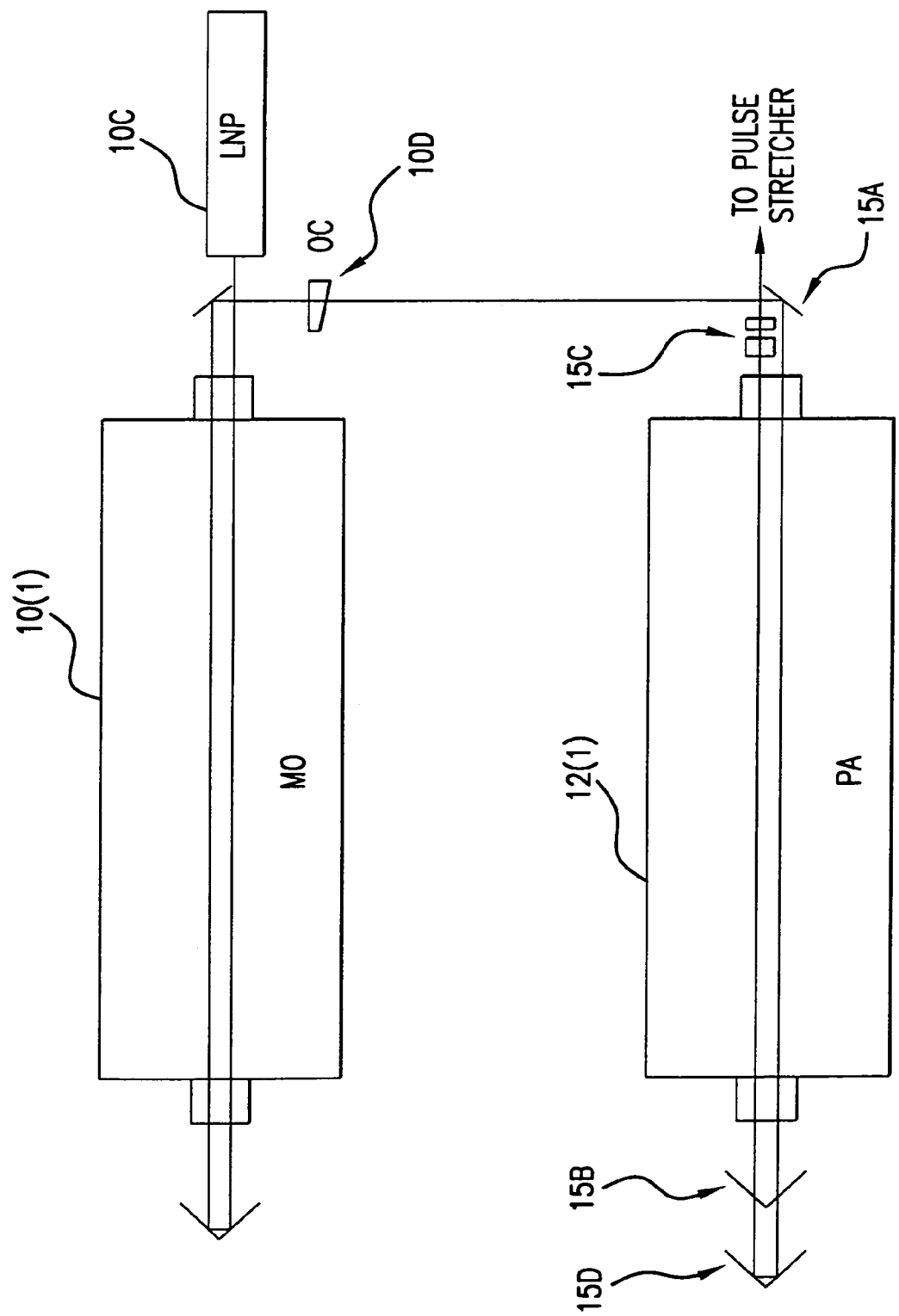
FIG. 1D show a third preferred embodiment.

Portions of a third general layout are shown in FIG. 1D. This layout accommodates an embodiment of the present invention which utilizes laser chambers in which the length of the discharge region between the electrodes is about one-half the length between the electrodes in the first two embodiments. That is, the discharge region length is about 26.5 cm as compared to typical length of about 53 cm. In this case, the resonant cavity of the master oscillator 10(1) is defined by two passes through the discharge region between output coupler 10D and LNP 10C. In this layout, the beam makes four passes through the power amplifier 12(1). The first pass after reflection from mirror 15A through the bottom half of the discharge region at an angle with the alignment of the electrodes angling from (for example in the bottom half left to right at an angle of about 10 milliradians). The second pass after reflection from mirrors 151B is through the top half at an angle right to left at an angle of about 4 degrees. The third pass after reflection from two mirrors 15C is aligned with the electrodes through the top half of the discharge region and the last pass after reflection from mirrors 15D is aligned with the electrodes through the bottom half of the discharge region. This last pass establishes the power amplifier output beam. It bypasses mirrors 15C and is directed by mirrors (not shown) to the pulse multiplier unit (also not shown).

In each of the above three layouts provisions are preferably made to permit the output beam to exit at the left of the laser enclosure or the right of the enclosure in order to accommodate customer preference without major design changes.

In each of the above layouts some improvement in performance could be achieved by combining the commutator and the compression head into a single module. Applicants have resisted this combination in the past because any component failure requires replacement of the entire module. However, Applicants experience is that these units are extremely reliable so that the combined module is now feasible. In fact, one of the few causes of failure in the pulse power units has been failure of the electrical cable connecting the two modules. This cable would not be needed in the combined module.

The design and operation of the preferred laser systems and the modules referred to above are described in more detail below.

The Master Oscillator

Figure 2:
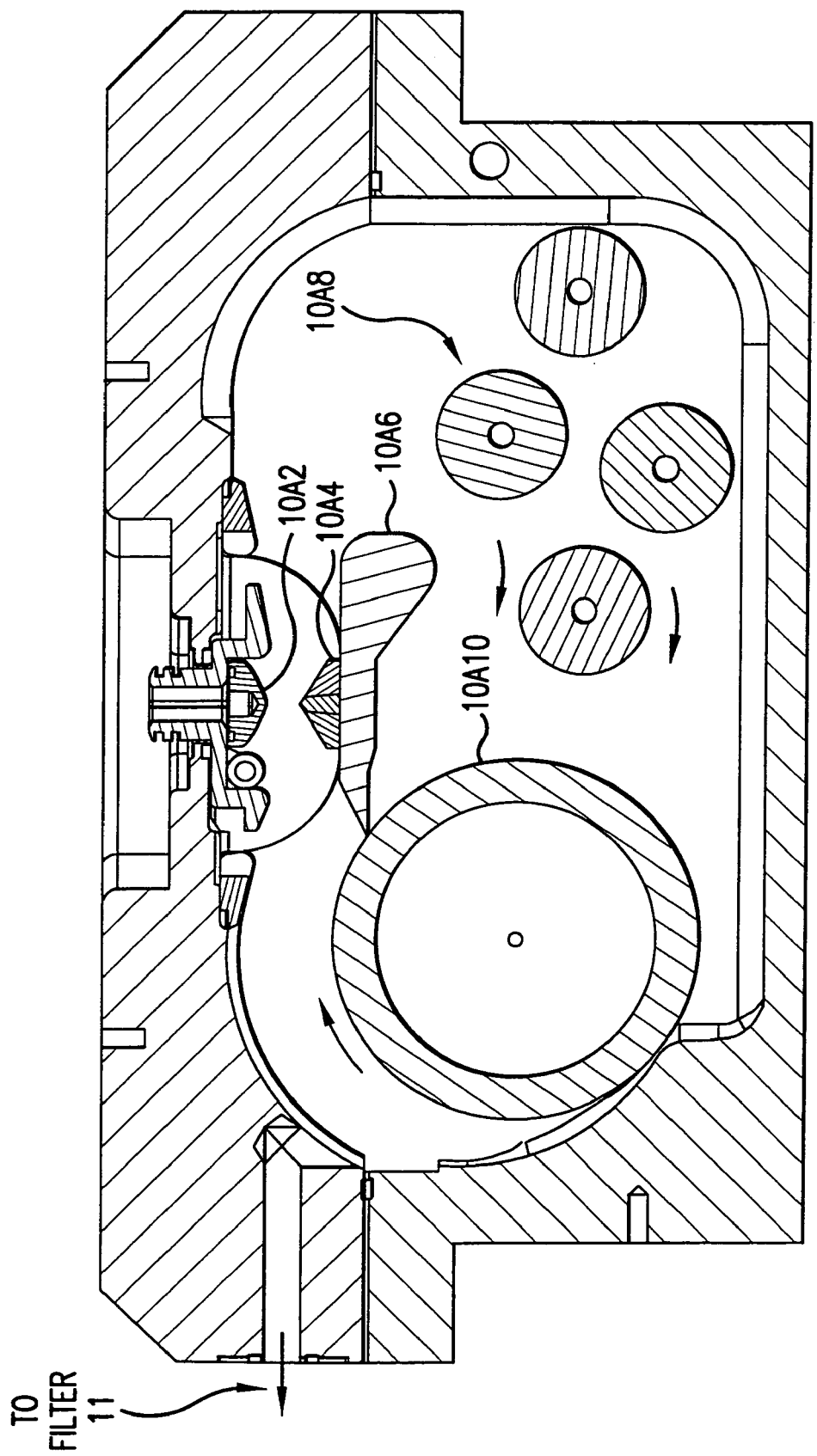
FIGS. 2 and 2A show chamber features.
Figure 2A:
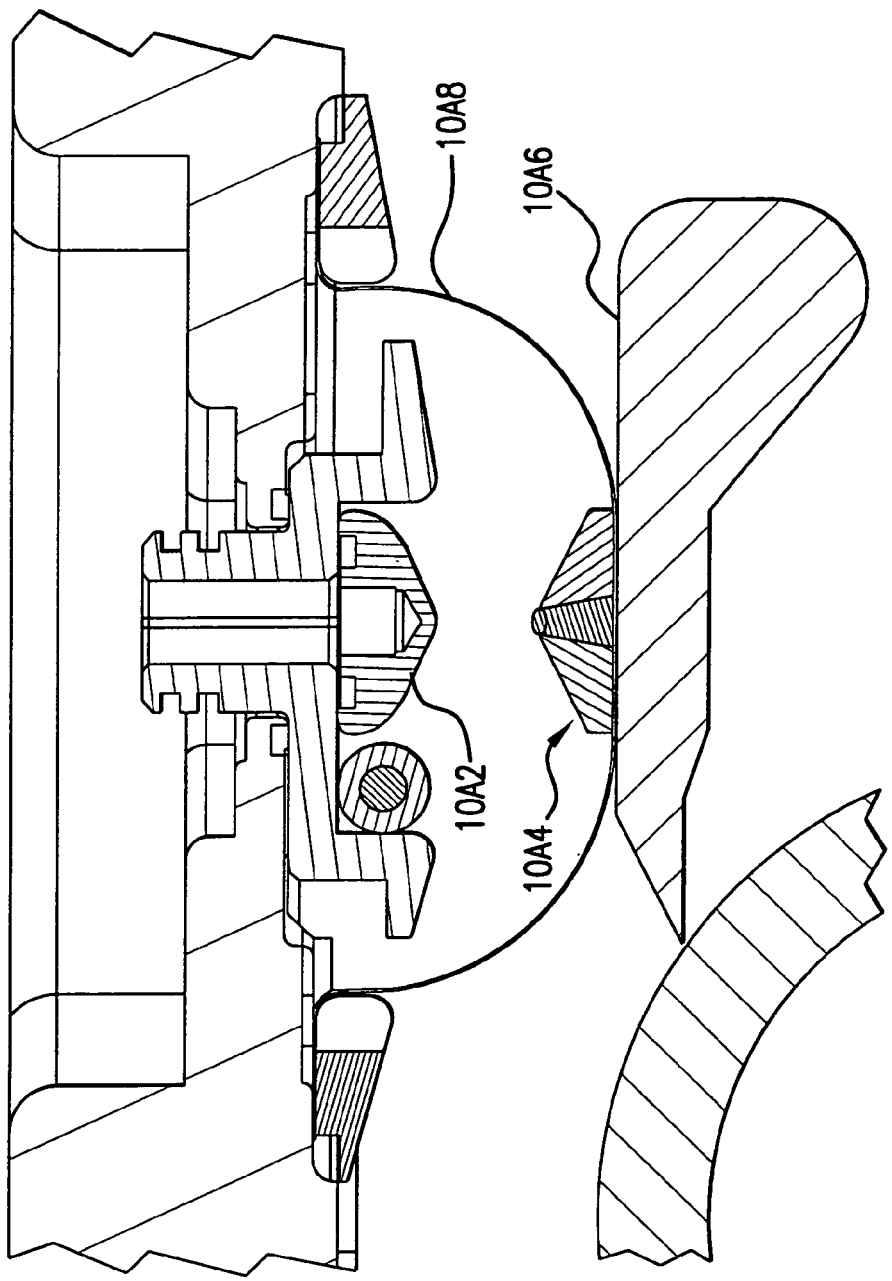

The master oscillator 10 shown in FIGS. 1 and 1C is in many ways similar to prior art ArF lasers such as described in the '884 patent and in U.S. Pat. No. 6,128,323 and is substantially equivalent to the ArF laser described in U.S. patent application Ser. No. 09/854,097 except the output pulse energy is about 0.1 mJ instead of about 5 mJ. However, major improvements over the '323 laser are provided to permit operation at 4000 Hz and greater. The master oscillator is optimized for spectral performance including bandwidth control. This result is a much more narrow bandwidth and improved bandwidth stability. The master oscillator comprises discharge chamber 10A as shown in FIG. 1, FIG. 2 and FIG. 2A in which are located a pair of elongated electrodes 10 A-2 and 10A-4, each about 50 cm long and spaced apart by about 0.5 inch. Anode 10A-4 is mounted on flow shaping anode support bar 10A-6. Four separate finned water cooled heat exchanger units 10A-8 are provided. A tangential fan 10A-10 is driven by two motors (not shown) for providing a laser gas flow at a velocity of about 80 m/s between the electrodes. The chamber includes window units (not shown) with $CaF_2$ windows positioned at about 45° with the laser beam. An electrostatic filter unit having an intake at the center of the chamber, filters a small portion of the gas flow as indicated at 11 in FIG. 2 and the cleaned gas is directed into window units in the manner described in U.S. Pat. No. 5,359,620 (incorporated herein by reference) to keep discharge debris away from the windows. The gain region of the master oscillator is created by discharges between the electrodes through the laser gas which in this embodiment is comprised of about 3% argon, 0.1% $F_2$ and the rest neon. The gas flow clears the debris of each discharge from the discharge region prior to the next pulse. The resonant cavity is created at the output side by an output coupler 10D which is comprised of a $CaF_2$ mirror mounted perpendicular to the beam direction and coated to reflect about 30% of light at 193 nm and to pass about 70% of the 193 nm light. The opposite boundary of the resonant cavity is a line narrowing unit 10C as shown in FIG. 1 similar to prior art line narrowing units described in U.S. Pat. No. 6,128,323. The LNP is described in more detail below as in FIGS. 16, 16A, 16B1 and 16B2. Important improvements in this line narrowing package include four CaF beam expanding prisms 10C1 for expanding the beam in the horizontal direction by 45 times and a tuning mirror 10C2 controlled by a stepper motor for relatively large pivots and a piezoelectric driver for providing extremely fine tuning of the mirror echelle grating 10C3 having about 80 facets per mm is mounted in the Litrow configuration reflects a very narrow band of UV light selected from the approximately 300 pm wide ArF natural spectrum. Preferably the master oscillator is operated at a much lower F2 concentration than is typically used in prior art lithography light sources. This results in substantial reductions in the bandwidth. Another important improvement is a narrow rear aperture which limits the cross section of the oscillator beam to 1.1 mm in the horizontal direction and 7 mm in the vertical direction. Control of the oscillator beam is discussed below.

In preferred embodiments the main charging capacitor banks for both the master oscillator and the power amplifier are charged in parallel so as to reduce jitter problems. This is desirable because the time for pulse compression in the pulse compression circuits of the two pulse power systems is dependent on the level of the charge of the charging capacitors. Preferably pulse energy output is controlled on a pulse-to-pulse basis by adjustment of the charging voltage. This limits somewhat the use of voltage to control beam parameters of the master oscillator. However, laser gas pressure and $F_2$ concentration can be easily controlled to achieve desirable beam parameters over a wide range pulse energy increases and laser gas pressure. Bandwidth decreases with $F_2$ concentration and laser gas pressure. These control features are in addition to the LNP controls which are discussed in detail below. For the master oscillator the time between discharge and light-out is a function of $F_2$ concentration (1 ns/kPa), so $F_2$ concentration may be changed to vary the timing.

Power Amplifier

The power amplifier in each of the three embodiments is comprised of a laser chamber which is very similar to the corresponding master oscillator discharge chamber. Having the two separate chambers allows the pulse energy and integrated energy in a series of pulses (called dose) to be controlled, to a large extent, separately from wavelength and bandwidth. This permits better dose stability. All of the components of the chamber are the same and are interchangeable during the manufacturing process. However, in operation, the gas pressure is substantially lower in the MO as compared to the PA. The compression head 12B of the power amplifier is also substantially identical in this embodiment to the 10B compression head and the components of the compression head are also interchangeable during manufacture. One difference is that the capacitors of the compression head capacitor bank are more widely positioned for the MO to produce a substantially higher inductance as compared to the PA. This close identity of the chambers and the electrical components of the pulse power systems helps assure that the timing characteristics of the pulse forming circuits are the same or substantially the same so that jitter problems are minimized.

Figure 3A:
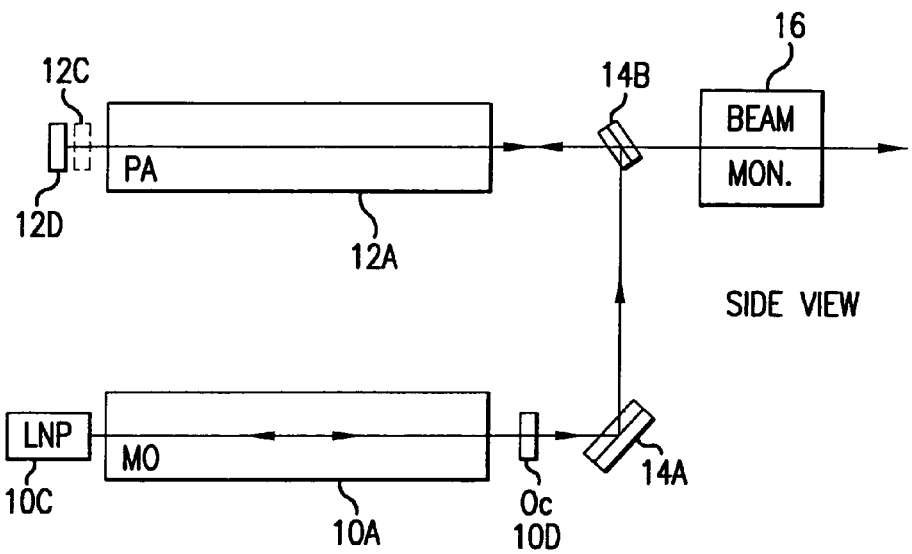
FIGS. 3A and 3B show a two-pass MOPA.
Figure 3B:
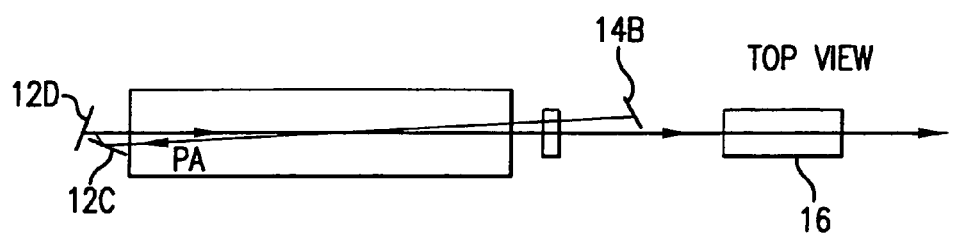

The power amplifier is configured for two beam passages through the discharge region of the power amplifier discharge chamber in the FIG. 1 and FIG. 1C embodiments and for four passages in its FIG. 1D embodiment as described above. FIGS. 3A and 3B show the beam path through the master oscillator and the power amplifier for the FIG. 1 embodiment. The beam oscillates several times through the chamber 10A and LNP 10C of the MO 10 as shown in FIG. 3A and is severely line narrowed on its passages through LNP 10C. The line narrowed seed beam is reflected upward by mirror 14A and reflected horizontally at an angle slightly skewed (with respect to the electrode orientations) through chamber 12A by mirror 14B. At the back end of the power amplifier two mirrors 12C and 12D reflect the beam back for a second pass through PA chamber 12A horizontally in line with the electrode orientation as shown in FIG. 3B.

The charging voltages preferably are selected on a pulse-to-pulse basis to maintain desired pulse and dose energies. $F_2$ concentration and laser gas pressure can be adjusted to provide a desired operating range of charging voltage. This desired range can be selected to produce a desired value of dE/dV since the change in energy with voltage is a function of $F_2$ concentration and laser gas pressure. The timing of injections is preferable based on charging voltage. The frequency of injections preferably is preferably high to keep conditions relatively constant and can be continuous or nearly continuous. Some users of these embodiments may prefer larger durations (such as 2 hours) between $F_2$ injections.

Test Results

Applicants have conducted extensive testing of the basic MOPA configuration shown in FIG. 1 with various optical paths as shown in FIG. 6A1. FIGS. 6A2 through 6E display some of the results of this proof of principal testing.

Figure 6B:
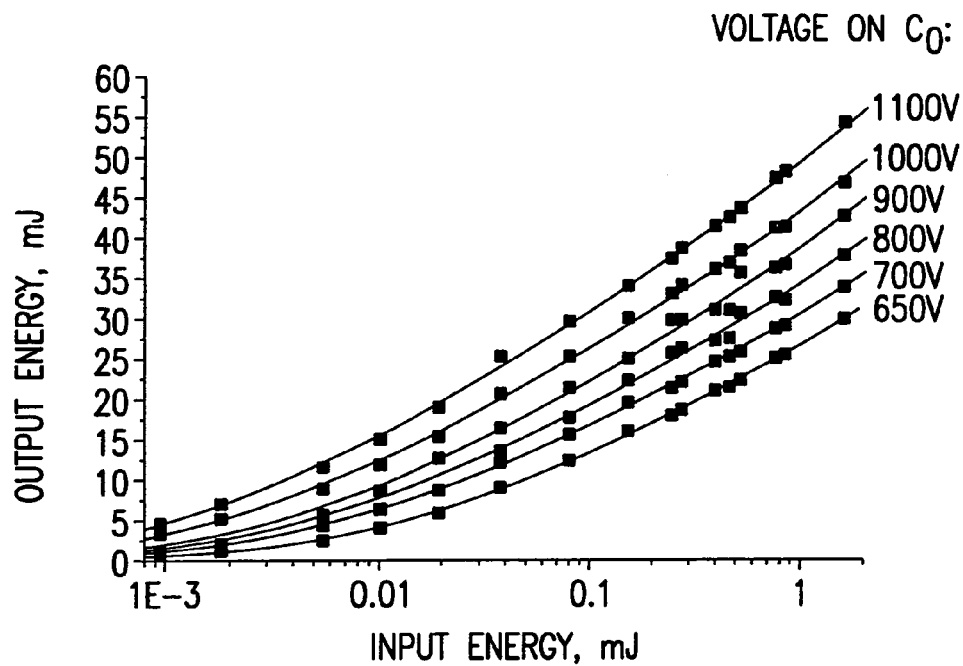
FIGS. 6B, 6C, 6D and 6E show test results of prototype MOPA systems.
Figure 6C:
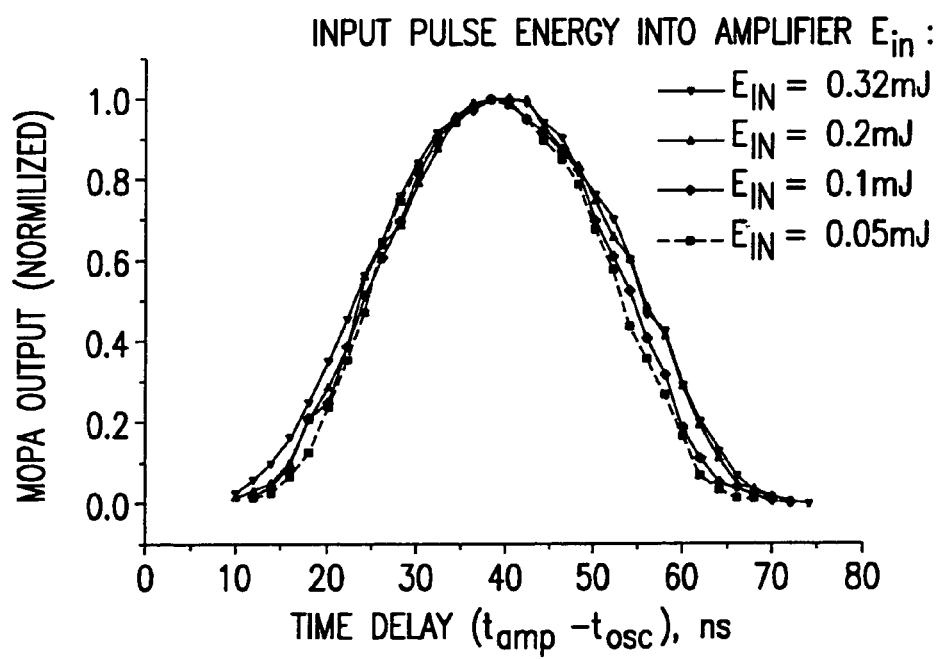
Figure 6D:
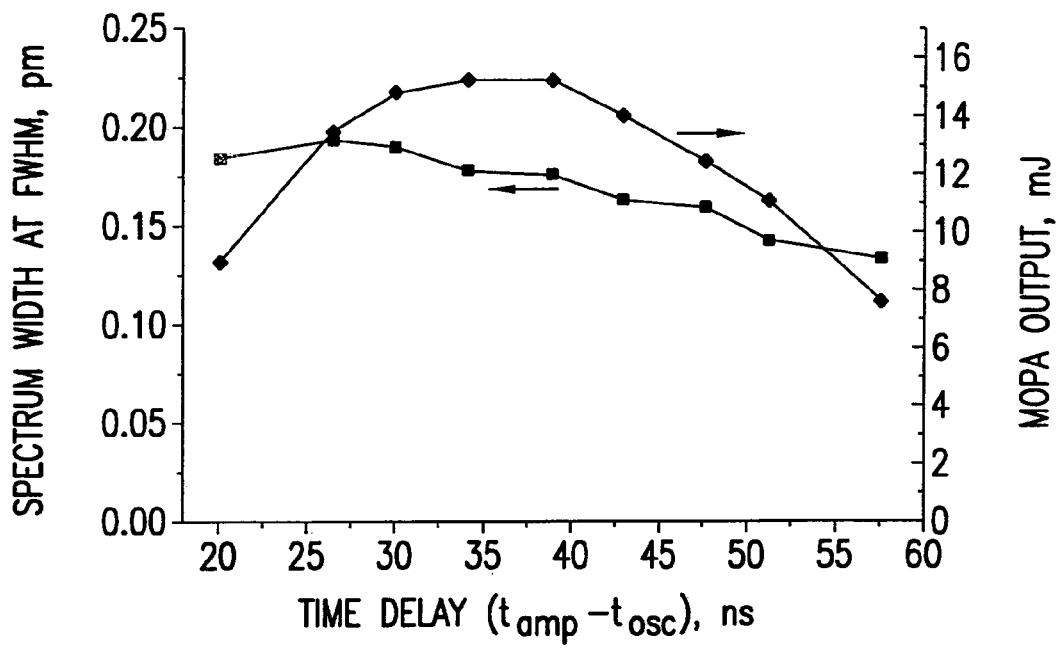
Figure 6E:
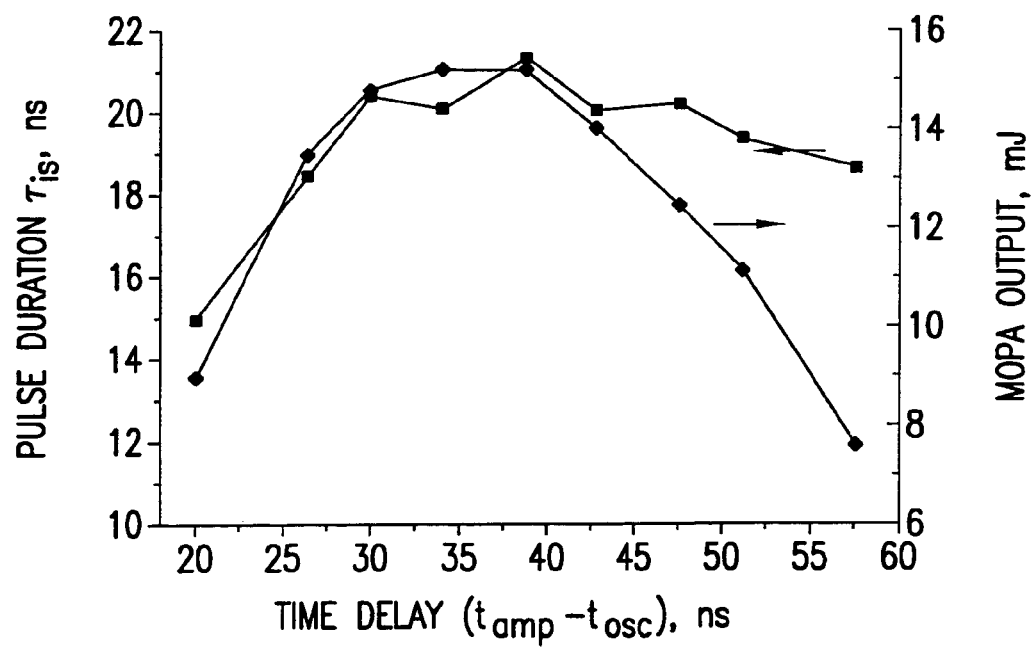

FIG. 6A shows how well the skewed double pass amplifier design performs as compared with other amplifier designs. Other designs that have been tested are single pass, straight double pass, single pass with divided amplifier electrodes, tilted double pass. FIG. 6B shows system output pulse energy as a function of PA input energy for the skewed double pass configuration at charging voltage ranging from 650 V to 1100 V. FIG. 6C shows the shape of the output pulse as a function of time delay between beginning of the oscillator and the amplifier pulses for four input energies. FIG. 6D shows the effect of time delay between pulses on output beam bandwidth. This graph also shows the effect of delay on output pulse energy. This graph shows that bandwidth can be reduced at the expense of pulse energy. FIG. 6E shows that the laser system pulse duration can also be extended somewhat at the expense of pulse energy.

Pulse Power Circuit

Figure 5A:
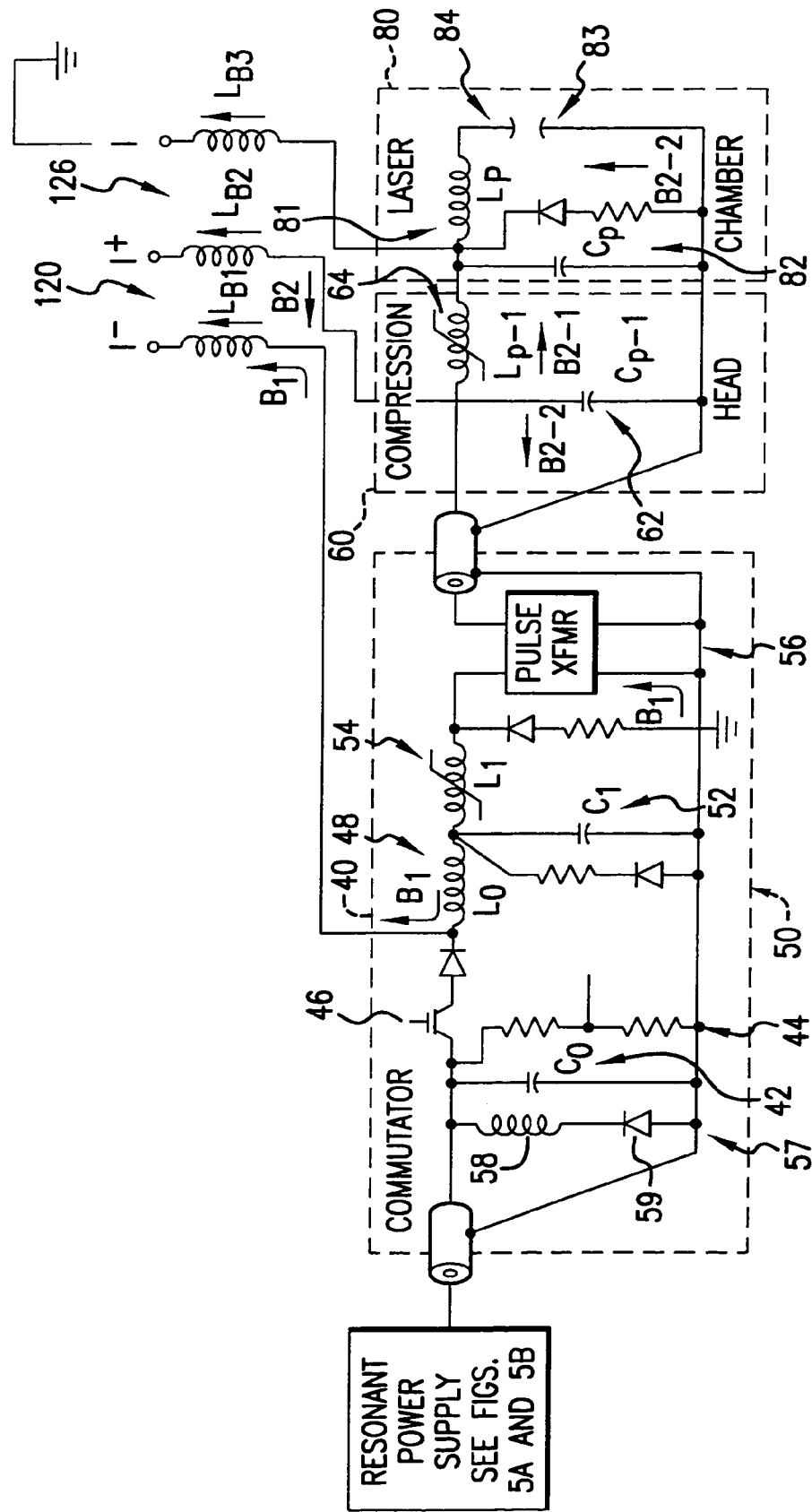
Figure 5B:
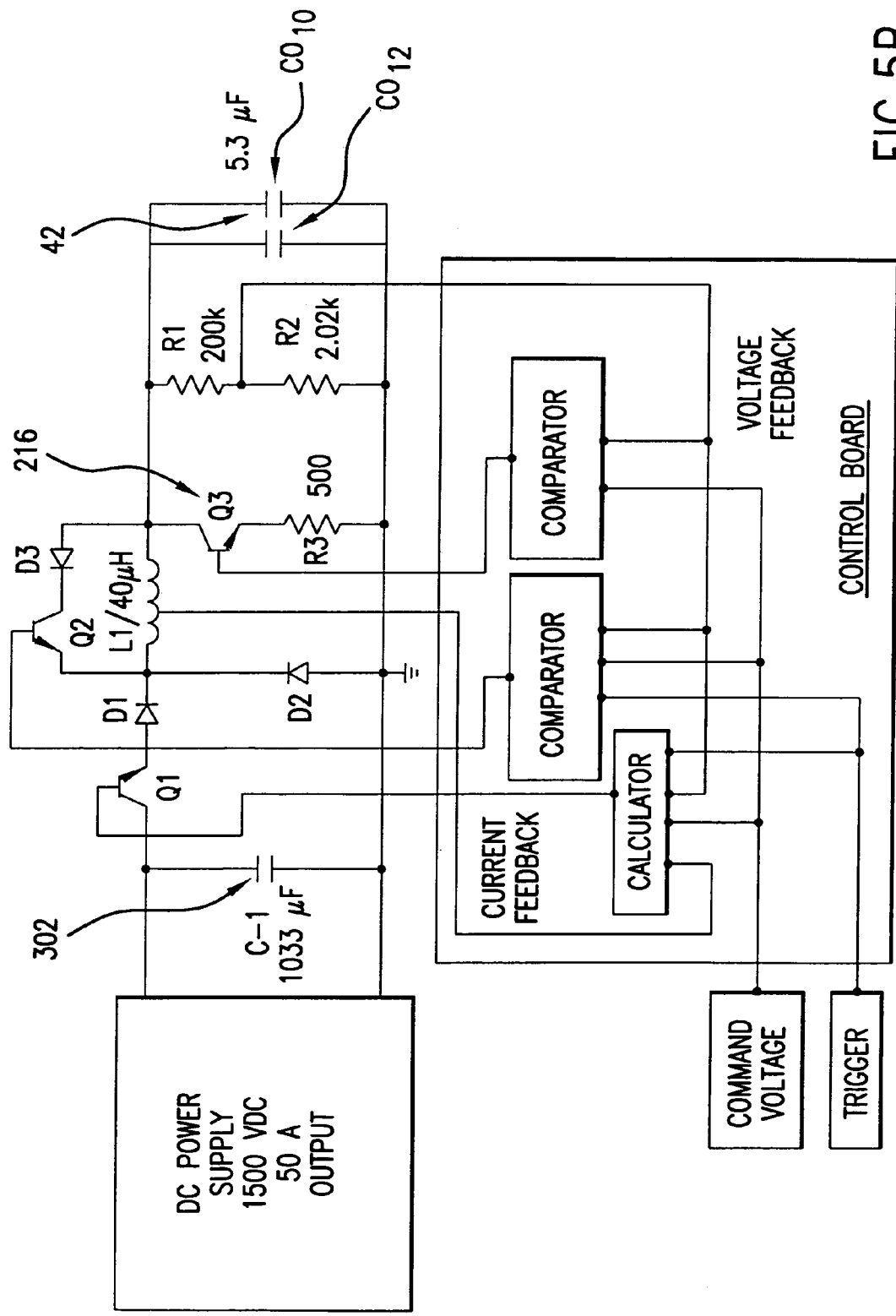

In the preferred embodiment shown in FIGS. 1, 1C and 1D, the basic pulse power circuits are similar to pulse power circuits of prior art excimer laser light sources for lithography. However, separate pulse power circuits downstream of the charging capacitors are provided for each discharge chamber. Preferably a single resonant charger charges two charging capacitor banks connected in parallel to assure that both charging capacitor banks are charged to precisely the same voltage. Important improvements are also provided to regulate the temperature of components of the pulse power circuits. In preferred embodiments the temperatures of the magnetic cores of saturable inductors are monitored and the temperature signals are utilized in a feedback circuit to adjust the relative timing of the discharge in the two chambers. FIGS. 5A and 5B show important elements of a preferred basic pulse power circuit which is used for the MO. The same basic circuit is also used for the PA.

Resonant Charger

A preferred resonant charger system is shown in FIG. 5B. The principal circuit elements are:
 I1 B A three-phase power supply 300 with a constant DC current output.
 C-1 B A source capacitor 302 that is an order of magnitude or more larger than the existing $C_O$ capacitor 42.
 Q1, Q2, and Q3 B Switches to control current flow for charging and maintaining a regulated voltage on $C_O$.
 D1, D2, and D3 B Provides current single direction flow.
 R1, and R2 B Provides voltage feedback to the control circuitry.

R3 B Allows for rapid discharge of the voltage on $C_0$ in the event of a small over charge.

L1 B Resonant inductor between C-1 capacitor 302 and $C_o$ capacitor banks 42 to limit current flow and setup charge transfer timing.

Control Board 304 B Commands Q1, Q2, and Q3 open and closed based upon circuit feedback parameters.

This circuit includes switch Q2 and diode D3, together known as a De-Qing switch. This switch improves the regulation of the circuit by allowing the control unit to short out the inductor during the resonant charging process. This "de-qing" prevents additional energy stored in the current of the charging inductor, L1, from being transferred to capacitor $C_0$.

Prior to the need for a laser pulse the voltage on C-1 is charged to 600–800 volts and switches Q1–Q3 are open. Upon command from the laser, Q1 would close. At this time current would flow from C-1 to $C_0$ through the charge inductor L1. As described in the previous section, a calculator on the control board would evaluate the voltage on $C_0$ and the current flowing in L1 relative to a command voltage set point from the laser. Q1 will open when the voltage on the CO capacitor banks plus the equivalent energy stored in inductor L1 equals the desired command voltage. The calculation is:

$$V_f = [V_{Cos}^2 + ((L_1 * I_{L1s}^2)/C_0)]^{0.5}$$

Where:

$V_f$=The voltage on $C_0$ after Q1 opens and the current in L1 goes to zero.

$V_{Cos}$=The voltage on $C_0$ when Q1 opens.

$I_{L1S}$=The current flowing through L1 when Q1 opens.

After Q1 opens the energy stored in L1 starts transferring to the CO capacitor banks through D2 until the voltage on the CO capacitor banks approximately equals the command voltage. At this time Q2 closes and current stops flowing to CO and is directed through D3. In addition to the "de-qing" circuit, Q3 and R3 from a bleed-down circuit allow additional fine regulation of the voltage on CO.

Switch Q3 of bleed down circuit 216 will be commanded closed by the control board when current flowing through inductor L1 stops and the voltage on $C_0$ will be bled down to the desired control voltage; then switch Q3 is opened. The time constant of capacitor $C_o$ and resistor R3 should be sufficiently fast to bleed down capacitor $C_o$ to the command voltage without being an appreciable amount of the total charge cycle.

As a result, the resonant charger can be configured with three levels of regulation control. Somewhat crude regulation is provided by the energy calculator and the opening of switch Q1 during the charging cycle. As the voltage on the CO capacitor banks nears the target value, the de-qing switch is closed, stopping the resonant charging when the voltage on $C_o$ is at or slightly above the target value. In a preferred embodiment, the switch Q1 and the de-qing switch is used to provide regulation with accuracy better than +/−0.1%. If additional regulation is required, the third control over the voltage regulation could be utilized. This is the bleed-down circuit of switch Q3 and R3 (shown at 216 in FIG. 5B) to discharge the CO's down to the precise target value.

Improvements Downstream of the CO's

As indicated above, the pulse power system of the MO and the PA of the present invention each utilizes the same basic design (FIG. 5A) as was used in the prior art systems. However, some significant improvements in that basic design were required for the approximate factor of 3 increase in heat load resulting from the greatly increased repetition rate. These improvements are discussed below.

Detailed Commutator and Compression Head Description

In this section, we describe details of fabrication of the commutator and the compression head.

Solid State Switch

Solid state switch 46 is an P/N CM 800 HA-34H IGBT switch provided by Powerex, Inc. with offices in Youngwood, Pa. In a preferred embodiment, two such switches are used in parallel.

Inductors

Inductors 48, 54 and 64 are saturable inductors similar to those used in prior systems as described in U.S. Pat. Nos. 5,448,580 and 5,315,611. FIG. 7 shows a preferred design of the $L_o$ inductor 48. In this inductor four conductors from the two IGBT switches 46B pass through sixteen ferrite toroids 49 to form part 48A an 8 inch long hollow cylinder of very high permeability material with an ID of about 1 inch and an Od of about 1.5 inch. Each of the four conductors are then wrapped twice around an insulating doughnut shaped core to form part 48B. The four conductors then connect to a plate which is in turn connected to the high voltage side of the $C_1$ capacitor bank 52.

Figure 8:
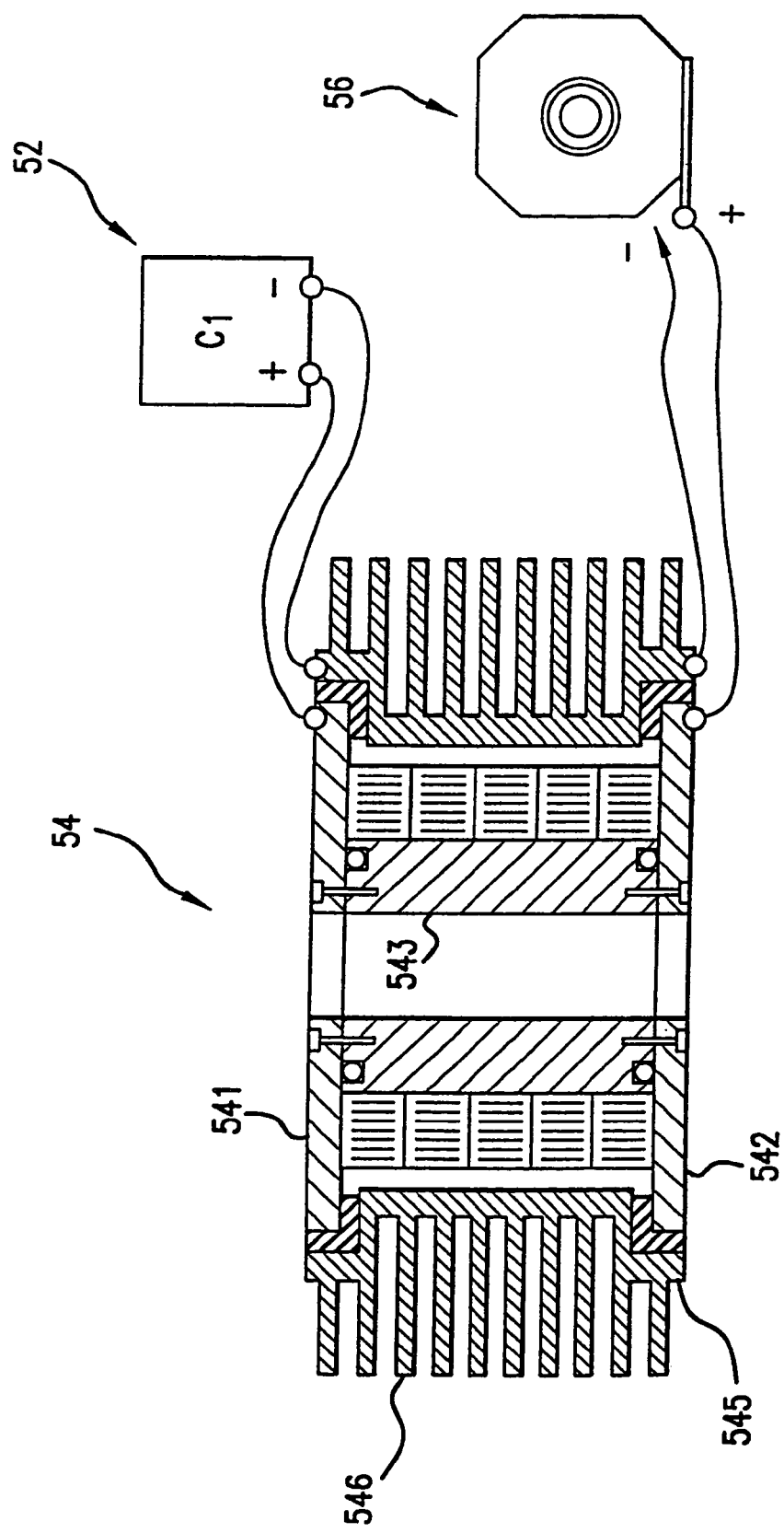

A preferred sketch of saturable inductor 54 is shown in FIG. 8. In this case, the inductor is a single turn geometry where the assembly top and bottom lids 541 and 542 and center mandrel 543, all at high voltage, form the single turn through the inductor magnetic cores. The outer housing 545 is at ground potential. The magnetic cores are 0.0005" thick tape wound 50–50% Ni—Fe alloy provided by Magnetics of Butler, Pa. or National Arnold of Adelanto, Calif. Fins 546 on the inductor housing facilitate transfer of internally dissipated heat to forced air cooling. In addition, a ceramic disk (not shown) is mounted underneath the reactor bottom lid to help transfer heat from the center section of the assembly to the module chassis base plate. FIG. 8 also shows the high voltage connections to one of the capacitors of the $C_1$ capacitor bank 52 and to a high voltage lead on one of the induction units of the 1:25 step up pulse transformer 56. The housing 545 is connected to the ground lead of unit 56.

Figure 9A:
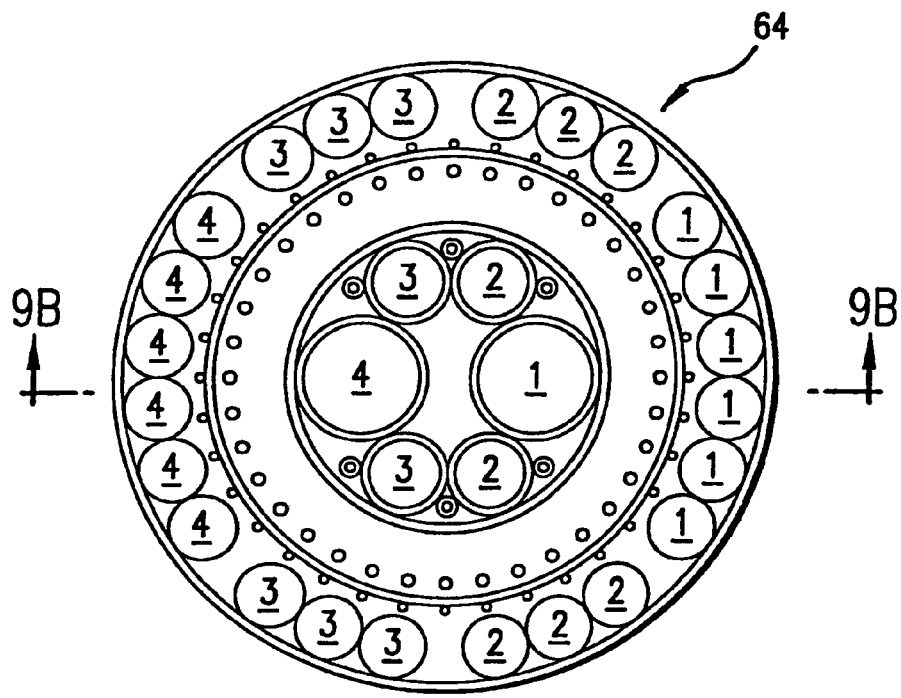
Figure 9B:
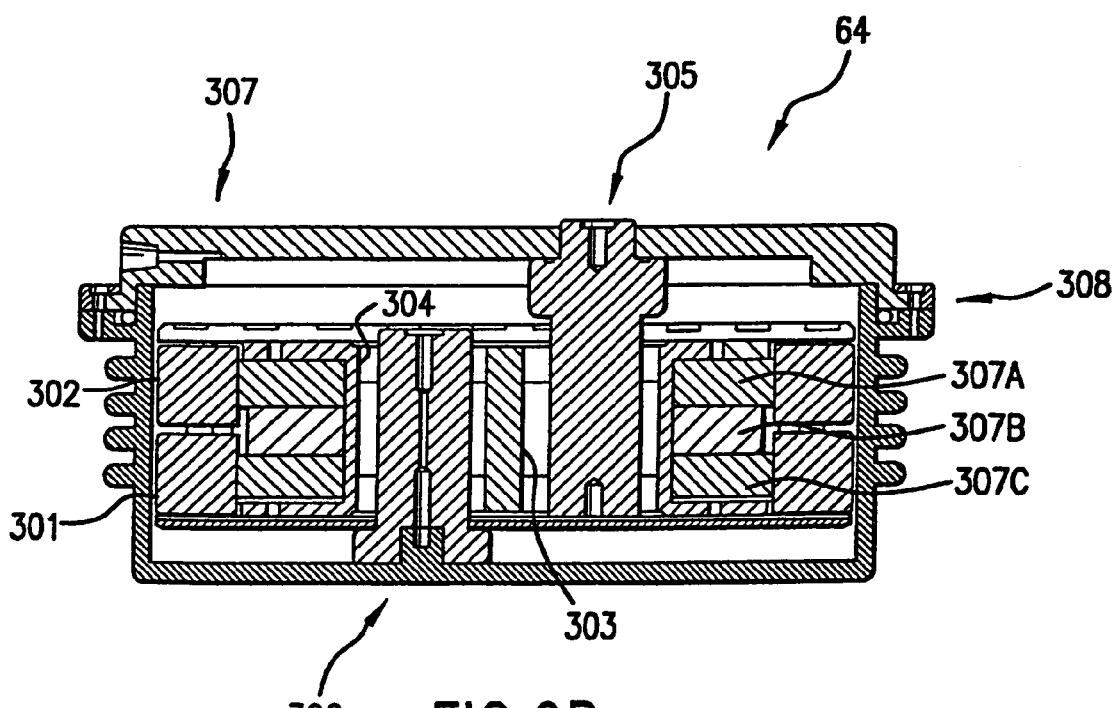

A top and section view of the saturable inductor 64 is shown respectively in FIGS. 9A and 9B. In the inductors of this embodiment, flux excluding metal pieces 301, 302, 303 and 304 are added as shown in FIG. 9B in order to reduce the leakage flux in the inductors. These flux excluding pieces substantially reduce the area which the magnetic flux can penetrate and therefore help to minimize the saturated inductance of the inductor. The current makes five loops through vertical conductor rods in the inductor assembly around magnetic core 307. The current enters at 305 travels down a large diameter conductor in the center labeled "1" and up six smaller conductors on the circumference also labeled "1" as shown in FIG. 9A. The current then flows down two conductors labeled 2 on the inside, then up the six conductors labeled 2 on the outside then down flux exclusion metal on the inside then up the six conductors labeled 3 on the outside, then down the two conductors labeled 3 on the inside, then up the six conductors labeled 4 on the outside, then down the conductor labeled 4 on the inside. The flux exclusion metal components are held at half the full pulsed voltage across the conductor allowing a reduction in the safe hold-off spacing between the flux exclusion metal parts and the metal rods of the other turns. The magnetic core 307 is made up of three coils 307A, B and C formed by windings of 0.0005" thick tape 80–20% Ni—Fe alloy provided by Magnetics, Inc. of Butler, Pa. or National Arnold of Adelanto, Calif. The reader should note that nano-crystalline materials such as VITROPERM9 available from VACUUM SCHITELZE GmbH, Germany and FINEMET9 from Hitachi Metals, Japan could be used for inductors 54 and 64.

In prior art pulse power systems, oil leakage from electrical components has been a potential problem. In this preferred embodiment, oil insulated components are limited to the saturable inductors. Furthermore, the saturable inductor 64 as shown in FIG. 9B is housed in a pot type oil containing housing in which all seal connections are located above the oil level to substantially eliminate the possibility of oil leakage. For example, the lowest seal in inductor 64 is shown at 308 in FIG. 8B. Since the normal oil level is below the top lip of the housing 306, it is almost impossible for oil to leak outside the assembly as long as the housing is maintained in an upright condition.

Capacitors

Capacitor banks 42, 52, 62 and 82 (i.e., $C_o$, $C_1$, $C_{p-1}$ and $C_p$) as shown in FIG. 5 are all comprised of banks of off-the-shelf capacitors connected in parallel. Capacitors 42 and 52 are film type capacitors available from suppliers such as Vishay Roederstein with offices in Statesville, N.C. or Wima of Germany. Applicants preferred method of connecting the capacitors and inductors is to solder them to positive and negative terminals on special printed circuit board having heavy nickel coated copper leads in a manner similar to that described in U.S. Pat. No. 5,448,580. Capacitor bank 62 and 64 is typically composed of a parallel array of high voltage ceramic capacitors from vendors such as Murata or TDK, both of Japan. In a preferred embodiment for use on this ArF laser, capacitor bank 82 (i.e., $C_p$) comprised of a bank of thirty three 0.3 nF capacitors for a capacitance of 9.9 nF; $C_{p-1}$ is comprised of a bank of twenty four 0.40 nF capacitors for a total capacitance of 9.6 nF; $C_1$ is a 5.7 :F capacitor bank and $C_o$ is a 5.3 :F capacitor bank.

Pulse Transformer

Figure 10:
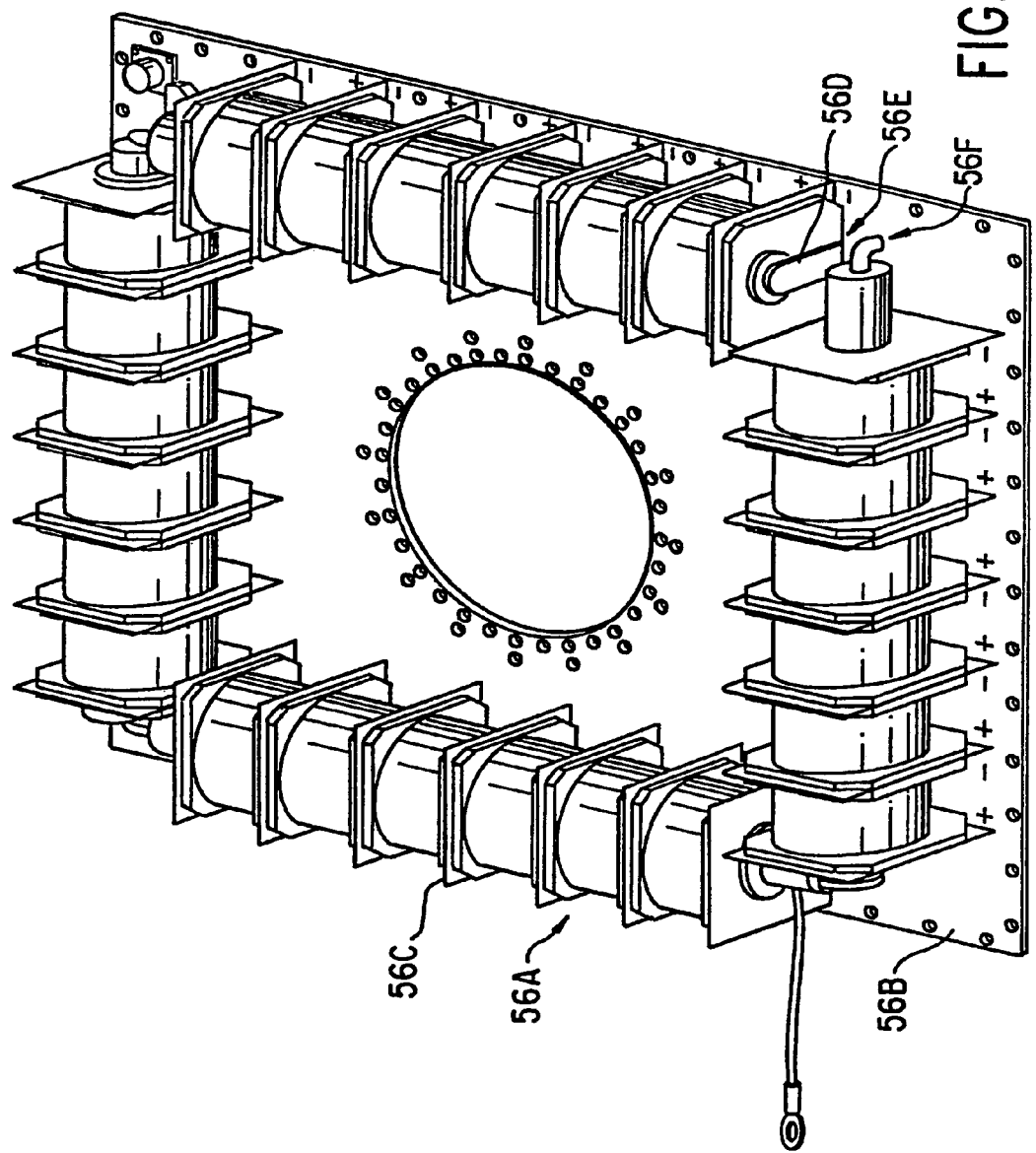
Figure 10A:
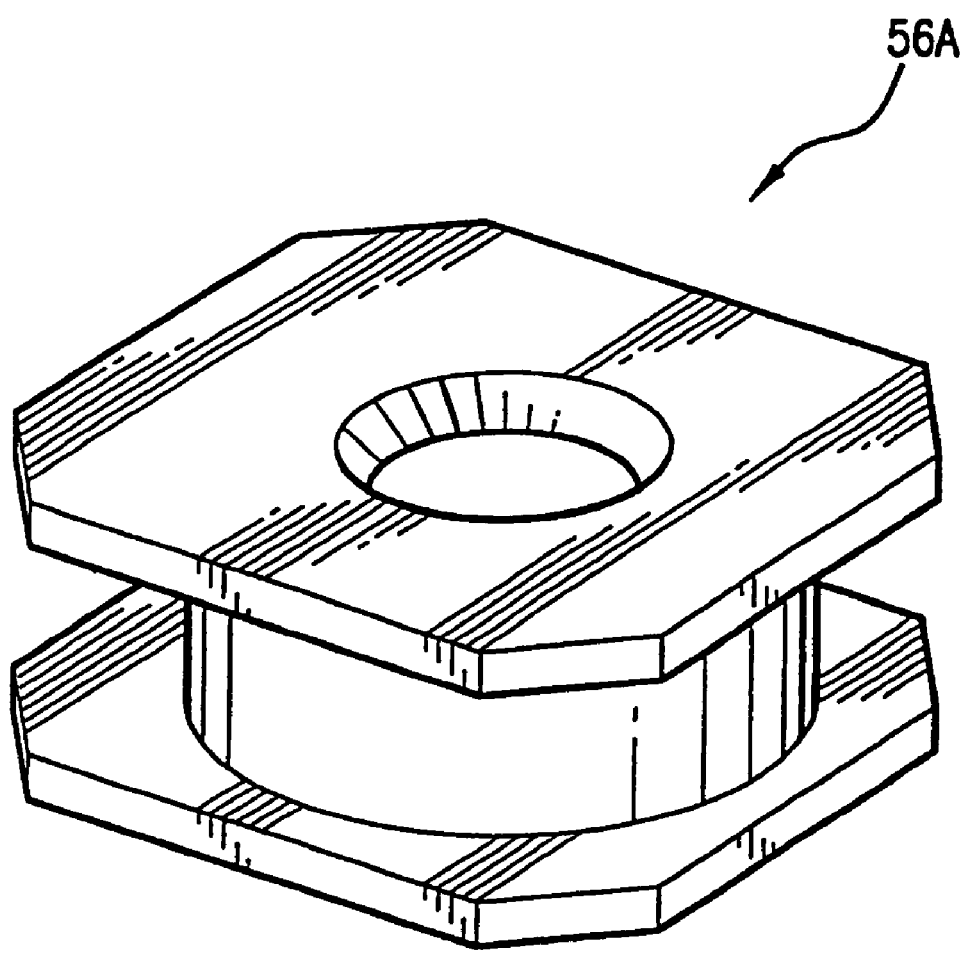

Pulse transformer 56 is also similar to the pulse transformer described in U.S. Pat. Nos. 5,448,580 and 5,313,481; however, the pulse transformers of the present embodiment has only a single turn in the secondary winding and 24 induction units equivalent to 1/24 of a single primary turn for an equivalent step-up ratio of 1:24. A drawing of pulse transformer 56 is shown in FIG. 10. Each of the 24 induction units comprise an aluminum spool 56A having two flanges (each with a flat edge with threaded bolt holes) which are bolted to positive and negative terminals on printed circuit board 56B as shown along the bottom edge of FIG. 10. (The negative terminals are the high voltage terminals of the twenty four primary windings.) Insulators 56C separates the positive terminal of each spool from the negative terminal of the adjacent spool. Between the flanges of the spool is a hollow cylinder 1 1/16 inches long with a 0.875 OD with a wall thickness of about 1/32 inch. The spool is wrapped with one inch wide, 0.7 mil thick Metglas™ 2605 S3A and a 0.1 mil thick Mylar film until the OD of the insulated Metglas™ wrapping is 2.24 inches. A prospective view of a single wrapped spool forming one primary winding is shown in FIG. 10A.

The secondary of the transformer is a single OD stainless steel rod mounted within a tight fitting insulating tube of PTFE (Teflon7). The winding is in four sections as shown in FIG. 10. The low voltage end of stainless steel secondary shown as 56D in FIG. 10 is tied to the primary HV lead on printed circuit board 56B at 56E, the high voltage terminal is shown at 56F. As a result, the transformer assumes an auto-transformer configuration and the step-up ratio becomes 1:25 instead of 1:24. Thus, an approximately –1400 volt pulse between the + and – terminals of the induction units will produce an approximately –35,000 volt pulse at terminal 56F on the secondary side. This single turn secondary winding design provides very low leakage inductance permitting extremely fast output rise time.

Details of Laser Chamber Electrical Components

The Cp capacitor 82 is comprised of a bank of thirty-three 0.3 nf capacitors mounted on top of the chamber pressure vessel. (Typically an ArF laser is operated with a lasing gas made up of 3.5% argon, 0.1% fluorine, and the remainder neon.) The electrodes are about 28 inches long which are separated by about 0.5 to 1.0 inch preferably about 5/8 inch. Preferred electrodes are described below. In this embodiment, the top electrode is referred to as the cathode and the bottom electrode is connected to ground as indicated in FIG. 5 and is referred to as the anode.

Discharge Timing

In ArF, KrF and $F_2$ electric discharge lasers, the electric discharge lasts only about 50 ns (i.e., 50 billionths of a second). This discharge creates a population inversion necessary for lasing action but the inversion only exists during the time of the discharge. Therefore, an important requirement for an injection seeded ArF, KrF or $F_2$ laser is to assure that the seed beam from the master oscillator passes through discharge region of the power amplifier during the approximately 50 billionth of a second when the population is inverted in the laser gas so that amplification of the seed beam can occur. An important obstacle to precise timing of the discharge is the fact that there is a delay of about 5 microseconds between the time switch 42 (as shown in FIG. 5) is triggered to close and the beginning of the discharge which lasts only about 40–50 ns. It takes this approximately 5 microseconds time interval for the pulse to ring through the circuit between the $C_0$'s and the electrodes. This time interval varies substantially with the magnitude of the charging voltage and with the temperature of the inductors in the circuit.

Nevertheless in the preferred embodiment of the present invention described herein, Applicants have developed electrical pulse power circuits that provide timing control of the discharges of the two discharge chambers within a relative accuracy of less than about 2 ns (i.e., 2 billionths of a second). A block diagram of the two circuits are shown in FIG. 4.

Applicants have conducted tests which show that timing varies with charging voltage by approximately 5–10 ns/volt. This places a stringent requirement on the accuracy and repeatability of the high voltage power supply charging the charging capacitors. For example, if timing control of 5 ns is desired, with a shift sensitivity of 10 ns per volt, then the resolution accuracy would be 0.5 Volts. For a nominal charging voltage of 1000 V, this would require a charging accuracy of 0.05% which is very difficult to achieve especially when the capacitors must be charged to those specific values 4000 times per second.

Figure 4:
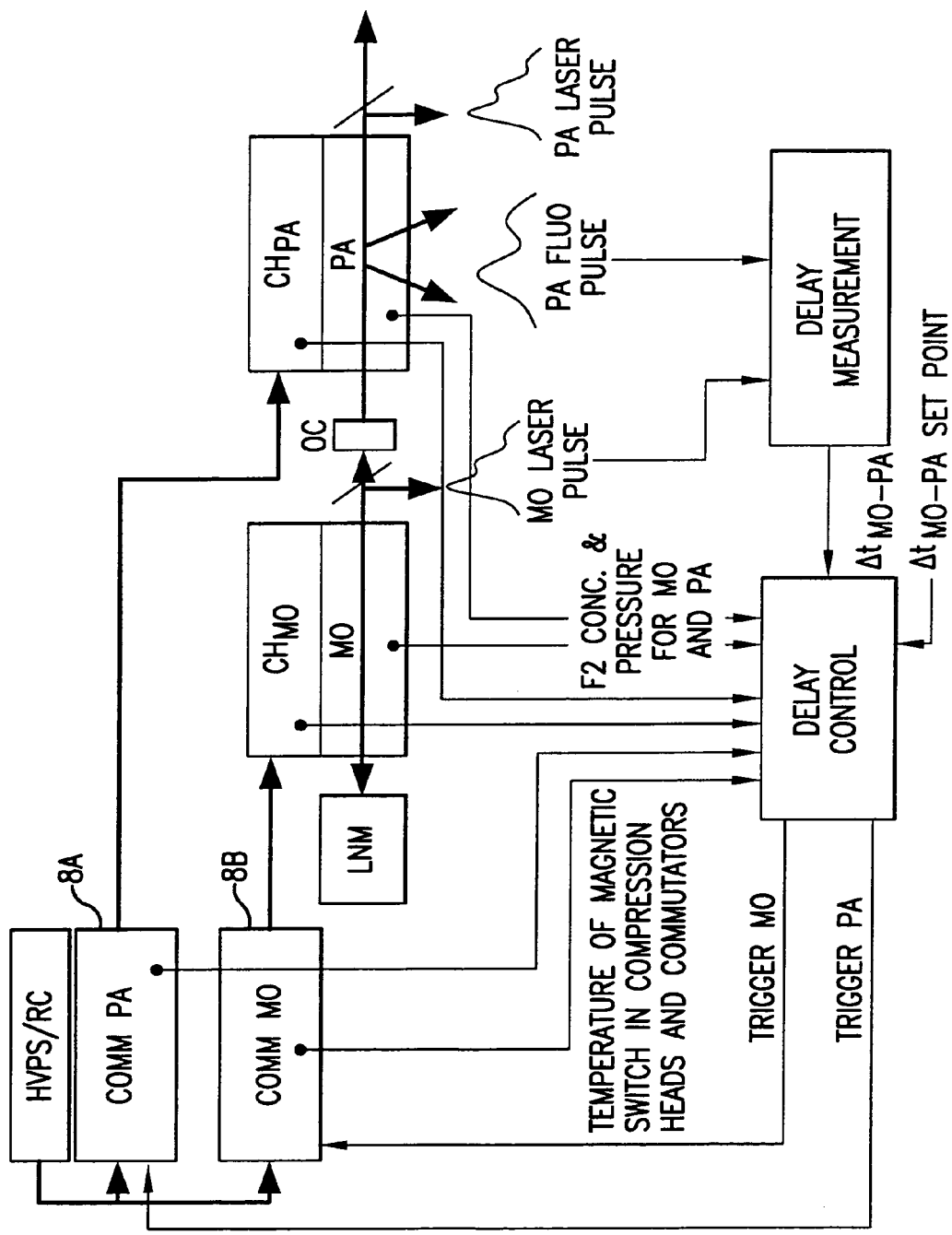
Figure 4B:
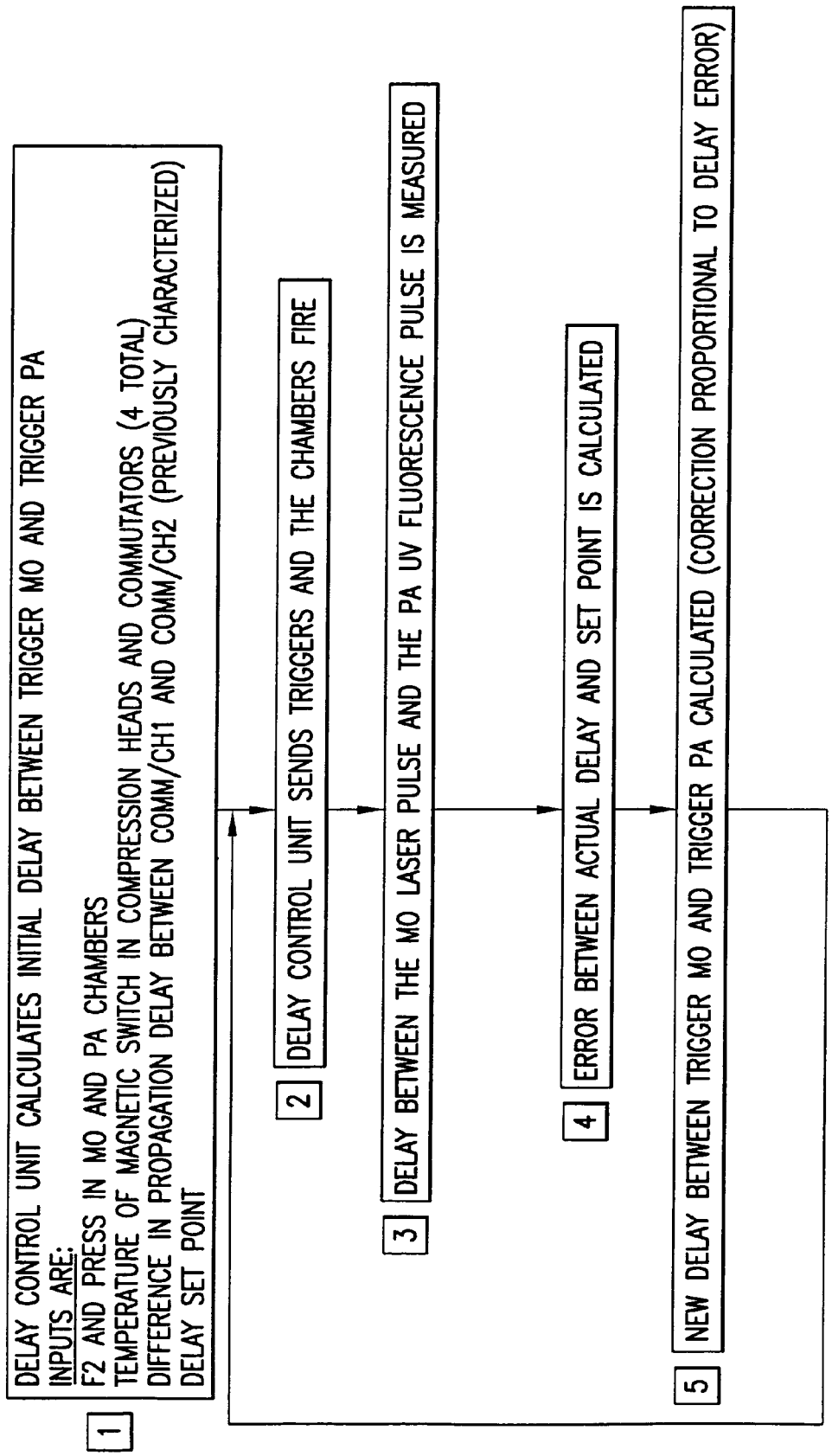
Figure 4C:
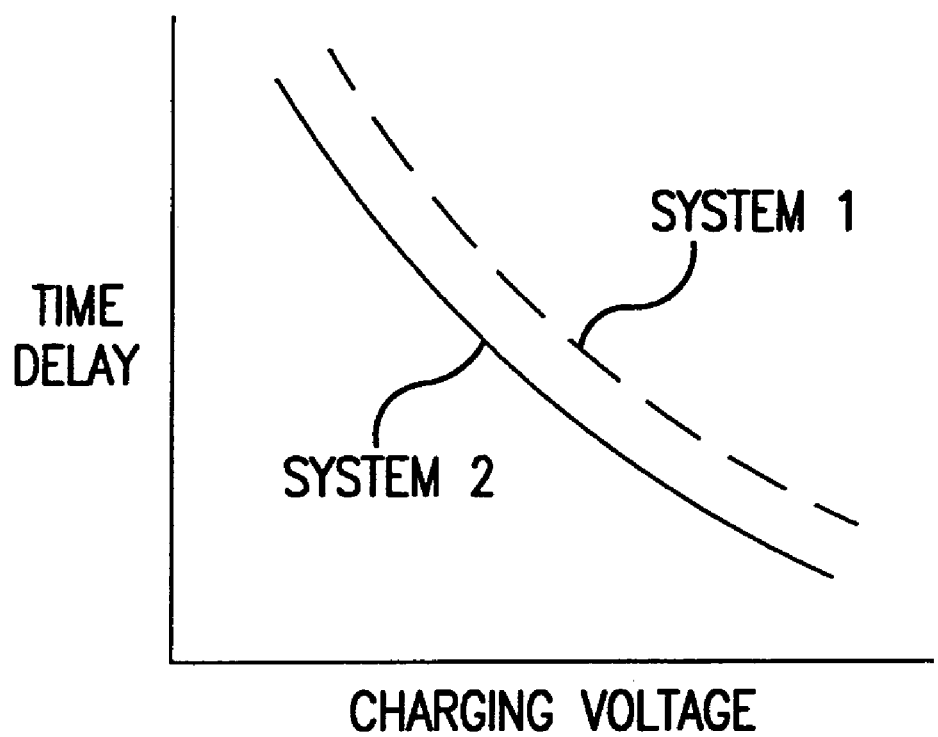

Applicants' preferred solution to this problem is to charge the charging capacitor of both the MO and the PA in parallel from the single resonant charger 7 as indicated in FIG. 1 and FIG. 4 and as described above. It is also important to design the two pulse compression/amplification circuits for the two systems so that time delay versus charging voltage curves match as shown in FIG. 4A. This is done most easily by using to the extent possible the same components in each circuit.

Thus, in order to minimize timing variations (the variations are referred to as jitter) in this preferred embodiment, Applicants have designed pulse power components for both discharge chambers with similar components and have confirmed that the time delay versus voltage curves do in fact track each other as indicated in FIG. 4A. Applicants have confirmed that over the normal operating range of charging voltage, there is a substantial change in time delay with voltage but the change with voltage is virtually the same for both circuits. Thus, with both charging capacitors charged in parallel charging voltages can be varied over a wide operating range without changing the relative timing of the discharges.

Temperature control of electrical components in the pulse power circuit is also important since temperature variations can affect pulse compression timing (especially temperature changes in the saturable inductors). Therefore, a design goal is to minimize temperature variations and a second approach is to monitor temperature of the temperature sensitive components and using a feedback control adjust the trigger timing to compensate. Controls can be provided with a processor programmed with a learning algorithm to make adjustments based on historical data relating to past timing variations with known operating histories. This historical data is then applied to anticipate timing changes based on the current operation of the laser system.

Trigger Control

The triggering of the discharge for each of the two chambers is accomplished separately utilizing for each circuit a trigger circuit such as one of those described in U.S. Pat. No. 6,016,325. These circuits add timing delays to correct for variations in charging voltage and temperature changes in the electrical components of the pulse power so that the time between trigger and discharge is held as constant as feasible. As indicated above, since the two circuits are basically the same, the variations after correction are almost equal (i.e., within about 2 ns of each other).

As indicated in FIGS. 6C, D, and E, performance of this preferred embodiment is greatly enhanced if the discharge in the power amplifier occurs about 40 to 50 ns after the discharge in the master oscillator. This is because it takes several nanoseconds for the laser pulse to develop in the master oscillator and another several nanoseconds for the front part of the laser beam from the oscillator to reach the amplifier and because the rear end of the laser pulse from the master oscillator is at a much narrower bandwidth than the front part. For this reason, separate trigger signals are provided to trigger switch 46 for each chamber. The actual delay is chosen to achieve desired beam quality based on actual performance curves such as those shown in FIGS. 6C, D and E. The reader should note, for example, that narrower bandwidth and longer pulses can be obtained at the expense of pulse energy by increasing the delay between MO trigger and PA trigger.

Other Techniques To Control Discharge Timing

Since the relative timing of the discharges can have important effects on beam quality as indicated in the FIGS. 6C, D and E graphs, additional steps may be justified to control the discharge timing. For example, some modes of laser operation may result in wide swings in charging voltage or wide swings in inductor temperature. These wide swings could complicate discharge timing control.

Monitor Timing

The timing of the discharges can be monitored on a pulse-to-pulse basis and the time difference can be used in a feedback control system to adjust timing of the trigger signals closing switch 42. Preferably, the PA discharge would be monitored using a photocell to observe discharge fluorescence (called ASE) rather than the laser pulse since very poor timing could result if no laser beam being produced in the PA. For the MO either the ASE or the seed laser pulse could be used.

Bias Voltage Adjustment

The pulse timing can be increased or decreased by adjusting the bias currents through inductors $L_{B1}$ $L_{B2}$ and $L_{B3}$ which provide bias for inductors 48, 54 and 64 as shown in FIG. 5. Other techniques could be used to increase the time needed to saturate these inductors. For example, the core material can be mechanically separated with a very fast responding PZT element which can be feedback controlled based on a feedback signal from a pulse timing monitor.

Adjustable Parasitic Load

An adjustable parasitic load could be added to either or both of the pulse power circuits downstream of the CO's.

Additional Feedback Control

Charging voltage and inductor temperature signals, in addition to the pulse timing monitor signals can be used in feedback controls to adjust the bias voltage or core mechanical separation as indicated above in addition to the adjustment of the trigger timing as described above.

Burst Type Operation

Feedback control of the timing is relatively easy and effective when the laser is operating on a continuous basis. However, normally lithography lasers operate in a burst mode such as the following to process 20 areas on each of many wafers:
  Off for 1 minute to move a wafer into place
  4000 Hz for 0.2 seconds to illuminate area 1
  Off for 0.3 seconds to move to area 2
  4000 Hz for 0.2 seconds to illuminate area 2

Off for 0.3 seconds to move to area 3
4000 Hz for 0.2 seconds to illuminate area 3
...
4000 Hz for 0.2 seconds to illuminate area 199
Off for 0.3 seconds to move to area 200
4000 Hz for 0.2 seconds to illuminate area 200
Off for one minute to change wafers
4000 Hz for 0.2 seconds to illuminate area 1 on the next wafer, etc.

This process may be repeated for many hours, but will be interrupted from time-to-time for periods longer than 1 minute.

The length of down times will affect the relative timing between the pulse power systems of the MO and the PA and adjustment may be required in the trigger control to assure that the discharge in the PA occurs when the seed beam from the MO is at the desired location. By monitoring the discharges and the timing of light out from each chamber the laser operator can adjust the trigger timing (accurate to within about 2 ns) to achieve best performance.

Preferably a laser control processor is programmed to monitor the timing and beam quality and adjust the timing automatically for best performance. Timing algorithms which develop sets of bin values applicable to various sets of operating modes are utilized in preferred embodiments of this invention. These algorithms are in preferred embodiments designed to switch to a feedback control during continuous operation where the timing values for the current pulse is set based on feedback data collected for one or more preceding pulse (such as the immediately preceding pulse).

No Output Discharge

Timing algorithms such as those discussed above work very well for continuous or regularly repeated operation. However, the accuracy of the timing may not be good in unusual situations such as the first pulse after the laser is off for an unusual period of time such as 5 minutes. In some situations imprecise timing for the first one or two pulses of a burst may not pose a problem. A preferred technique is to preprogram the laser so that the discharges of the MO and the PA are intentionally out of sequence for one or two pulses so that amplification of the seed beam from the MO is impossible. For example, laser could be programmed to trigger the discharge of the PA 80 ns prior to the trigger of the MO. In this case, there will be no significant output from the laser but the laser metrology sensors can determine the timing parameters so that the timing parameters for the first output pulse is precise.

Water Cooling of Components

To accommodate greater heat loads water cooling of pulse power components is provided in addition to the normal forced air cooling provided by cooling fans inside the laser cabinet in order to support operation at this higher average power mode.

One disadvantage of water cooling has traditionally been the possibility of leaks near the electrical components or high voltage wiring. This specific embodiment substantially avoids that potential issue by utilizing a single solid piece of cooling tubing that is routed within a module to cool those components that normally dissipate the majority of the heat deposited in the module. Since no joints or connections exist inside the module enclosure and the cooling tubing is a continuous piece of solid metal (e.g. copper, stainless steel, etc.), the chances of a leak occurring within the module are greatly diminished. Module connections to the cooling water are therefore made outside the assembly sheet metal enclosure where the cooling tubing mates with a quick-disconnect type connector.

Saturable Inductor

Figure 11:
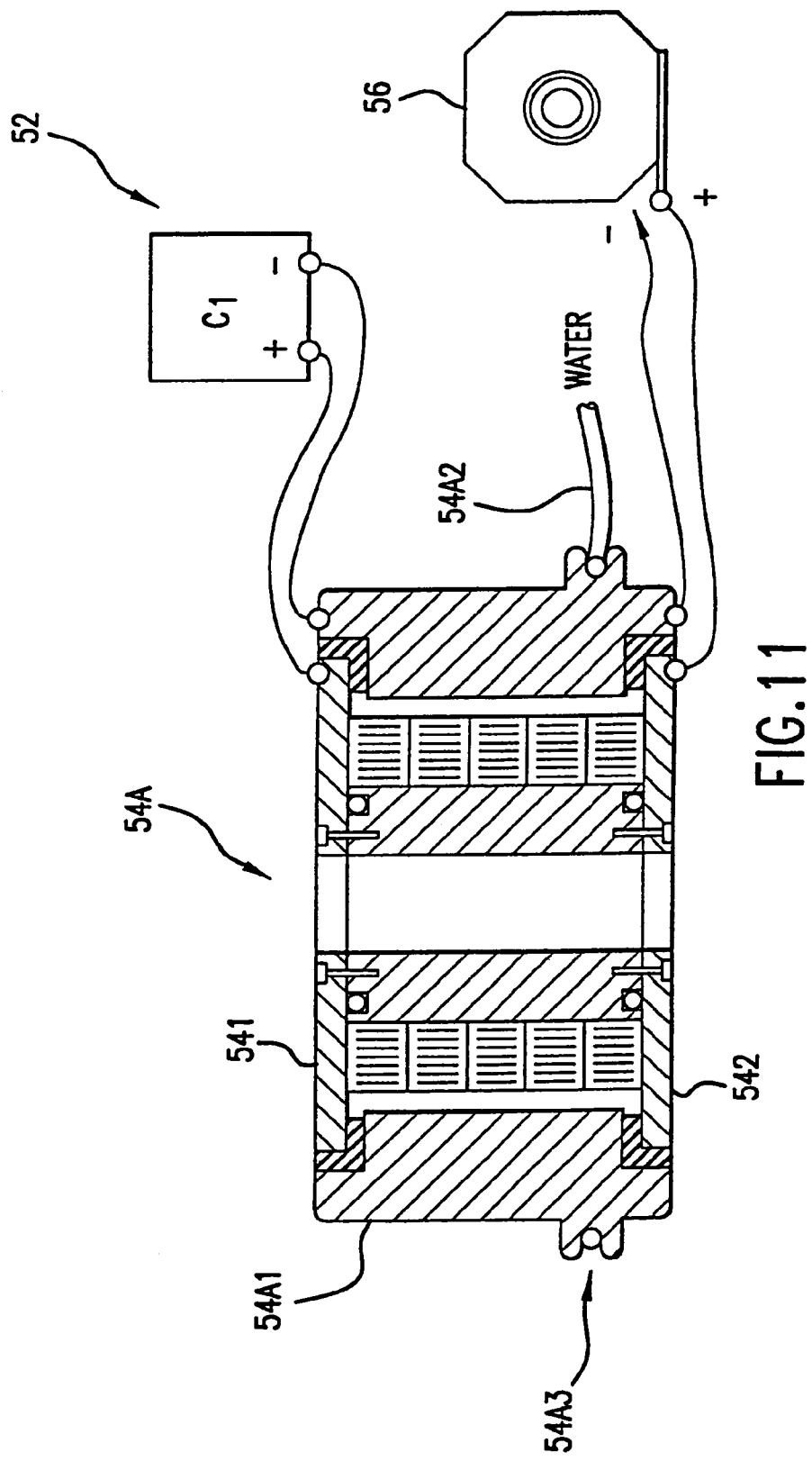

In the case of the commutator module, a water cooled saturable inductor 54A is provided as shown in FIG. 11 which is similar to the inductor 54 shown in FIG. 8 except the fins of 54 are replaced with a water cooled jacket 54A1 as shown in FIG. 11. The cooling line 54A2 is routed within the module to wrap around jacket 54A1 and through aluminum base plate where the IGBT switches and Series diodes are mounted. These three components make up the majority of the power dissipation within the module. Other items that also dissipate heat (snubber diodes and resistors, capacitors, etc.) are cooled by forced air provided by the two fans in the rear of the module.

Since the jacket 54A1 is held at ground potential, there are no voltage isolation issues in directly attaching the cooling tubing to the reactor housing. This is done by press-fitting the tubing into a dovetail groove cut in the outside of the housing as shown at 54A3 and using a thermally conductive compound to aid in making good thermal contact between the cooling tubing and the housing.

Cooling High Voltage Components

Although the IGBT switches "float" at high voltage, they are mounted on an aluminum base electrically isolated from the switches by a 1/16 inch thick alumina plate. The aluminum base plate which functions as a heat sink and operates at ground potential and is much easier to cool since high voltage isolation is not required in the cooling circuit. A drawing of a water cooled aluminum base plate is shown in FIG. 7A. In this case, the cooling tubing is pressed into a groove in an aluminum base on which the IGBT's are mounted. As with the inductor 54a, thermally conductive compound is used to improve the overall joint between the tubing and the base plate.

The series diodes also "float" at high potential during normal operation. In this case, the diode housing typically used in the design provides no high voltage isolation. To provide this necessary insulation, the diode "hockey puck" package is clamped within a heat sink assembly which is then mounted on top of a ceramic base that is then mounted on top of the water-cooled aluminum base plate. The ceramic base is just thick enough to provide the necessary electrical isolation but not too thick to incur more than necessary thermal impedance. For this specific design, the ceramic is 1/16" thick alumina although other more exotic materials, such as beryllia, can also be used to further reduce the thermal impedance between the diode junction and the cooling water.

A second embodiment of a water cooled commutator utilizes a single cold plate assembly which is attached to the chassis baseplate for the IGBT's and the diodes. The cold plate may be fabricated by brazing single piece nickel tubing to two aluminum "top" and "bottom" plates. As described above, the IGBT's and diodes are designed to transfer their heat into the cold plate by use of the previously mentioned ceramic disks underneath the assembly. In a preferred embodiment of this invention, the cold plate cooling method is also used to cool the IGBT and the diodes in the resonant charger. Thermally conductive rods or a heat pipe can also be used to transfer heat from the outside housing to the chassis plate.

Detailed Compression Head Description

Figure 12:
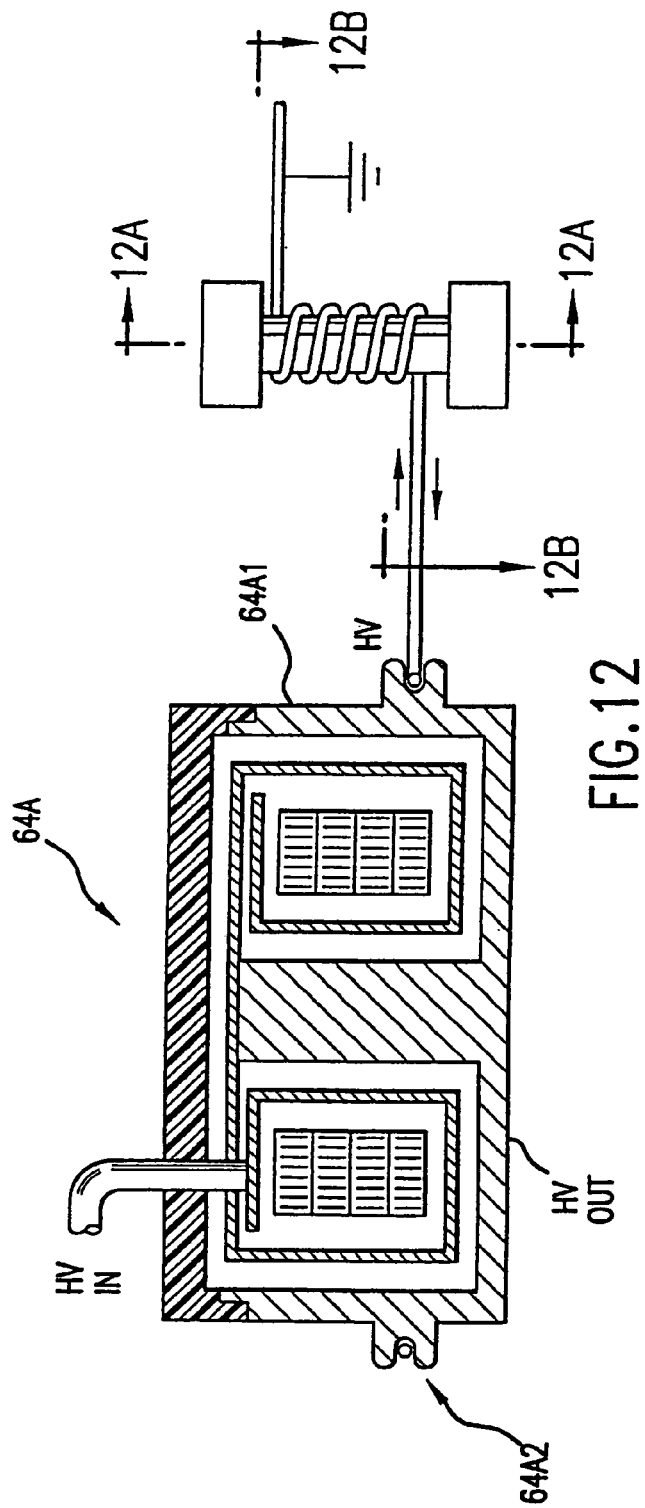
Figure 12B:
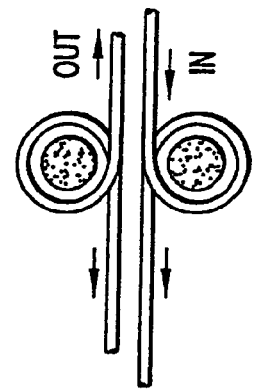
Figure 12A:
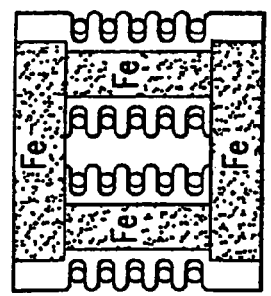

The water-cooled compression head is similar in the electrical design to a prior art air-cooled version (the same type ceramic capacitors are used and similar material is used in the reactor designs). The primary differences in this case are that the module must run at higher rep-rates and therefore, higher average power. In the case of the compression head module, the majority of the heat is dissipated within the modified saturable inductor 64A. Cooling the subassembly is not a simple matter since the entire housing operates with short pulses of very high voltages. The solution to this issue as shown in FIGS. 12, 12A and 12B is to inductively isolate the housing from ground potential. This inductance is provided by wrapping the cooling tubing around two cylindrical forms that contain a ferrite magnetic core. Both the input and output cooling lines are coiled around cylindrical portions of a ferrite core formed of the two cylindrical portions and the two ferrite blocks as shown in FIGS. 12, 12A and 12B.

The ferrite pieces are made from CN-20 material manufactured by Ceramic Magnetics, Inc. of Fairfield, N.J. A single piece of copper tubing (0.187" diameter) is press fit and wound onto one winding form, around the housing 64A1 of inductor 64A and around the second winding form. Sufficient length is left at the ends to extend through fittings in the compression head sheet metal cover such that no cooling tubing joints exist within the chassis.

The inductor 64A comprises a dovetail groove as shown at 64A2 similar to that used in the water-cooled commutator first stage reactor housing. This housing is much the same as previous air-cooled versions with the exception of the dovetail groove. The copper cooling-water tubing is press fit into this groove in order to make a good thermal connection between the housing and the cooling-water tubing. Thermally conductive compound is also added to minimize the thermal impedance.

The electrical design of inductor 64A is changed slightly from that of 64 shown in FIGS. 9A and 9B. Inductor 64A provides only two loops (instead of five loops) around magnetic core 64A3 which is comprised of four coils of tape (instead of three).

As a result of this water-cooled tubing conductive path from the output potential to ground, the bias current circuit is now slightly different. As before, bias current is supplied by a dc-dc converter in the commutator through a cable into the compression head. The current passes through the "positive" bias inductor $L_{B2}$ and is connected to the Cp-1 voltage node. The current then splits with a portion returning to the commutator through the HV cable (passing through the transformer secondary to ground and back to the dc-dc converter). The other portion passes through the compression head reactor Lp-1 (to bias the magnetic switch) and then through the cooling-water tubing "negative" bias inductor $L_{B3}$ and back to ground and the dc-dc converter. By balancing the resistance in each leg, the designer is able to ensure that sufficient bias current is available for both the compression head reactor and the commutator transformer.

The "positive" bias inductor $L_{B2}$ is made very similarly to the "negative" bias inductor $L_{B3}$. In this case, the same ferrite bars and blocks are used as a magnetic core. However, two 0.125" thick plastic spacers are used to create an air gap in the magnetic circuit so that the cores do not saturate with the dc current. Instead of winding the inductor with cooling-water tubing, 18 AWG Teflon wire is wound around the forms.

Quick Connections

In this preferred embodiment, three of the pulse power electrical modules utilize blind mate electrical connections so that all electrical connections to the portions of the laser system are made merely by sliding the module into its place in the laser cabinet. These are the AC distribution module, the power supply module and the resonant charges module. In each case a male or female plug on the module mates with the opposite sex plug mounted at the back of the cabinet. In each case two approximately 3-inch end tapered pins on the module guide the module into its precise position so that the electrical plugs properly mate. The blind mate connectors such as AMP Model No. 194242-1 are commercially available from AMP, Inc. with offices in Harrisburg, Pa. In this embodiment connectors are for the various power circuits such as 208 volt AC, 400 volt AC, 1000 Volt DC (power supply out and resonant charges in) and several signal voltages. These blind mate connections permit these modules to be removed for servicing and replacing in a few seconds or minutes. In this embodiment blind mate connections are not used for the commutator module the output voltage of the module is in the range of 20 to 30,000 volts. Instead, a typical high voltage connector is used.

Discharge Components

FIGS. 2 and 2A show details of an improved discharge configuration utilized in preferred embodiments of the present invention. This configuration includes an electrode configuration that Applicants call a blade-dielectric electrode. In this design, the anode 10A4 comprises a blunt blade shaped electrode with dielectric spaces mounted on both sides of the anode as shown to improve the gas flow in the discharge region. The anode is 26.4 inches long and 0.439 inches high. It is 0.284 inches wide at the bottom and 0.141 inches wide at the top. It is attached to flow shaping anode support bar 10A6 with screws through sockets that allow differential thermal expansion of the electrode from its center position. The anode is comprised of a copper based alloy preferably C36000, C95400, or C19400. Cathode 10A2 has a cross section shape as shown in FIG. 2A which is slightly pointed at the anode facing position. A preferred cathode material is C36000. Additional details of this blade dielectric configuration are provided in U.S. patent application Ser. No. 09/768,753 incorporated herein by reference. The current return 10A8 in this configuration is comprised of a single long section of thin (about ⅟₁₆" diameter) copper or brass wire formed into a whale bone shaped with 27 ribs equally spaced along the length of electrode, the cross section of which is shown in FIGS. 2 and 2A. The wire is clamped into line grooves at the bottom of anode and semi-circular grooves at the chamber top inside surface.

Alternate Pulse Power Circuit

A second preferred pulse power circuit is shown in FIGS. 5C1, 5C2 and 5C3. This circuit is similar to the one described above but utilizes a higher voltage power supply for charging $C_0$ to a higher value. As in the above described embodiments, a high voltage pulse power supply unit operating from factory power at 230 or 460 volts AC, is power source for a fast charging resonant charger as described above and designed for precise charging two 2.17 :F at frequencies of 4000 to 6000 Hz to voltages in the range of about 1100 V to 2250 V. The electrical components in the commutator and compression head for the master oscillator are as identical as feasible to the corresponding components in the power amplifier. This is done to keep time responses in the two circuits as identical as feasible. Switches 46 are banks of two IGBT switches each rated at 3300 V and arranged in parallel. The $C_O$ capacitor banks 42 is comprised of 128 0.068 :F 1600 V capacitors arranged in 64 parallel legs to provide the 2.17 :F $C_O$ bank. The $C_1$ capacitor banks 52 are comprised of 136 0.068 :F 1600 V capacitors arranged in 68 parallel legs to provide a bank capacitance of 2.33 :F. The $C_{p-1}$ and $C_p$ capacitor banks are the same as those described above with reference to FIG. 5. The 54 saturable inductors are single turn inductors providing saturated inductance of about 3.3 nH with five cores comprised of 0.5 inch thick 50%—50% Ni—Fe with 4.9 inch OD and 3.8 inch ID. The 64 saturable inductors are two turn inductors providing saturated inductance of about 38 nH each comprised of 5 cores, 0.5 inch thick made with 80%–20% Ni—Fe with an OD of 5 inches and an ID of 2.28 inches. Trigger circuits are provided for closing IGBT's 46 with a timing accuracy of two nanoseconds. The master oscillator is typically triggered about 40 ns prior to the triggering of the IGBT 46 for power amplifier. However, the precise timing is preferably determined by feedback signals from sensors which measure the timing of the output of the master oscillator and the power amplifier discharge.

Alternate Technique For Timing Control

As described earlier, the throughput timing of the magnetic pulse compression in the Pulsed Power system is dependent upon the magnetic material properties that can be a function of the material temperature, etc. In order to maintain precise timing, it is therefore extremely important to either directly or indirectly monitor and/or predict these material properties. One method described previously would utilize temperature monitors along with previously collected data (delay time as a function of temperature) to predict the timing.

An alternate approach would utilize the magnetic switch bias circuit to actually measure the magnetic properties (the saturation time) as the magnetics were reverse biased in between pulses (or prior to the first pulse). The bias circuit would apply sufficient voltage to the magnetic switch to reverse bias the material and at the same time measure the saturation time so that the laser timing could be accurately controlled. Since the volt-second product utilized in reverse biasing the switch should be equal to that required during normal discharge operation in the forward direction, the throughput delay time of the Pulsed Power system could be easily calculated knowing the operating voltage of the upcoming pulse.

Figure 5D:
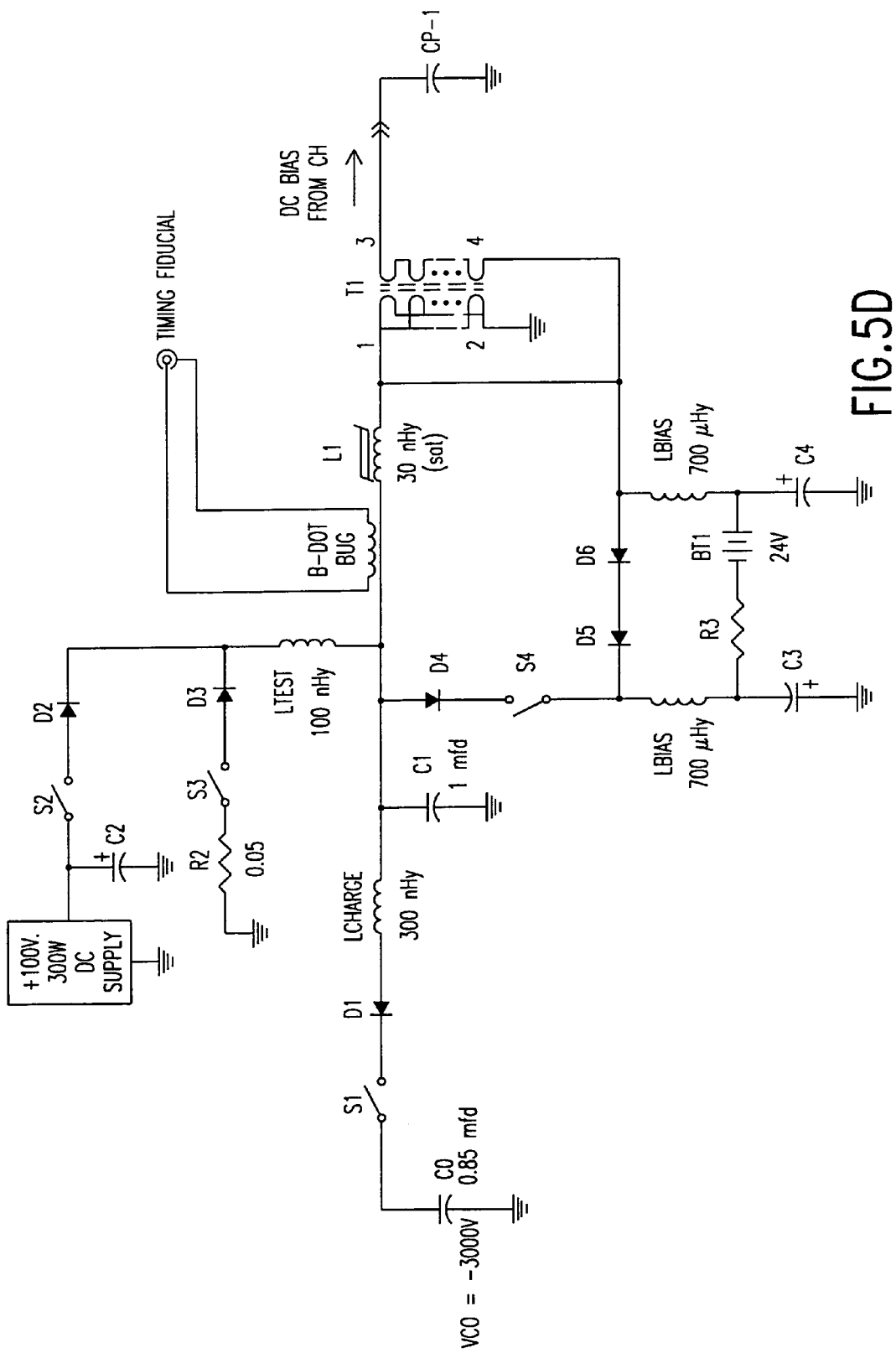

A schematic diagram of the proposed approach is shown in FIG. 5D. Initial operation assumes that the magnetic switch, L1, is already saturated in the forward direction, provided by power supply BT1 through the two bias isolation inductors, L bias, and switch S4. This current is then interrupted by opening S4 and closing S2 which applies ~100V to the magnetic switch, L1, which then saturates after ~30 us. A timer is triggered when S2 closes and stops counting when a current probe detects saturation of L1, thus calculating the saturation time of L1 for the 100V applied voltage. L1 is now reverse biased and ready for the main pulse discharge sequence once residual voltage has been drained from the circuit by S3 and other components.

Pulse Length

As indicated in FIG. 6E, the output pulse length measured in tests conducted by Applicants is in the range of about 20 ns and is to some extent a function of the relative timing of the two discharges. A longer pulse length (other things being equal) can increase the lifetime of optical components of lithography equipment.

Applicants have identified several techniques for increasing pulse length. As indicated above, the relative time between discharges can be optimized for pulse length. The pulse power circuits of both the MO and the PA could be optimized for longer pulses using techniques such as those described in U.S. patent application Ser. No. 09/451,995 incorporated herein by reference. An optical pulse multiplier system such as one of those described in U.S. Pat. No. 6,067,311, incorporated by reference herein, could be added downstream of the PA to reduce the intensity of individual pulses. A preferred pulse multiplier unit is described in the next section. This pulse multiplier could be made a part of the beam path to lens components of a lithography tool. The chamber could be made longer and the electrodes could be configured to produce traveling wave discharges designed for longer pulse lengths.

Pulse Multiplier Unit

A preferred pulse multiplier unit is shown in FIG. 22A. Light beam 20 from laser 50 hits the beam splitter 22. Beam splitter has a reflectivity of about 40%. About 40% of the light reflects a first portion of the output beam 30. The rest of the incoming beam transmits through the beam splitter 22 as beam 24. The beam is reflected back at a small angle by a mirror 26, which is a spherical mirror with the focal length equal the distance from beam splitter 22 to the mirror. So, the beam is focused to a point 27 near the beam splitter 22 but missing it slightly. This beam spreads again and is now reflected by mirror 28, which is also a spherical mirror with the focal length equal the distance from this mirror to point 27. The mirror 28 reflect the beam back at a small angle and also collimates the reflected beam. This reflected beam 32 propagates to the right and is reflected by mirror 29 to beam splitter 22 where about 60% of the beam is transmitted through beam splitter 22 to merge into and become the second portion of output beam 30. A portion (about 40%) of beam 34 is reflected by the beam splitter 22 in the direction of beam 24 for a repeat of the trip of beam 32. As a result, a short input pulse is split into several portions, so that total duration of the beam is increased and its peak intensity is decreased. Mirrors 26 and 28 create a relay system which images the portions of the outcoming beam onto each other. Because of that imaging, each portion of the output beam is virtually the same. (If mirrors 26 and 28 were flat, beam divergence would spread the beam for each subsequent repetition, so beam size would be different for each repetition.) The total optical path length from beam splitter 22 to mirror 26 to mirror 28 to mirror 27 and, finally, to beam splitter 22 determines the time delay between repetitions. FIG. 22B1 shows the pulse profile of a typical pulse produced by an ArF excimer laser. FIG. 22B2 shows the simulated output pulse profile of a similar ArF laser pulse after being spread in a pulse stretcher built in accordance with FIG. 6. In this example the $T_{is}$ of the pulse was increased from 18.16 ns to 45.78 ns. ($T_{is}$ is a measure of pulse duration used for describing laser pulses. It refers to the integral square pulse duration.)

Figure 22D:
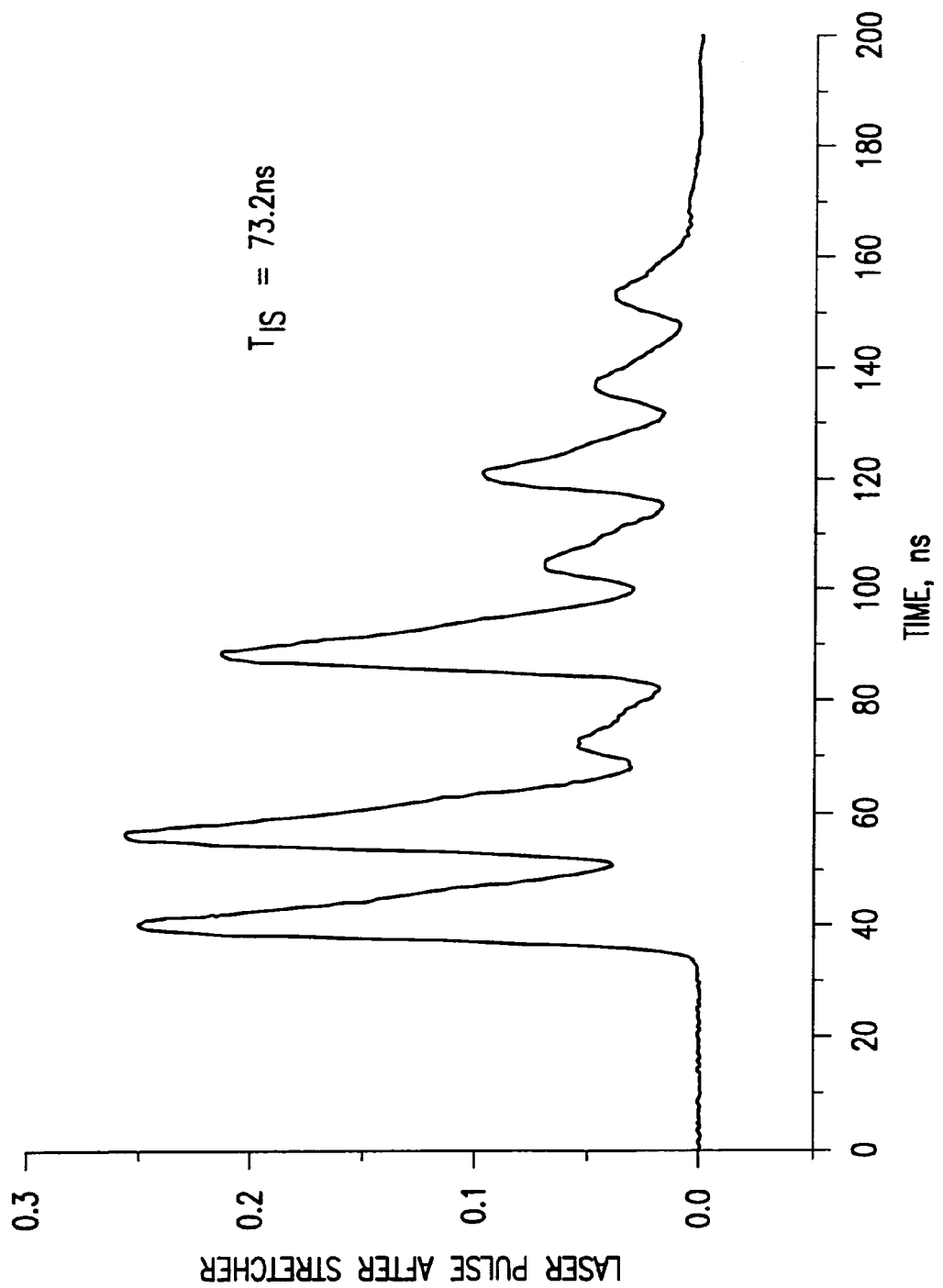

FIG. 22C shows a layout similar to the FIG. 22A layout but with an additional delay path. In this case, the first beam splitter 22A is designed for a reflection of 25 percent and the second beam splitter 22B is designed for a reflection of 40 percent. The resulting beam shape produced by computer simulation is shown in FIG. 22D. The $T_{is}$ for this stretched pulse is about 73.2 ns. In the FIG. 22C embodiment, the portions of the beam is transmitted through beam splitter 22B are flipped in orientation when they return and are joined into exit beam 30. This reduces significantly the spatial coherence of the beam.

FIGS. 22E and F show beam splitter designs which use optical elements without coatings. FIG. 22E shows a beam splitter design to take advantage of frustrated internal reflection and FIG. 22F shows a transparent uncoated plate tilted to produce a Fresnel reflection from both sides of the plate to achieve the desired reflection-transmission ratio.

The pulse stretcher unit could be installed in the back of vertical optical table 11 as suggested above or it could be installed on top of the table or even inside of it.

Pulse and Dose Energy Control

Pulse energy and dose energy are preferably controlled with a feedback control system and algorithm such as that described above. The pulse energy monitor can be at the laser as closer to the wafer in the lithography tool. Using this technique charging voltages are chosen to produce the pulse energy desired. In the above preferred embodiment, both the MO and the PA are provided with the same charging voltage since the CO's are charged in parallel.

Applicants have determined that this technique works very well and greatly minimize timing jitter problems. This technique, however, does reduce to an extent the laser operator's ability to control the MO independently of the PA. However, there are a number of operating parameters of the MO and the PA that can be controlled separably to optimize performance of each unit. These other parameters include: laser gas pressure, $F_2$ concentration and laser gas temperature, These parameters preferably are controlled independently in each of the two chambers and regulated in a processor controlled feedback arrangement.

Additional Optical Quality Improvement

The present invention provides a laser system capable of much greater pulse energy and output power than prior art single chamber high repetition rate gas discharge lasers. With this system the master oscillator to a large extent determines the wavelength and the bandwidth and the power amplifier primarily controls the pulse energy. The pulse energy needed for an efficient seeding of the power amplifier is can be as low as a small fraction of a mJ as shown in FIG. 6B. Since the master oscillator type of laser is easily capable of producing 5 mJ pulses, it has energy to spare. This additional pulse energy provides opportunities for using certain techniques for improving beam quality which are not particularly energy efficient.

These techniques include:
Pulse trimming as described in U.S. Pat. No. 5,852,621, incorporated herein by reference. The pulse energy is monitored, the pulse is delayed and a portion of the delayed pulse is trimmed using a very fast optical switch such as a Pockels cell.
Using line-narrowing module with very high beam expansion and small apertures, as described later in this application.

Wavefront engineering
Intercavity wavefront correction in addition to the single bend of the grating as shown in U.S. Pat. No. 6,094,448 can be added to the master oscillator. This could include multiple bends of the grating as described in U.S. patent application Ser. No. 09/703,317 incorporated herein by reference, a deformable tuning mirror 14, (as described in U.S. Pat. No. 6,192,064 incorporated herein by reference), wavefront correction can also be a static correction such as a non-flat prism face configured to correct a known wavefront distortion.

Figure 23:
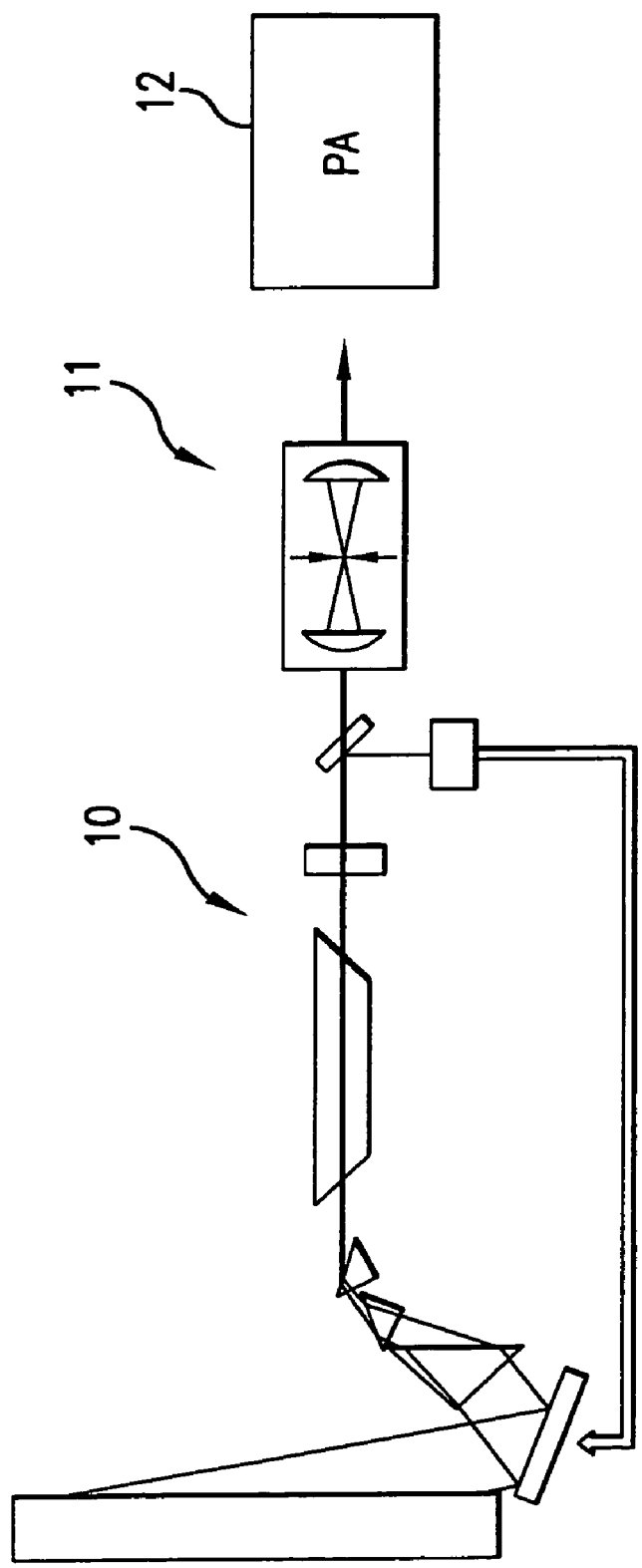
FIG. 23 shows a technique for spatially filtering a seed beam.

Beam filtering
Beam filters such as a spatial filter as described in U.S. patent application Ser. No. 09/309,478, incorporated by reference herein, and shown at 11 in FIG. 23 could be added to reduce bandwidth. Beam filters could be within the MO resonance cavity or between the MO and the PA. This could also be added downstream of the PA. A preferred spatial filter which does not require the beam to propagate through a focus is a total internal spatial filter and is described in the following section.

Coherence control
Coherence of the laser beam can be a problem for integrated circuit fabricators. Gas discharge lasers typically produce a laser beam which has low coherence. However, as the bandwidth is made very narrow, a consequence is greater coherence of the output beam. For this reason, some induced spatial in-coherence may be desired. Preferably optical components for reducing the coherence would be added either in the MO resonance cavity or between the MO and the PA. Several optical components are known for reducing coherence such as moving phase plates or acoustic-optic devices.

Aperturing
Beam quality of the seed beam can also be improved by tighter aperturing of the beam.

Total Internal Spatial Filter

Spatial filtering is effective at reducing the integrated 95% bandwidth. However, all direct spatial filtering techniques previously proposed required at least concentrating the beam and in most cases actually focusing the beam.

Additionally all previous designs required multiple optical elements. A simple, compact spatial filter that does not require a focused beam, would be more readily adaptable for incorporation inside the laser resonator.

The filter is a single prism approximately 2 inches in length. The entrance and exit faces of the prism are parallel to each other and normal to the incident beam. Two other faces would be parallel to each other but orientated at an angle equal to the critical angle with respect to the entrance and exit faces. At a wavelength of 193.35 nm the critical angle in $CaF_2$ is 41.77 degrees. The only coatings required would be normal incidence anti-reflection coatings on the entrance and exit faces of the prism.

The spatial filter would work in the following manner. The beam would enter at normal incidence to the entrance face of the prism. The beam would then propagate to the critical angle face of the prism. If the beam was collimated all rays would be incident at the critical angle at this second face. However, if the beam if diverging or converging some of the rays will strike this face at angles greater than and less than the critical angle. All rays striking this face at or greater than the critical angle will be reflected at 100%. Rays striking this face at an angle less than the critical angle will be reflected at values less than 100% and will be attenuated.

All rays that are reflected will be incident at the opposite face of the prism at the same angle where they will also be attenuated by the same amount. In the design proposed there will be a total of six reflections for each pass. The reflectivity for P-polarized light at an angle of 1 mrad less than the critical angle is about 71%. Therefore, all rays with incident angles that differ from the critical angle by 1 mrad or more will be transmitted at the exit face at less than 13% of their original intensity.

Figure 23A:
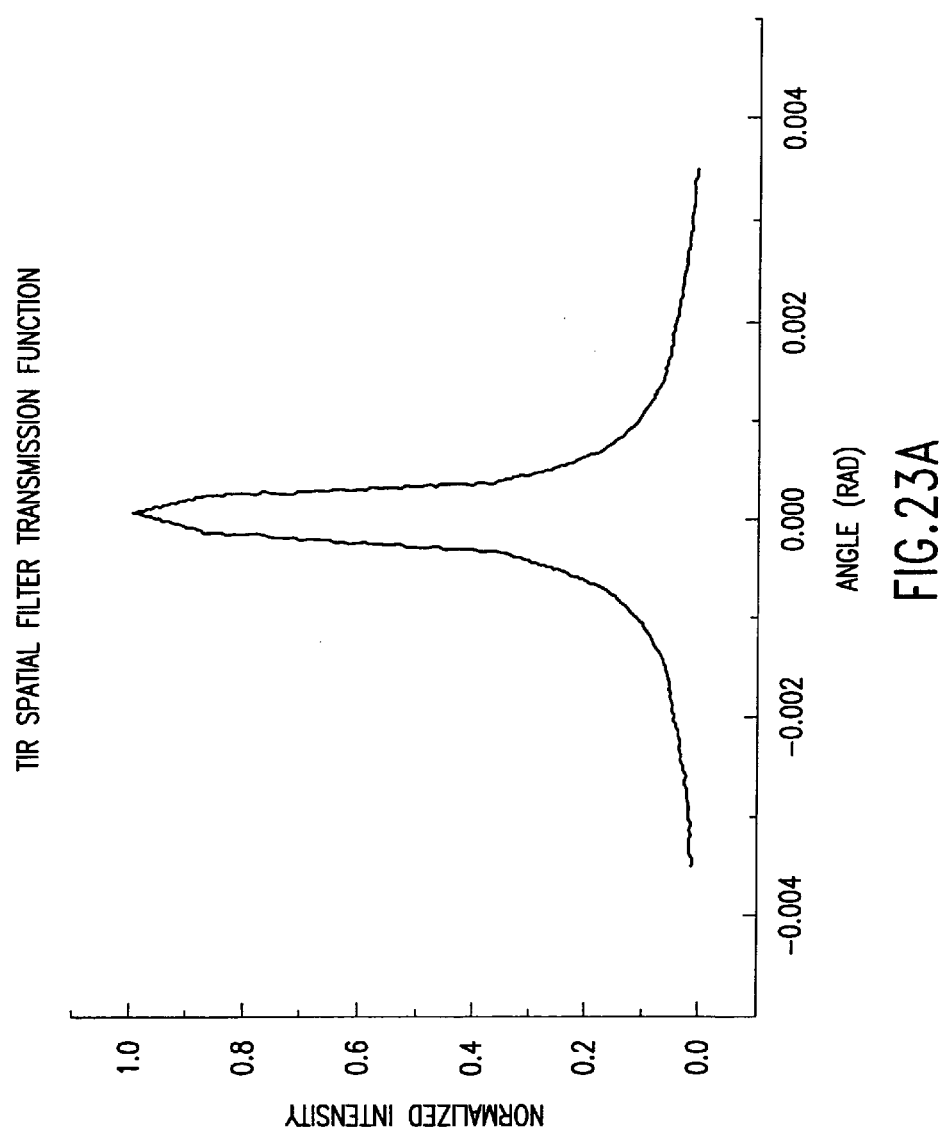
FIG. 23A shows the theoretical transmission function for a total internal reflection spatial filter made from $CaF_2$ at 193.35 nm.

However, a single pass of this filter will only be one sided. All rays that are incident at angles greater than the critical angle reflect at 100%. Once exiting the spatial filter prism, the beam will be incident upon a mirror. Inside the laser resonator this mirror could be the output coupler or the diffraction grating in the LNP. After reflecting of the mirror, the rays will re-enter the spatial filter prism, but with one critical difference. All rays that exited the spatial filter at angles that were greater than the critical angle will be inverted after reflecting off the mirror. These rays will now re-enter the prism at values less than the critical angle and will be attenuated. It is this second pass through the prism that changes the transmission function of the prism from a one sided filter into a true bandpass filter. FIG. 23A shows the theoretical transmission function for a total internal reflection spatial filter made from $CaF_2$ at 193.35 nm.

Figure 23B:
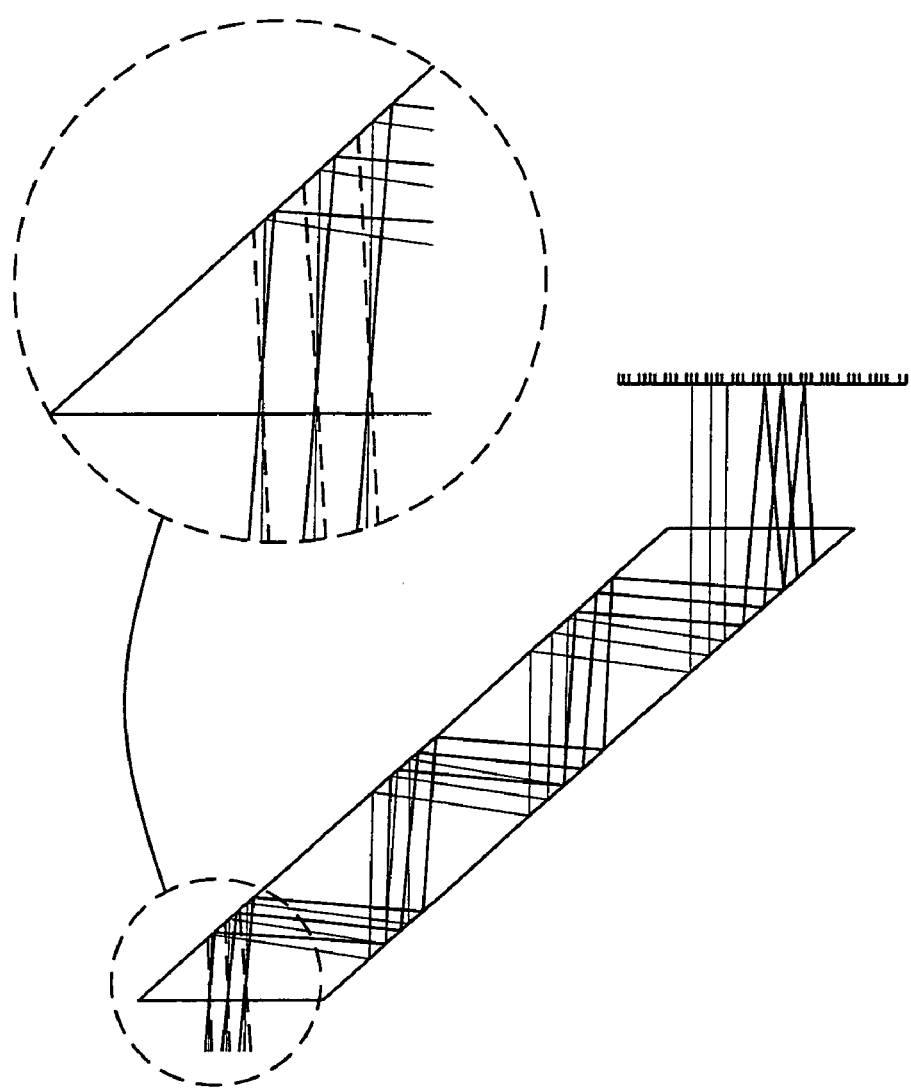
FIG. 23B shows the design of the spatial filter.

FIG. 23B shows the design of the spatial filter. The input and output faces of the prism are ½ inch. The critical angle faces are about 2 inches. The input beam width is 2.6 mm and represents the width of the beam in the short axis. The prism would have a height of 1 inch in the plane of the drawing. The figure shows three sets of rays. The first set of rays is collimated and strikes the surfaces at the critical angle. These are the green rays. A second set of rays is incident at the surface less than the critical angle and is terminated at the first reflection. They are the blue rays. These rays are more visible in the magnified section. They represent the rays that are attenuated on the first pass. The final set of rays is incident at an angle greater than the critical angle. These rays propagate through the entire first pass but are terminated at the first reflection of the second pass. They represent the rays that are attenuated on the second pass.

Telescope Between Chambers

In preferred embodiments a cylindrical refractive telescope is provided between the output of the master oscillator and the input of the power amplifier. This controls the horizontal size of the beam entering the power amplifier. This telescope can also be designed using well known techniques to control the horizontal divergence.

Gas Control

The preferred embodiment of this invention has a gas control module as indicated in FIG. 1 and it is configured to fill each chamber with appropriate quantities of laser gas. Preferably appropriate controls and processor equipment is provided to maintain continuous flow of gas into each chamber so as to maintain laser gas concentrations constant or approximately constant at desired levels. This may be accomplished using techniques such as those described in U.S. Pat. No. 6,028,880 or U.S. Pat. No. 6,151,349 or U.S. Pat. No. 6,240,117 (both of which are incorporated hereby reference).

Another technique for providing continuous flow of laser gas into the chambers which Applicants call its binary fill technique is to provide a number (such as 5) fill lines each successive line orificed to permit double the flow of the previous line with each line having a shut off valve. The lowest flow line is orificed to permit minimum equilibrium gas flow. Almost any desired flow rate can be achieved by selecting appropriate combinations of valves to be opened. Preferably a buffer tank is provided between the orificed lines and the laser gas source which is maintained at a pressure at about twice the pressure of the laser chambers.

Variable Bandwidth Control

As described above, this preferred embodiment of the present invention produces laser pulses much more narrow than prior art excimer laser bandwidths. In some cases, the bandwidth is narrower than desired giving a focus with a very short depth of focus. In some cases, better lithography results are obtained with a larger bandwidth. Therefore, in some cases a technique for tailoring the bandwidth will be preferred. Such a technique is described in detail in U.S. patent application Ser. Nos. 09/918,773 and 09/608,543, which are incorporated herein by reference. This technique involves use of computer modeling to determine a preferred bandwidth for a particular lithography results and then to use the very fast wavelength control available with the PZT tuning mirror control shown in FIGS. 16B1 and 16B2 to quickly change the laser wavelength during a burst of pulses to simulate a desired spectral shape. This technique is especially useful in producing relatively deep holes in integrated circuits.

Vertical Optical Table

In preferred embodiments the two chambers and the laser optics are mounted on a vertically oriented optical table. The table is preferably supported in the laser frame with a three-point kinematic mount. One preferred embodiment arrangement is shown in FIG. 1C1. Metal straps are provided on table 11 at locations A, B, and C where the table is mounted to the laser frame 4 (not shown in FIG. 1C1). A swivel joint is provided at location A which anchors the table but permits it to swivel. A ball and V-groove is provided at location B which restricts rotation in the plane of the bottom surface of the table and rotation in the plane of the table front surface. A ball and slot groove is provided at location C which restricts rotation around the A-B axis.

Ultra Fast Wavemeter with Fast Control Algorithm

Controlling Pulse Energy, Wavelength and Bandwidth

Prior art excimer lasers used for integrated circuit lithography are subject to tight specifications on laser beam parameters. This has typically required the measurement of pulse energy, bandwidth and center wavelength for every pulse and feedback control of pulse energy and bandwidth. In prior art devices the feedback control of pulse energy has been on a pulse-to-pulse basis, i.e., the pulse energy of each pulse is measured quickly enough so that the resulting data can be used in the control algorithm to control the energy of the immediately following pulse. For a 1,000 Hz system this means the measurement and the control for the next pulse must take less than 1/1000 second. For a 4000 Hz system speeds need to be four times as fast. A technique for controlling center wavelength and measuring wavelength and bandwidth is described in U.S. Pat. No. 5,025,455 and in U.S. Pat. No. 5,978,394. These patents are incorporated herein by reference.

Control of beam parameters for this preferred embodiment is also different from prior art excimer light source designs in that the wavelength and bandwidth of the output beam is set by conditions in the master oscillator 10 whereas the pulse energy is mostly determined by conditions in the power amplifier 12. In preferred embodiments, wavelength bandwidths and pulse energy are preferably measured on a pulse to pulse basis at the output of the pulse multiplier and the measurements are used in a feedback control system to control wavelength and pulse energy. These beam parameters can also be measured at other locations such as the output of the power amplifier and the output of the master oscillator.

Preferably power monitors (p-cells) should be provided at the output of the master oscillator, after the power amplifies and after the pulse multiplies. Preferably a p-cell should also be provided for monitoring any back reflections into the master oscillator. Such back reflections could be amplified in the oscillator and damage the LNP optical components. The back reflection signal from the back reflection monitor is used to shut the laser down if a danger threshold is exceeded. Also, the system should be designed to avoid glint in the beam path that might cause any significant back reflection.

Fast Measurement and Control of Beam Parameters

The beam parameter measurement and control for this laser is described below. The wavemeter used in the present embodiment is similar to the one described in U.S. Pat. No. 5,978,394 and some of the description below is extracted from that patent.

Measuring Beam Parameters

Figure 14:
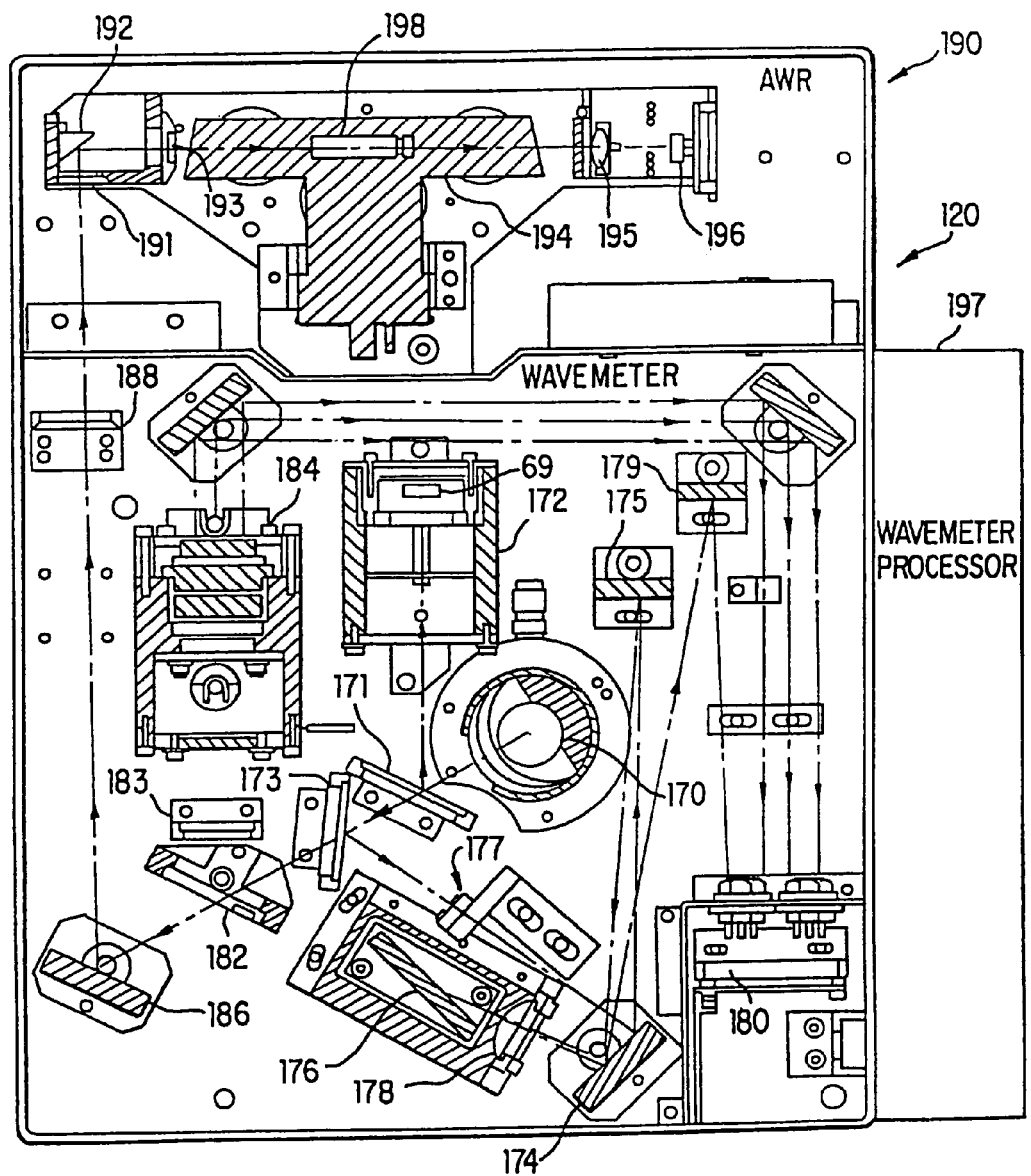
FIG. 14 shows elements of a wavemeter.

FIG. 14 shows the layouts of a preferred wavemeter unit 120, an absolute wavelength reference calibration unit 190, and a wavemeter processor 197.

The optical equipment in these units measure pulse energy, wavelength and bandwidth. These measurements are used with feedback circuits to maintain pulse energy and wavelength within desired limits. The equipment calibrates itself by reference to an atomic reference source on the command from the laser system control processor.

As shown in FIG. 14, the laser output beam intersects partially reflecting mirror 170, which passes about 95.5% of the beam energy as output beam 33 and reflects about 4.5% for pulse energy, wavelength and bandwidth measurement.

Pulse Energy

About 4% of the reflected beam is reflected by mirror 171 to energy detector 172 which comprises a very fast photo diode 69 which is able to measure the energy of individual pulses occurring at the rate of 4,000 pulses per second. The pulse energy is about 10 mJ, and the output of detector 69 is fed to a computer controller which uses a special algorithm to adjust the laser charging voltage to precisely control the pulse energy of future pulses based on stored pulse energy data in order to limit the variation of the energy of individual pulses and the integrated energy of bursts of pulses.

Linear Photo Diode Array

Figure 14A:
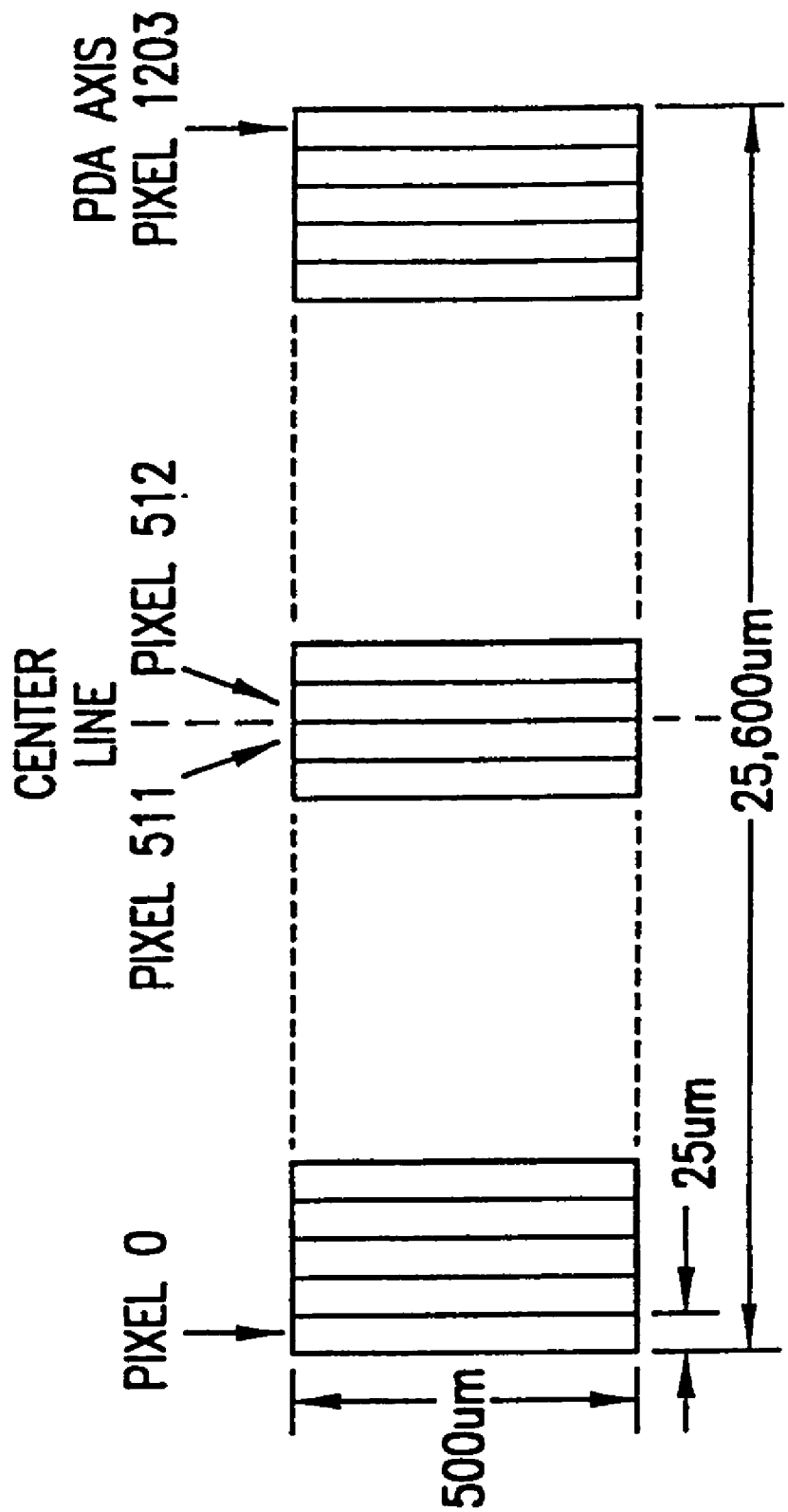
FIGS. 14A, 14B, 14C and 14D demonstrate a technique for measuring bandwidth.

The photo sensitive surface of linear photo diode array 180 is depicted in detail in FIG. 14A. The array is an integrated circuit chip comprising 1024 separate photo diode integrated circuits and an associated sample and hold readout circuit (not shown). The photo diodes are on a 25 micrometer pitch for a total length of 25.6 mm (about one inch). Each photo diode is 500 micrometer long.

Photo diode arrays such as this are available from several sources. A preferred supplier is Hamamatsu. In our preferred embodiment, we use a Model S3903-1024Q which can be read at the rate of up to $4 \times 10^6$ pixels/sec on a FIFO basis in which complete 1024 pixel scans can be read at rates of 4,000 Hz or greater. The PDA is designed for $2 \times 10^6$ pixel/sec operation but Applicants have found that it can be over-clocked to run much faster, i.e., up to $4 \times 10^6$ pixel/sec. For pulse rates greater than 4,000 Hz, Applicants can use the same PDA but only a fraction (such as 60%) of the pixels are normally read on each scan.

Coarse Wavelength Measurement

Figure 14B:
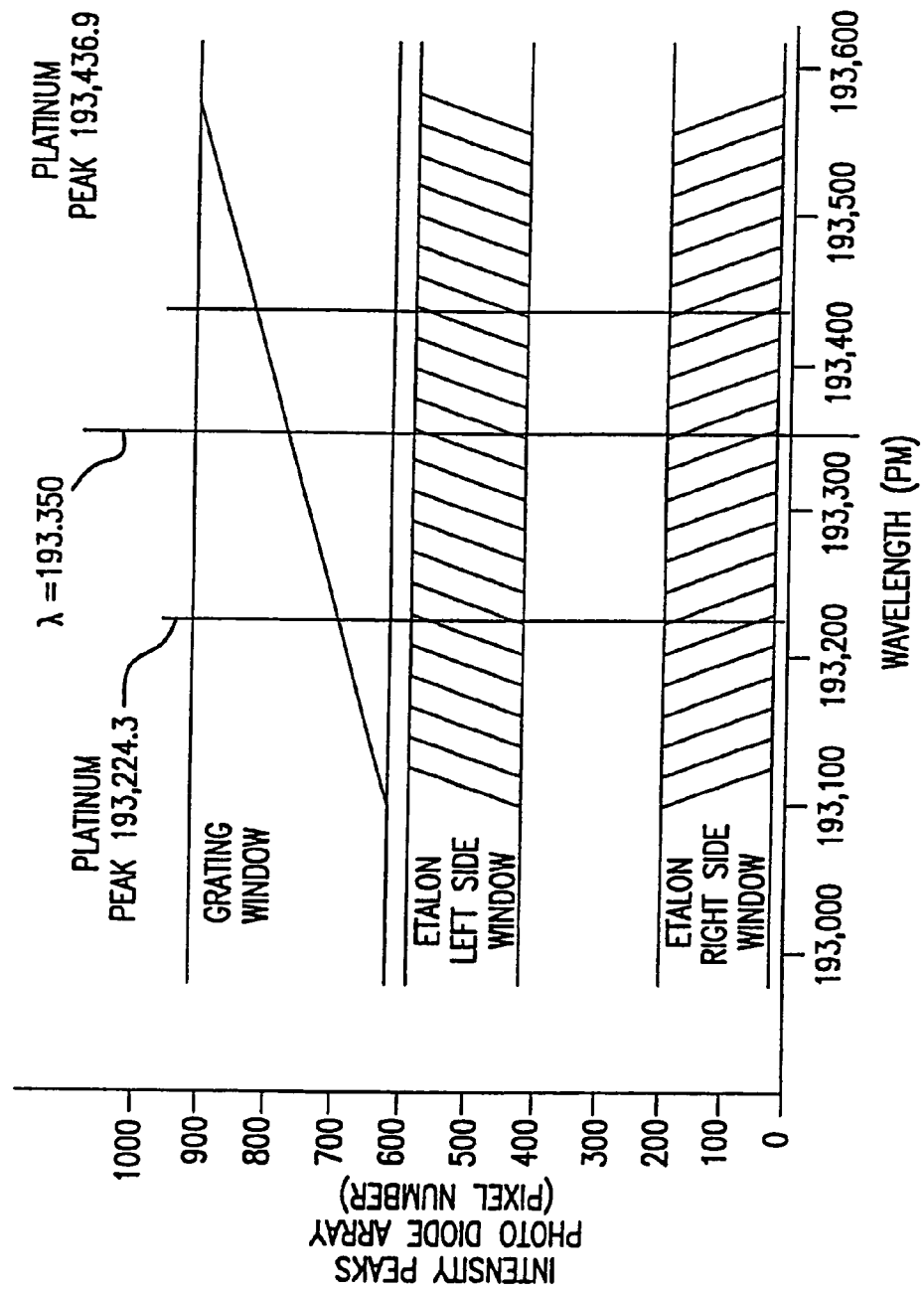

About 4% of the beam which passes through mirror 171 is reflected by mirror 173 through slit 177 to mirror 174, to mirror 175, back to mirror 174 and onto echelle grating 176. The beam is collimated by lens 178 having a focal length of 458.4 mm. Light reflected from grating 176 passes back through lens 178, is reflected again from mirrors 174, 175 and 174 again, and then is reflected from mirror 179 and focused onto the left side of 1024-pixel linear photo diode array 180 in the region of pixel 600 to pixel 950 as shown in the upper part of FIG. 14B (Pixels 0–599 are reserved for fine wavelength measurement and bandwidth.) The spatial position of the beam on the photo diode array is a coarse measure of the relative nominal wavelength of the output beam. For example, as shown in FIG. 14B, light in the wavelength range of about 193.350 pm would be focused on pixel 750 and its neighbors.

Calculation of Coarse Wavelength

Figure 14C:
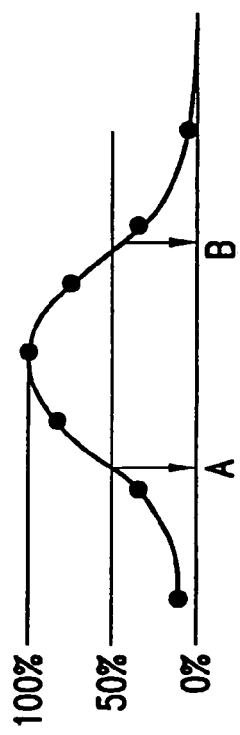

The coarse wavelength optics in wavemeter module 120 produces a rectangular image of about 0.25 mm×3 mm on the left side of photo diode array 180. The ten or eleven illuminated photo diodes will generate signals in proportion to the intensity of the illumination received (as indicated in FIG. 14C) and the signals are read and digitized by a processor in wavemeter controller 197. Using this information and an interpolation algorithm controller 197 calculates the center position of the image.

This position (measured in pixels) is converted into a coarse wavelength value using two calibration coefficients and assuming a linear relationship between position and wavelength. These calibration coefficients are determined by reference to an atomic wavelength reference source as described below. For example, the relationship between image position and wavelength might be the following algorithm:

$$8 = (2.3 \text{ pm/pixel})P + 191{,}625 \text{ pm}$$

where P=coarse image central positions.

Alternatively, additional precision could be added if desired by adding a second order term such as "+( ) $P^2$.

Fine Wavelength Measurement

About 95% of the beam which passes through mirror 173 as shown in FIG. 14 is reflected off mirror 182 through lens 183 onto a diffuser (preferably a diffraction diffuser as explained in a following section entitled "Improved Etalon") at the input to etalon assembly 184. The beam exiting etalon 184 is focused by a 458.4 mm focal length lens in the etalon assembly and produces interference fringes on the middle and right side of linear photo diode array 180 after being reflected off two mirrors as shown in FIG. 14.

The spectrometer must measure wavelength and bandwidth substantially in real time. Because the laser repetition rate may be 4,000 Hz to 6,000 Hz or higher, it is necessary to use algorithms which are accurate but not computationally intensive in order to achieve the desired performance with economical and compact processing electronics. Calculational algorithm therefore preferably should use integer as opposed to floating point math, and mathematical operations should preferably be computation efficient (no use of square root, sine, log, etc.).

Figure 14D:
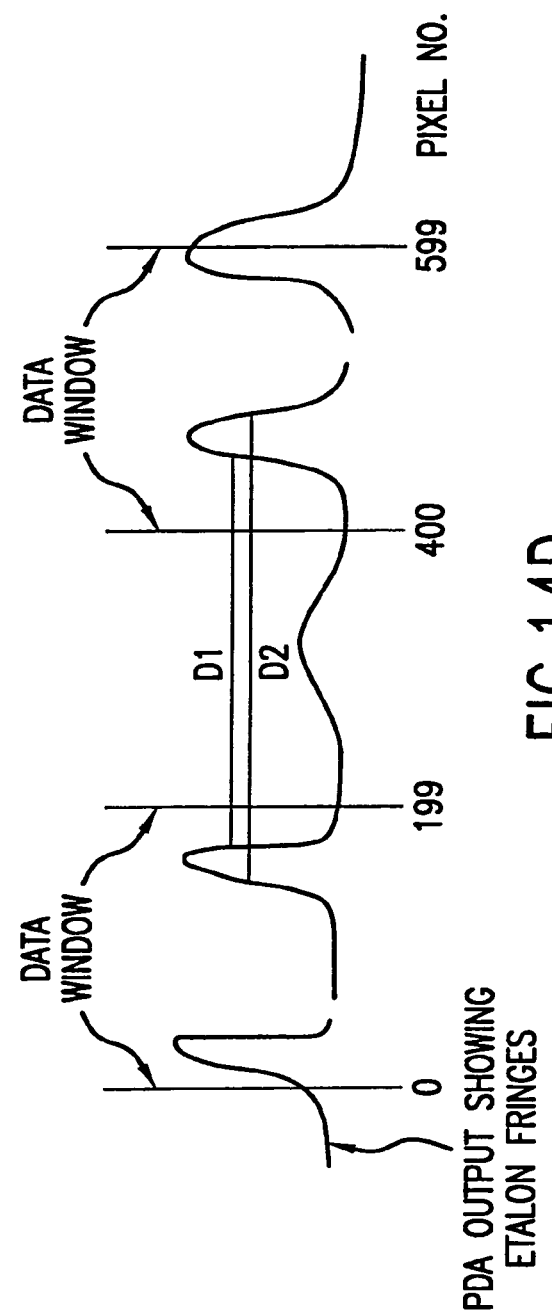

The specific details of a preferred algorithm used in this preferred embodiment will now be described. FIG. 14D is a curve with 5 peaks as shown which represents a typical etalon fringe signal as measured by linear photo diode array 180. The central peak is drawn lower in height than the others. As different wavelengths of light enter the etalon, the central peak will rise and fall, sometimes going to zero. This aspect renders the central peak unsuitable for the wavelength measurements. The other peaks will move toward or away from the central peak in response to changes in wavelength, so the position of these peaks can be used to determine the wavelength, while their width measures the bandwidth of the laser. Two regions, each labeled data window, are shown in FIG. 14D. The data windows are located so that the fringe nearest the central peak is normally used for the analysis. However, when the wavelength changes to move the fringe too close to the central peak (which will cause distortion and resulting errors), the first peak is outside the window, but the second closest peak will be inside the window, and the software causes the processor in control module 197 to use the second peak. Conversely, when the wavelength shifts to move the current peak outside the data window away from the central peak the software will jump to an inner fringe within the data window. The data windows are also depicted on FIG. 14B.

Figure 15:
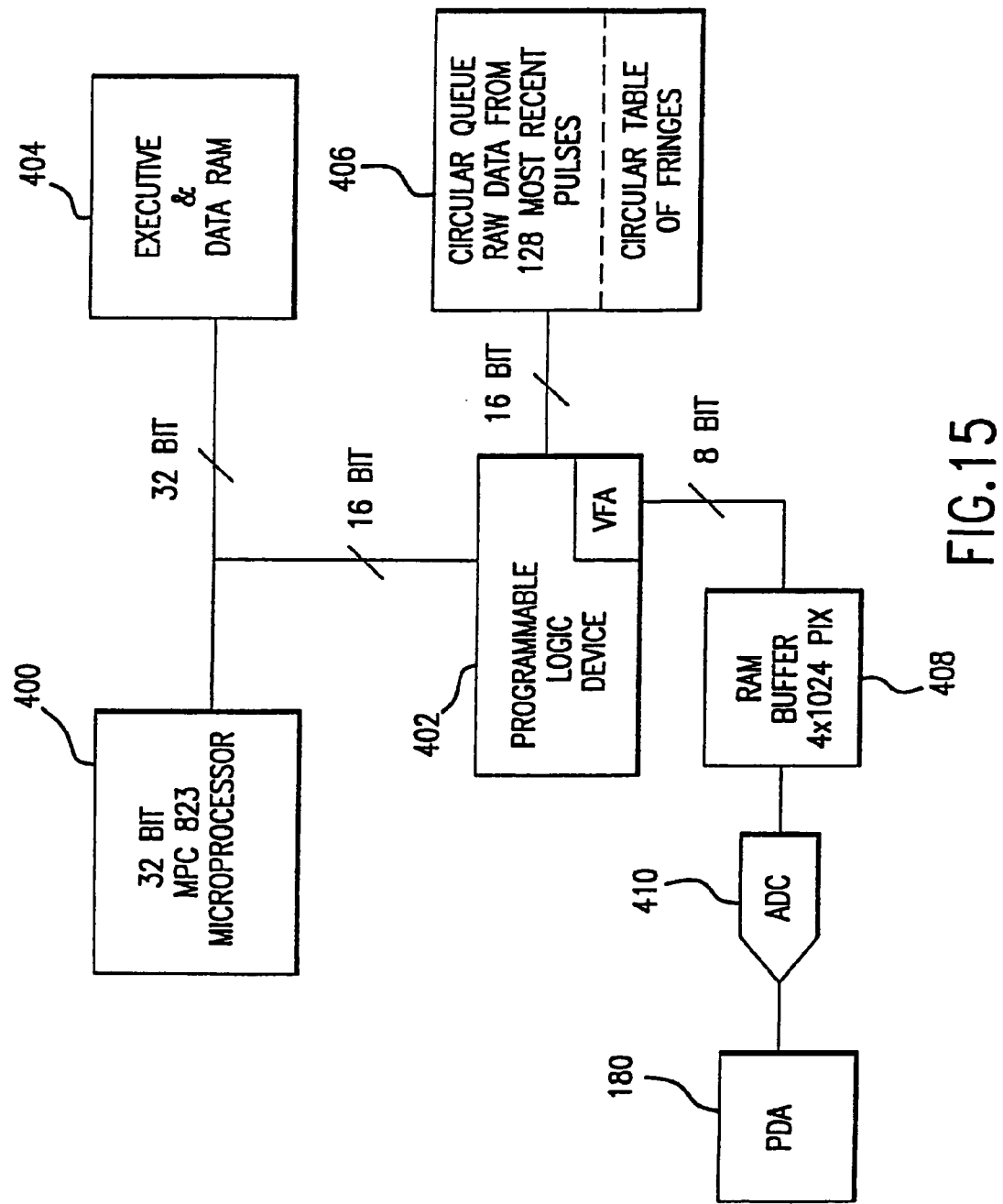
FIG. 15 shows a technique for fast reading of a photodiode array.

For very fast computation of bandwidth for each pulse at repetition rates up to the range of 4,000 Hz to 6,000 Hz or higher a preferred embodiment uses the hardware identified in FIG. 15. The hardware includes a microprocessor 400, Model MPC 823 supplied by Motorola with offices in Phoenix, Ariz.; a programmable logic device 402, Model EP 6016QC240 supplied by Altera with offices in San Jose, Calif.; an executive and data memory bank 404; a special very fast RAM 406 for temporary storage of photodiode array data in table form; a third 4×1024 pixel RAM memory bank 408 operating as a memory buffer; and an analog to digital converter 410.

As explained in U.S. Pat. No. 5,025,446 and U.S. Pat. No. 5,978,394, prior art devices were required to analyze a large mass of PDA data pixel intensity data representing interference fringes produced by etalon 184 an photodiode array 180 in order to determine center line wavelength and bandwidth. This was a relatively time consuming process even with a computer processor because about 400 pixel intensity values had to be analyzed to look for and describe the etalon fringes for each calculation of wavelength and bandwidth. A preferred embodiment of the present invention greatly speeds up this process by providing a processor for finding the important fringes which operates in parallel with the processor calculating the wavelength information.

The basic technique is to use programmable logic device 402 to continuously produce a fringe data table from the PDA pixel data as the pixel data are produced. Logic device 402 also identifies which of the sets of fringe data represent fringe data of interest. Then when a calculation of center wavelength and bandwidth are needed, microprocessor merely picks up the data from the identified pixels of interest and calculates the needed values of center wavelength and bandwidth. This process reduces the calculation time for microprocessor by about a factor of 10.

Specific steps in a preferred process of calculating center wavelength and bandwidth are as follows:

1) With PDA 180 clocked to operate at 2.5 MHz, PDA 180 is directed by processor 400 to collect data from pixels 1 to 600 at a scan rate of 4,000 Hz and to read pixels 1 to 1028 at a rate of 100 Hz.

2) The analog pixel intensity data produced by PDA 180 is converted from analog intensity values into digital 8 bit values (0 to 255) by analog to digital converter 410 and the digital data are stored temporarily in RAM buffer 408 as 8 bit values representing intensity at each pixel of photodiode array 180.

3) Programmable logic device 402 analyzes the data passing out of RAM buffer 408 continuously on an almost real time basis looking for fringes, stores all the data in RAM memory 406, identifies all fringes for each pulse, produces a table of fringes for each pulse and stores the tables in RAM 406, and identifies for further analysis one best set of two fringes for each pulse. The technique used by logic device 402 is as follows:

A) PLD 402 analyzes each pixel value coming through buffer 408 to determine if it exceeds an intensity threshold while keeping track of the minimum pixel intensity value. If the threshold is exceeded this is an indication that a fringe peak is coming. The PLD identifies the first pixel above threshold as the "rising edge" pixel number and saves the minimum pixel value of the pixels preceding the "rising edge" pixel. The intensity value of this pixel is identified as the "minimum" of the fringe.

B) PLD 402 then monitors subsequent pixel intensity values to search for the peak of the fringe. It does this by keeping track of the highest intensity value until the intensity drops below the threshold intensity.

C) When a pixel having a value below threshold is found, the PLD identifies it as the falling edge pixel number and saves the maximum value. The PLD then calculates the "width" of the fringe by subtracting the rising edge pixel number from the falling edge pixel number.

D) The four values of rising edge pixel number, maximum fringe intensity, minimum fringe intensity and width of the fringe are stored in the circular table of fringes section of RAM memory bank 406. Data representing up to 15 fringes can be stored for each pulse although most pulses only produce 2 to 5 fringes in the two windows.

E) PLD 402 also is programmed to identify with respect to each pulse the "best" two fringes for each pulse. It does this by identifying the last fringe completely within the 0 to 199 window and the first fringe completely within the 400 to 599 window.

The total time required after a pulse for (1) the collection of the pixel data, and (2) the formation of the circular table of fringes for the pulse is only about 200 micro seconds. The principal time saving advantages of this technique is that the search for fringes is occurring as the fringe data is being read out, digitized and stored. Once the two best fringes are identified for a particular pulse, microprocessor 400 secures the raw pixel data in the region of the two fringes from RAM memory bank 406 and calculates from that data the bandwidth and center wavelength. The calculation is as follows:

Typical shape of the etalon fringes are shown in FIG. 14D. Based on the prior work of PLD 402 the fringe having a maximum at about pixel 180 and the fringe having a maximum at about pixel 450 will be identified to microprocessor 400. The pixel data surrounding these two maxima are analyzed by microprocessor 400 to define the shape and location of the fringe. This is done as follows:

A) A half maximum value is determined by subtracting the fringe minimum from the fringe maximum dividing the difference by 2 and adding the result to the fringe minimum. For each rising edge and each falling edge of the two fringes the two pixels having values of closest above and closest below the half maximum value are calculated. Microprocessor then extrapolates between the two pixel values in each case to define the end points of D1 and D2 as shown in FIG. 18B with a precision of 1/32 pixel. From these values the inner diameter D1 and the outer diameter D2 of the circular fringe are determined.

Fine Wavelength Calculation

The fine wavelength calculation is made using the course wavelength measured value and the measured values of D1 and D2.

The basic equation for wavelength is:

$$\lambda = (2*n*d/m)\cos(R/f) \quad (1)$$

where $\lambda$ is the wavelength, in picometers, n is the internal index of refraction of the etalon, about 1.0003, d is the etalon spacing, about 1542 um for KrF lasers and about 934 :m for ArF lasers, controlled to +/−1 um, m is the order, the integral number of wavelengths at the fringe peak, about 12440 for KrF and 9,664 for ArF, R is the fringe radius, 130 to 280 PDA pixels, a pixel being 25 microns, f is the focal distance from the lens to the PDA plane.

Expanding the cos term and discarding high order terms that are negligibly small yields:

$$\lambda = (2*n*d/m)[1 - (\tfrac{1}{2})(R/f)^2] \quad (2)$$

Restating the equation in terms of diameter D=2*R yields:

$$\lambda = (2*n*d/m)[1 - (\tfrac{1}{8})(D/f)^2] \quad (3)$$

The wavemeter's principal task is to calculate $\lambda$ from D. This requires knowing f, n, d and m. Since n and d are both intrinsic to the etalon we combine them into a single calibration constant named ND. We consider f to be another calibration constant named FD with units of pixels to match the units of D for a pure ratio. The integer order m varies depending on the wavelength and which fringe pair we choose. m is determined using the coarse fringe wavelength, which is sufficiently accurate for the purpose.

A couple of nice things about these equations is that all the big numbers are positive values. The WCM's microcontroller is capable of calculating this while maintaining nearly 32 bits of precision. We refer to the bracketed terms as FRAC.

$$FRAC = [1 - (\tfrac{1}{8})(D/FD)^2] \quad (4)$$

Internally FRAC is represented as an unsigned 32 bit value with its radix point to the left of the most significant bit. FRAC is always just slightly less than one, so we get maximal precision there. FRAC ranges from [1-120E-6] to [1-25E-6] for D range of {560–260} pixels.

When the ND calibration is entered, the wavemeter calculates an internal unsigned 64 bit value named 2ND=2*ND with internal wavelength units of femtometers (fm)=10^−15 meter=0.001 pm. Internally we represent the wavelength $\lambda$ as FWL for the fine wavelength, also in fm units. Restating the equation in terms of these variables:

$$FWL = FRAC*2ND/m \quad (5)$$

The arithmetic handles the radix point shift in FRAC yielding FWL in fm. We solve for m by shuffling the equation and plugging in the known coarse wavelength named CWL, also in fm units:

$$m = \text{nearest integer } (FRAC*2ND/CWL) \quad (6)$$

Taking the nearest integer is equivalent to adding or subtracting FSRs in the old scheme until the nearest fine wavelength to the coarse wavelength was reached. Calculate wavelength by solving equation (4) then equation (6) then equation (5). We calculate WL separately for the inner and outer diameters. The average is the line center wavelength, the difference is the linewidth.

Bandwidth Calculation

The bandwidth of the laser is computed as $(8_2-8_1)/2$. A fixed correction factor is applied to account for the intrinsic width of the etalon peak adding to the true laser bandwidth. Mathematically, a deconvolution algorithm is the formalism for removing the etalon intrinsic width from the measured width, but this would be far too computation-intensive, so a fixed correction $)8$, is subtracted, which provides sufficient accuracy. Therefore, the bandwidth is:

$$)\lambda = \left(\frac{D_2 - D_1}{2}\right) - )8,$$

$)8$, depends on both the etalon specifications and the true laser bandwidth. It typically lies in the range of 0.1–1 pm for the application described here.

Improved Etalon

This embodiment utilizes an improved etalon. Conventional etalon mounting schemes typically employ an elastomer to mount the optical elements to the surrounding structure, to constrain the position of the elements but minimize forces applied to the elements. A compound commonly used for this is room-temperature vulcanizing silicone (RTV). However, various organic vapors emitted from these elastomers can deposit onto the optical surfaces, degrading their performance. In order to prolong etalon performance lifetime, it is desirable to mount the etalon in a sealed enclosure that does not contain any elastomer compounds.

Figure 14E:
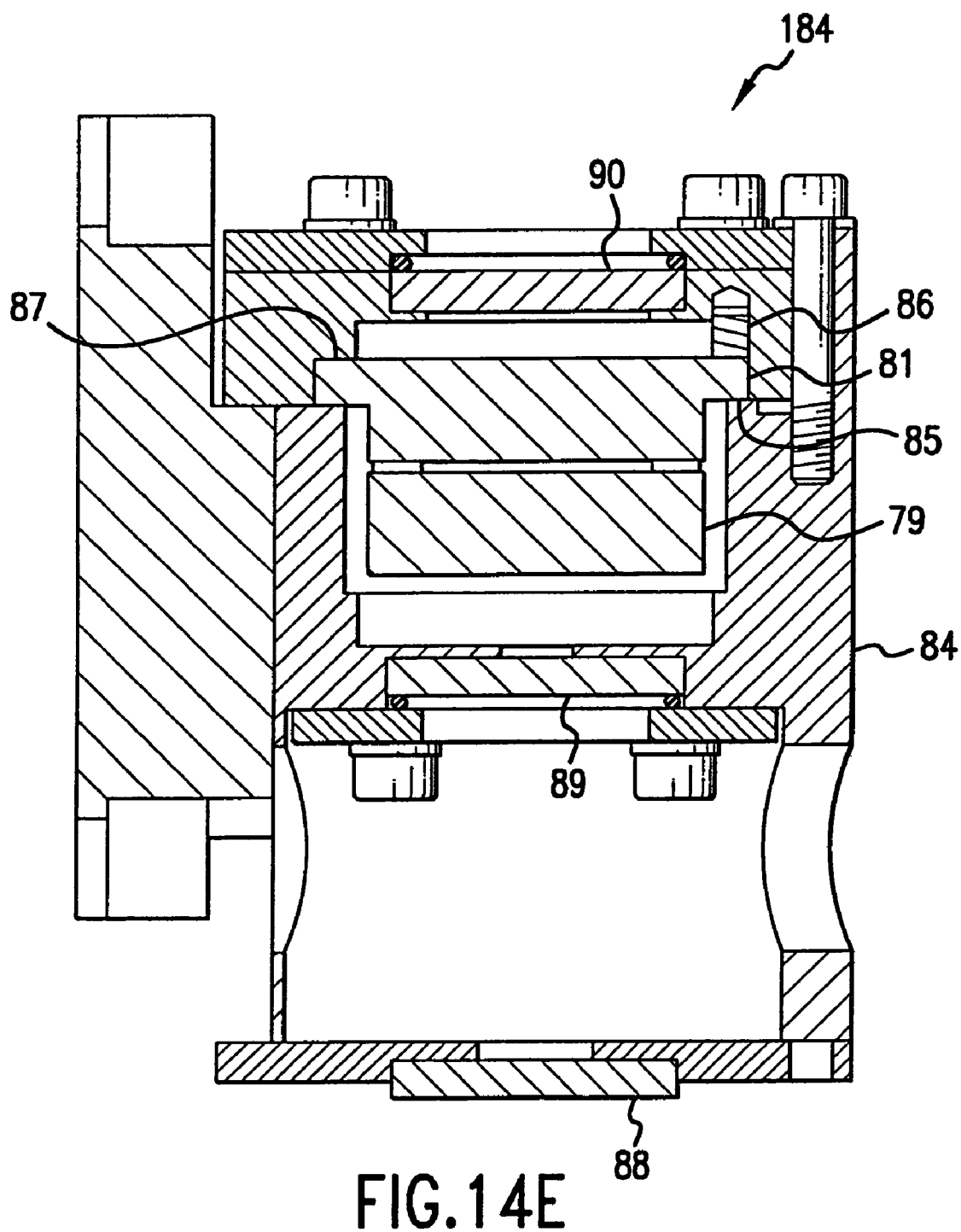
FIGS. 14E–H show features of etalons used for bandwidth measurement.
Figure 14F:
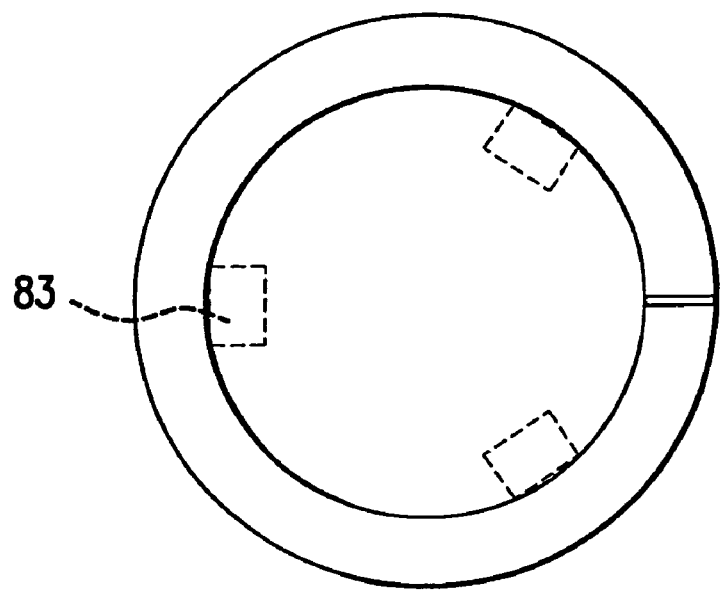
Figure 14G:
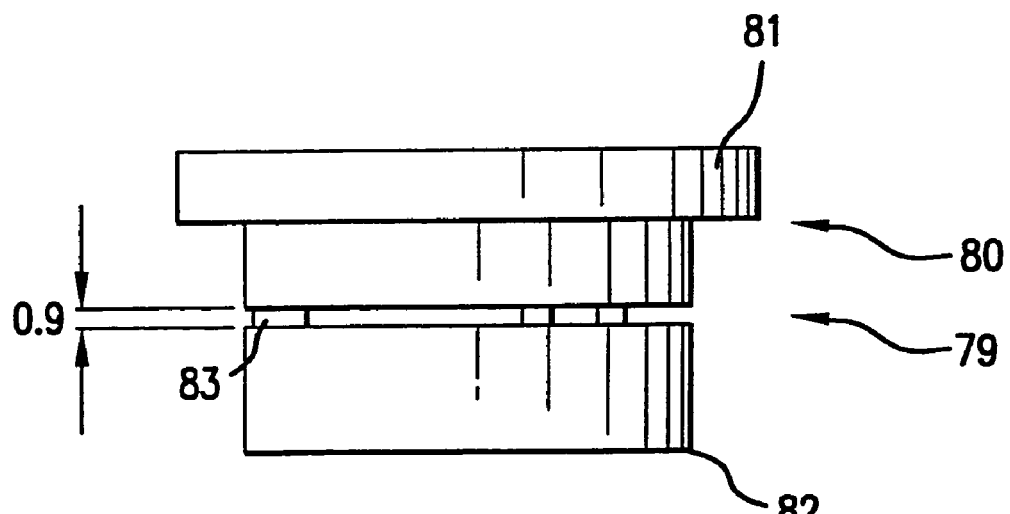

A preferred embodiment includes an improved etalon assembly shown at 184 in FIGS. 14 and 14E. The fused silica etalon 79 shown in FIG. 14G itself is comprised of a top plate 80 having a flange 81 and a lower plate 82, both plates being comprised of premium grade fused silica. The etalon is designed to produce fringes having free spectral range of 20.00 pm at 193.35 nm when surrounded by gas with an index of refraction of 1.0003 and a finesse equal to or greater than 25. Three fused silica spacers 83 with ultra low thermal expansion separate the plates and are 934 micrometer ∀ 1 micrometer thick. These hold the etalon together by optical contact, a technique well known in the optics manufacturing art. The reflectance of the inside surfaces of the etalon are each about 92 percent and the outside surfaces are anti-reflection coated. The transmission of the etalon is about 50 percent.

The etalon 79 is held in place in aluminum housing 84 only by gravity and three low force springs 86 pressing the flange against three pads not shown but positioned on 120 degree centers under the bottom edge of flange 81 at the radial location indicated by leader 85. A clearance of only 0.004 inch along the top edge of flange 81 at 87 assures that the etalon will remain approximately in its proper position. This close tolerance fit also ensures that if any shock or impulse is transferred to the etalon system through the mounting, the relative velocities between the optical components and the housing contact points will be kept to a minimum. Other optical components of etalon assembly 184 include diffuser 88, window 89 and focusing lens 90 having a focal length of 458.4 mm.

The diffuser 88 may be a standard prior art diffuser commonly used up-stream of an etalon to produce a great variety of incident angles needed for the proper operation of the etalon. A problem with prior art diffusers is that about 90 percent of the light passing through the diffuser is not at a useful angle and consequently is not focused on the photo diode array. This wasted light, however, adds to the heating of the optical system and can contribute to degradation of optical surfaces. In a much preferred embodiment, a diffractive lens array is used as the diffuser 88. With this type of diffuser, a pattern is produced in the diffractive lens array which scatters the light thoroughly but only within an angle of about 5 degrees. The result is that about 90 percent of the light falling on the etalon is incident at useful angles and a much greater portion of the light incident on the etalon is ultimately detected by the photo diode array. The result is the light incident on the etalon can be greatly reduced which greatly increases optical component life. Applicants estimate that the incident light can be reduced to less than 5% or 10% of prior art values with equivalent light on the photo diode array.

Better Collimation With Diffractive Diffuser

Figure 14H:
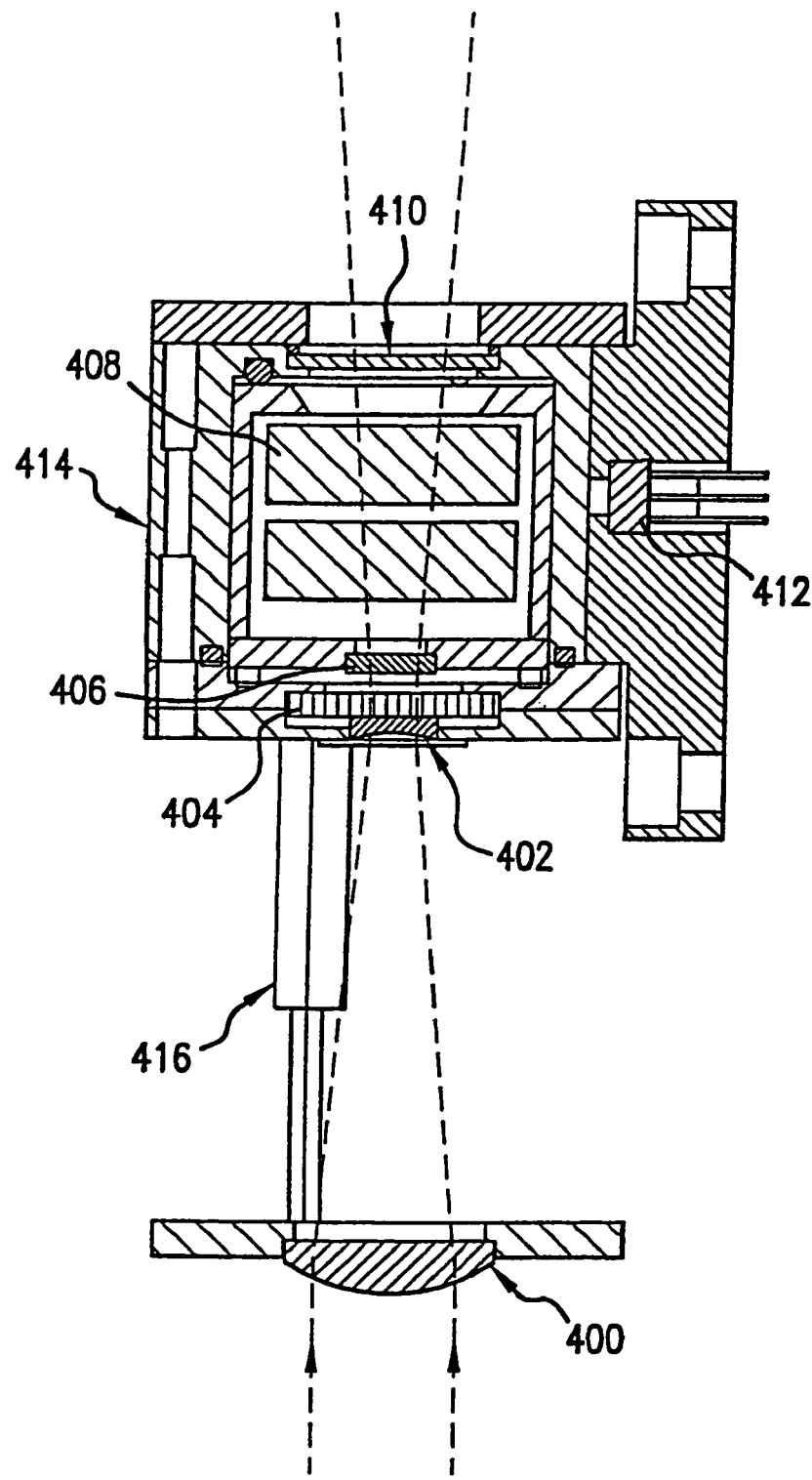

FIG. 14H shows features of a preferred embodiment providing even further reduction of light intensity passing through the etalon. This embodiment is similar to the embodiment discussed above. The sample beam from mirror 182 (approximately 15 mm×3 mm) passes upward through condensing lens 400 and is then re-collimated by lens 402. The beam now colliminated and reduced in dimension to about 5 mm×1 mm passes through etalon housing window 404 and then passes through a diffractive diffusing element 406 which in this case (for an ArF laser) is a diffractive diffusing element provided by Mems Optical, Inc. with offices in Huntsville, Ala. The element is part number D023-193 which converts substantially all 193 nm light in any incoming collimated beam of any cross sectional configuration into a beam expanding in a first direction at 2E and in a second direction perpendicular to the first direction at 4E. Lens 410 then Afocuses≈ the expanding beam onto a rectangular pattern covering photodiode array 180 shown in FIG. 14. The active area of the photo diode array is about 0.5 mm wide and 25.6 mm long and the spot pattern formed by lens 410 is about 15 mm×30 mm. Diffractive diffusing element thoroughly mixes the spatial components of the beam but maintains substantially all of the beam energy within the 2E and 4E limits so that the light passing through the etalon can be substantially reduced and efficiently utilized. The reader should recognize that further reductions in beam energy passing through the etalon could be realized by reducing the spot pattern in the short dimension of the photo diode array. However, further reductions to less than 15 mm will make optical alignment more difficult. Therefore, the designer should consider the spot pattern size to be a trade-off issue.

In another system designed for a KrF laser operating at about 248.327 nm a similar design is provided with adjustments for wavelength. In this embodiment lens 400 has a focal length of about 50 mm. (The lens is Melles Griot Corporation part number OILQP001.) Collimating lens 402 has a focal length of −20 mm (EVI Laser Corporation part number PLCC-10.0-10.3-UV). The diffractive diffusing element 406 is Mems Optical Corporation part number D023-248. In this embodiment and in the ArF embodiment, the spacing between the two lenses can be properly positioned with spacer 416. Applicants estimate that the energy of the beam passing through the etalon with the laser operating in this design range is not sufficient to cause significant thermal problems in the etalon.

In other preferred embodiments, the beam could be allowed to come to a focus between lenses 400 and 402. Appropriate lenses would in this case be chosen using well known optical techniques.

Feedback Control of Pulse Energy and Wavelength

Based on the measurement of pulse energy of each pulse as described above, the pulse energy of subsequent pulses are controlled to maintain desired pulse energies and also desired total integrated dose of a specified number of pulses all as described in U.S. Pat. No. 6,005,879, Pulse Energy Control for Excimer Laser which is incorporated by reference herein.

Wavelength of the laser may be controlled in a feedback arrangement using measured values of wavelengths and techniques known in the prior art such as those techniques described in U.S. Pat. No. 5,978,394, Wavelength System for an Excimer Laser also incorporated herein by reference. Applicants have recently developed techniques for wavelength tuning which utilize a piezoelectric driver to provide extremely fast movement of tuning mirror. Some of these techniques are described in U.S. patent application Ser. No. 09/608,543, Bandwidth Control Technique for a Laser, filed Jun. 30, 2000 which is incorporated herein by reference. The following section provides a brief description of these techniques. The piezoelectric stack adjusts the position of the fulcrum of the lever arm.

New LNP with Combination PZT-Stepper Motor Driven Tuning Mirror

Detail Design with Piezoelectric Drive

Figure 16:
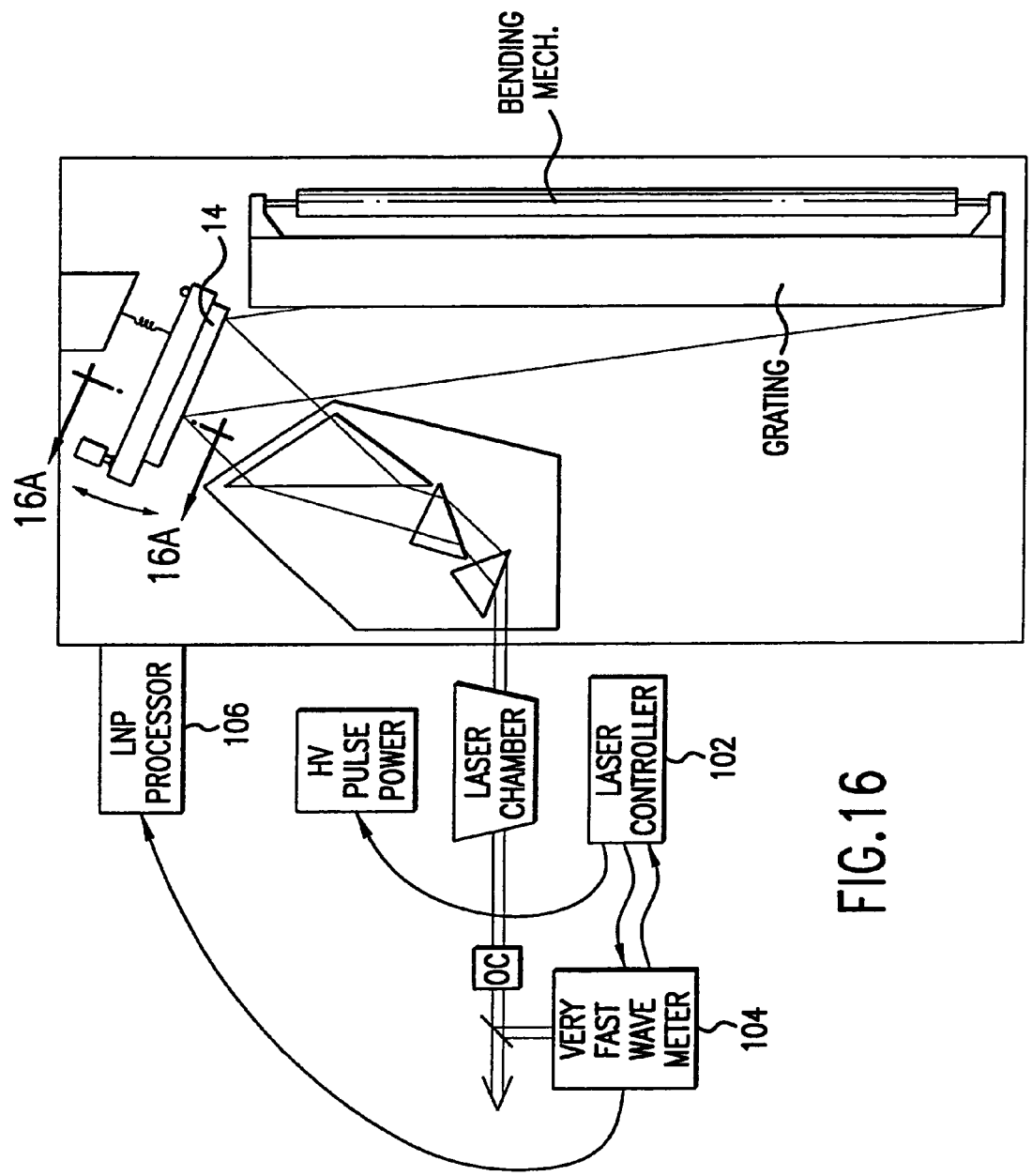
FIG. 16 shows a technique for fine line narrowing of a master oscillator.
Figure 16A:
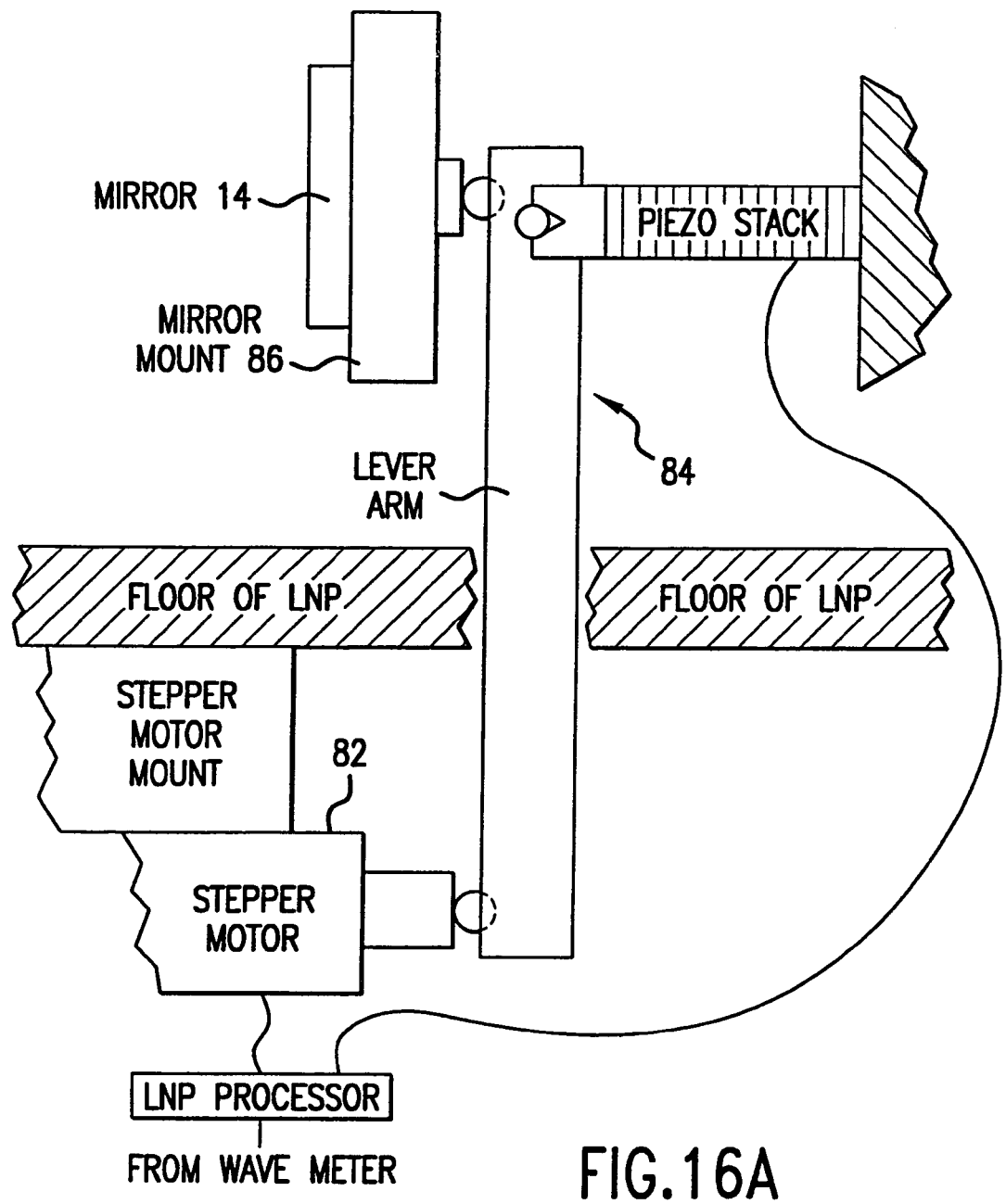
FIGS. 16A and 16B show a PZT controlled LNP.

FIG. 16 is a block diagram showing features of the laser system which are important for controlling the wavelength and pulse energy of the output laser beam.

Line narrowing is done by a line narrowing module 110, which contains a four prism beam expander (112a–112d), a tuning mirror 114, and a grating 10C3. In order to achieve a very narrow spectrum, very high beam expansion is used in this line narrowing module. This beam expansion is 45× as compared to 20×–25× typically used in prior art microlithography excimer lasers. In addition, the horizontal size of front (116*a*) and back (116B) apertures are made also smaller, i.e., 1.6 and 1.1 mm as compared to about 3 mm and 2 mm in the prior art. The height of the beam is limited to 7 mm. All these measures allow to reduce the bandwidth from about 0.5 pm (FWHM) to about 02 pm (FWHM). The laser output pulse energy is also reduced, from 5 mJ to about 1 mJ. This, however, does not present a problem, because this light will be amplified in the amplifier to get the 10 mJ desired output. The reflectivity of the output coupler 118 is 30%, which is close to that of prior art lasers.

Figure 16B:
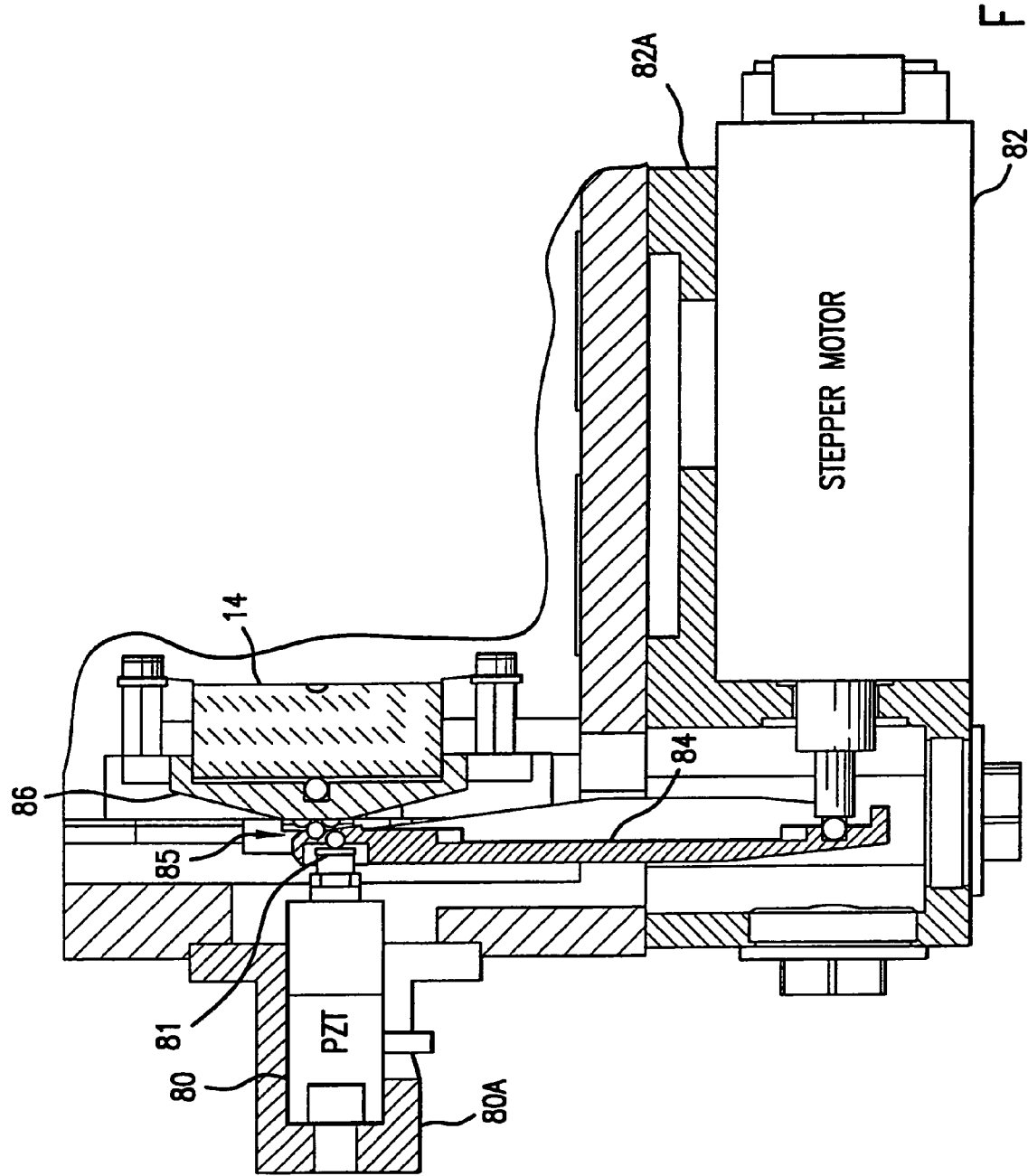
Figure 16C:
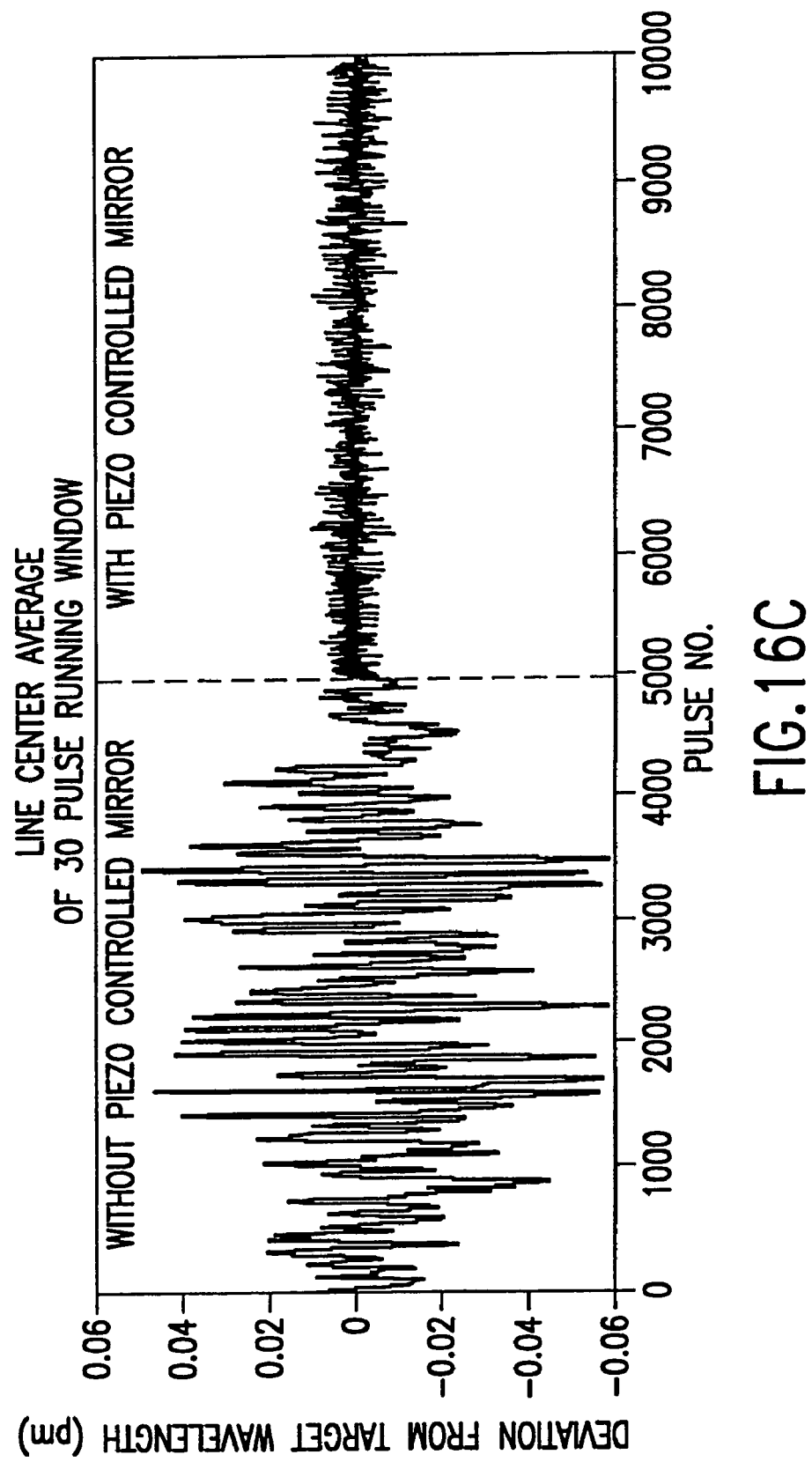
FIG. 16C shows the result of the use of the PZT controlled LNP.
Figure 16D:
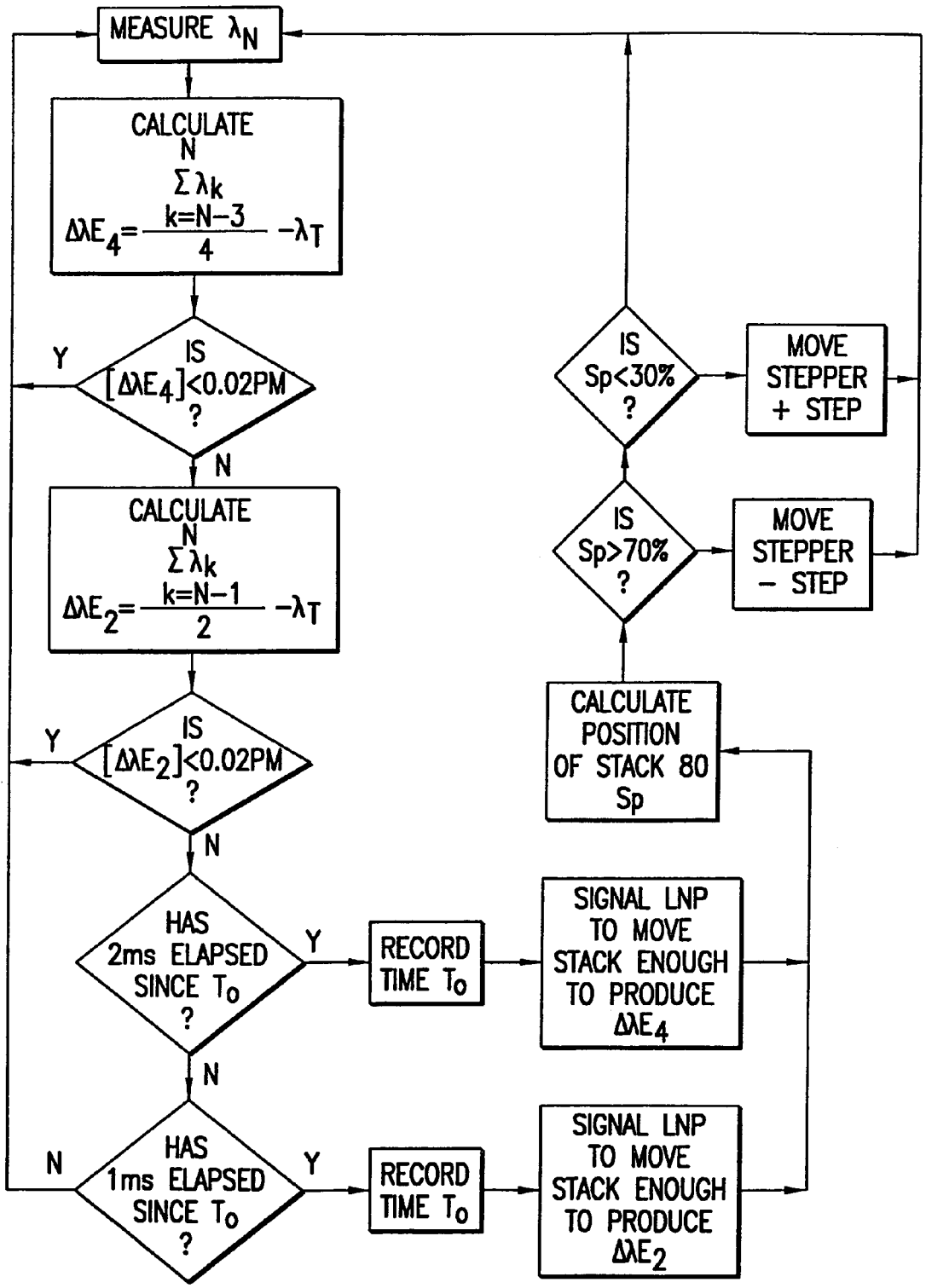
FIGS. 16D and 16E show techniques for controlling the LNP.

FIG. 16B is a drawing showing detail features of a preferred embodiment of the present invention. Large changes in the position of mirror 14 are produced by stepper motor through a 26.5 to 1 lever arm 84. In this case a diamond pad 81 at the end of piezoelectric drive 80 is provided to contact spherical tooling ball at the fulcrum of lever arm 84. The contact between the top of lever arm 84 and mirror mount 86 is provided with a cylindrical dowel pin on the lever arm and four spherical ball bearings mounted (only two of which are shown) on the mirror mount as shown at 85. Piezoelectric drive 80 is mounted on the LNP frame with piezoelectric mount 80A and the stepper motor is mounted to the frame with stepper motor mount 82A. Mirror 14 is mounted in mirror mount 86 with a three point mount using three aluminum spheres, only one of which are shown in FIG. 16B1. Three springs 14A apply the compressive force to hold the mirror against the spheres. This embodiment includes a bellows 87 (which functions as a can) to isolate the piezoelectric drive from the environment inside the LNP. This isolation prevents UV damage to the piezoelectric element and avoid possible contamination caused by out-gassing from the piezoelectric materials.

Pretuning and Active Tuning

The embodiments described above can be used for purposes other than chirp corrections. In some cases the operator of a integrated circuit lithography machine may desire to change wavelength on a predetermined basis. In other words the target center wavelength $8_T$ may not be a fixed wavelength but could be changed as often as desired either following a predetermined pattern or as the result of a continuously or periodically updating learning algorithm using early historical wavelength data or other parameters.

Adaptive Feedforward

Preferred embodiments of the present invention includes feedforward algorithms. These algorithms can be coded by the laser operator based on known burst operation patterns. Alternatively, this algorithm can be adaptive so that the laser control detects burst patterns such as those shown in the above charts and then revises the control parameters to provide adjustment of mirror 14 in anticipation of wavelength shifts in order to prevent or minimize the shifts. The adaptive feedforward technique involves building a model of the chirp at a given rep rate in software, from data from one or more previous bursts and using the PZT stack to invert the effect of the chirp.

Figure 16E:
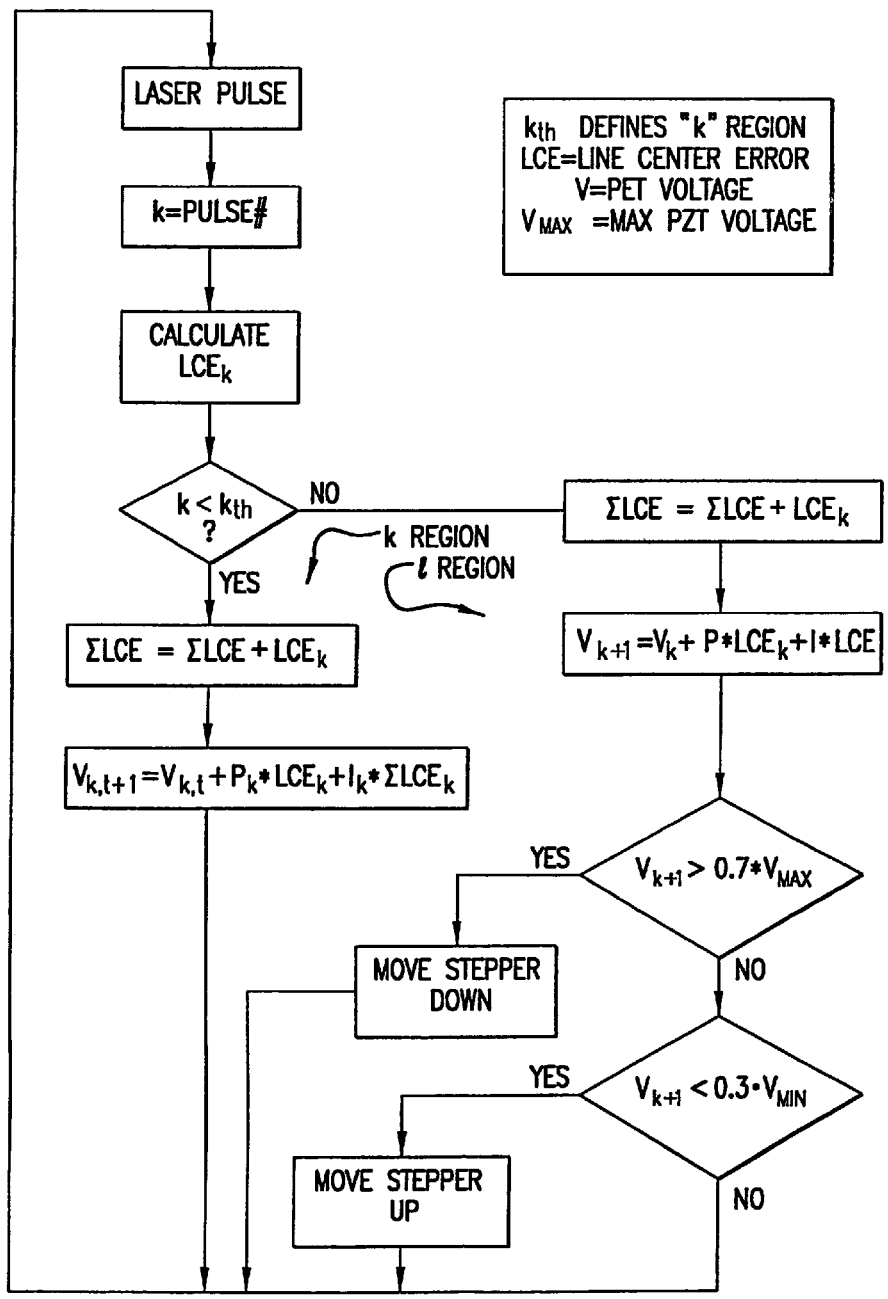

To properly design the chirp inversion, two pieces of information are needed: (1) the pulse response of the PZT stack, and (2) the shape of the chirp. For each repetition rate, deconvolution of the chirp waveform by the pulse response of the PZT stack will yield a sequence of pulses, which, when applied to the PZT stack (with appropriate sign), will cancel the chirp. This computation can be done off line through a survey of behavior at a set of repetition rates. The data sequences could be saved to tables indexed by pulse number and repetition rate. This table could be referred to during operation to pick the appropriate waveform data to be used in adaptive feedforward inversion. It is also possible, and in fact may be preferable, to obtain the chirp shape model in almost real-time using a few bursts of data at the start of operation each time the repetition rate is changed. The chirp shape model, and possibly the PZT pulse response model as well, could then be updated (e.g. adapted) every N-bursts based on accumulated measured error between model and data. A preferred algorithm is described in FIG. 16E. The chirp at the beginning of bursts of pulses can be controlled using the algorithm described in FIG. 16E. The letter k refers to the pulse number in a burst. The burst is separated into two regions, a k region and an I region. The k region is for pulse numbers less than $k_{th}$ (defining a time period long enough to encompass the chirp). Separate proportional constant $P_k$, integral constant $I_k$ and integral sum of the line center error $\Gamma LCE_k$ are used for each pulse number. The PZT voltage for the corresponding pulse number in the k region in the next burst is determined by these constants and sums. After the kth pulse, a traditional proportional integral routine controls the PZT voltage. The voltage for next pulse in the burst will be the current voltage plus P*LCE+I*$\Gamma$LCE. A flow diagram explaining the major steps in this algorithm is provided in FIG. 16E.

Vibration Control

In preferred embodiments active vibration control can be applied to reduce adverse impacts resulting from chamber generated vibrations. One such technique utilizes a piezoelectric load cell to monitor LNP vibrations to provide a feedback signal used to provide additional control functions to the $R_{max}$ mirror. This technique is described in U.S. patent application Ser. No. 09/794,782 incorporated by reference herein.

Other Bandwidth Measuring Techniques

The bandwidth of the laser beam from preferred embodiments of the present invention are substantially reduced compared to prior art lithography lasers. Therefore, it may be desirable to provide metrology systems for providing even greater accuracy in bandwidth measurement than is provided by the above described systems. One such method is described in U.S. patent application Ser. No. 10/003,513 filed Oct. 31, 2001 entitled "High Resolution Etalon Grating Spectrometer, which is incorporated by reference herein. Other high accuracy methods for measuring bandwidth, both full width half maximum and the 95% integral bandwidth can be incorporated either as a laser component or provided as test equipment.

Laser Chambers

Heat Exchangers

Preferred embodiments are designed to operate at pulse repetition rates of 4,000 pulses per second. Clearing the discharge region of discharge affected gas between pulses requires a gas flow between the electrodes 18A and 20A of up to about 67 m/s. To achieve these speeds, the diameter of tangential fan unit has been set at 5 inches (the length of the blade structure is 26 inches) and the rotational speed has been increased to about 3500 rpm. To achieve this performance the embodiment utilizes two motors which together deliver up to about 4 kw of drive power to the fan blade structure. At a pulse rate of 4000 Hz, the discharge will add about 12 kw of heat energy to the laser gas. To remove the heat produced by the discharge along with the heat added by the fan four separate water cooled finned heat exchanger units 58A are provided. The motors and the heat exchangers are described in detail below.

A preferred embodiment of the present invention utilizes four finned water cooled heat exchangers 58A shown generally in FIG. 4. Each of these heat exchangers is somewhat similar to the single heat exchangers shown at 58 in FIG. 1 having however substantial improvements.

Heat Exchanger Components

Figure 21:
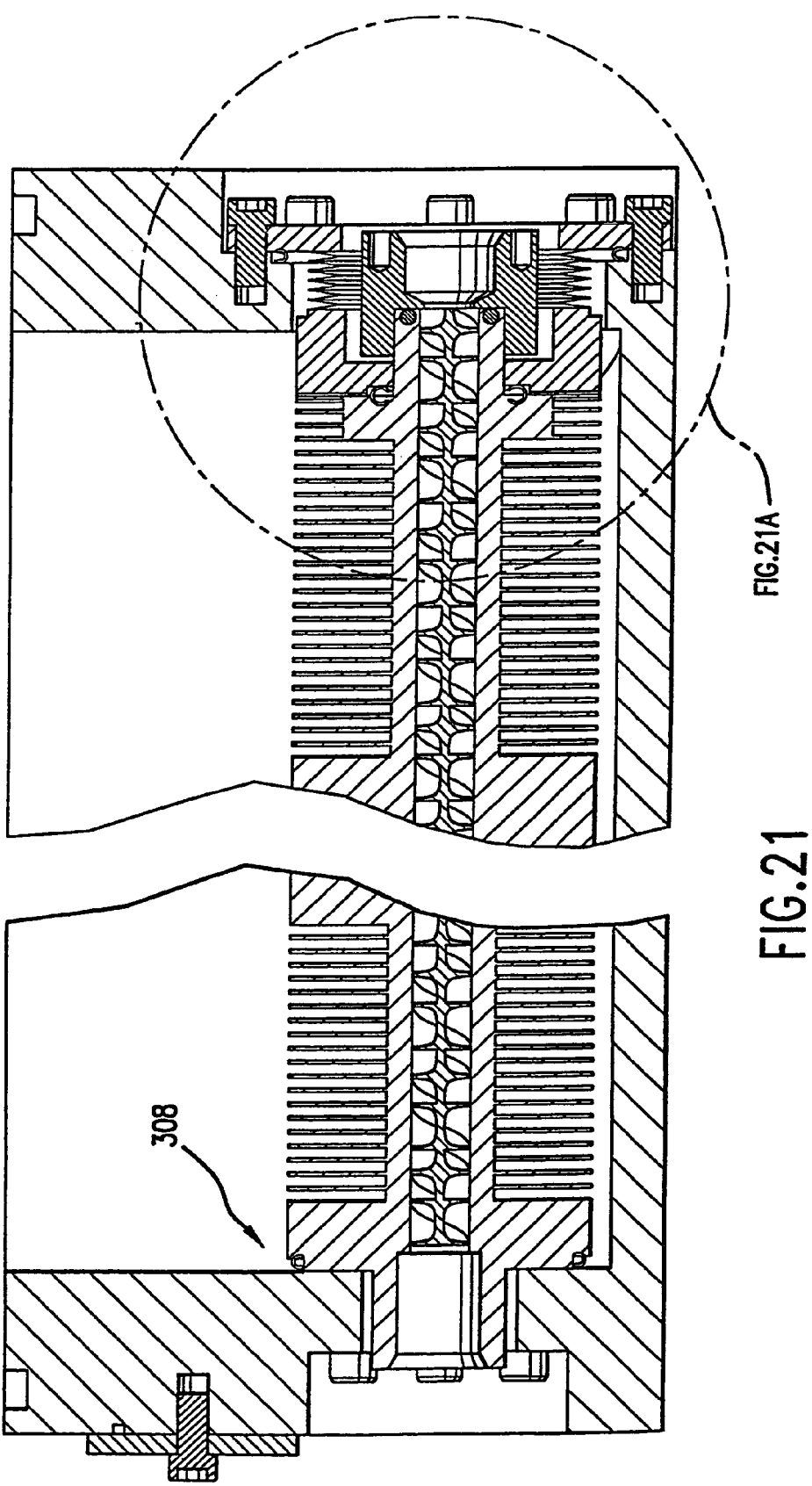
FIGS. 21 and 21A show heat exchanger features.
Figure 21A:
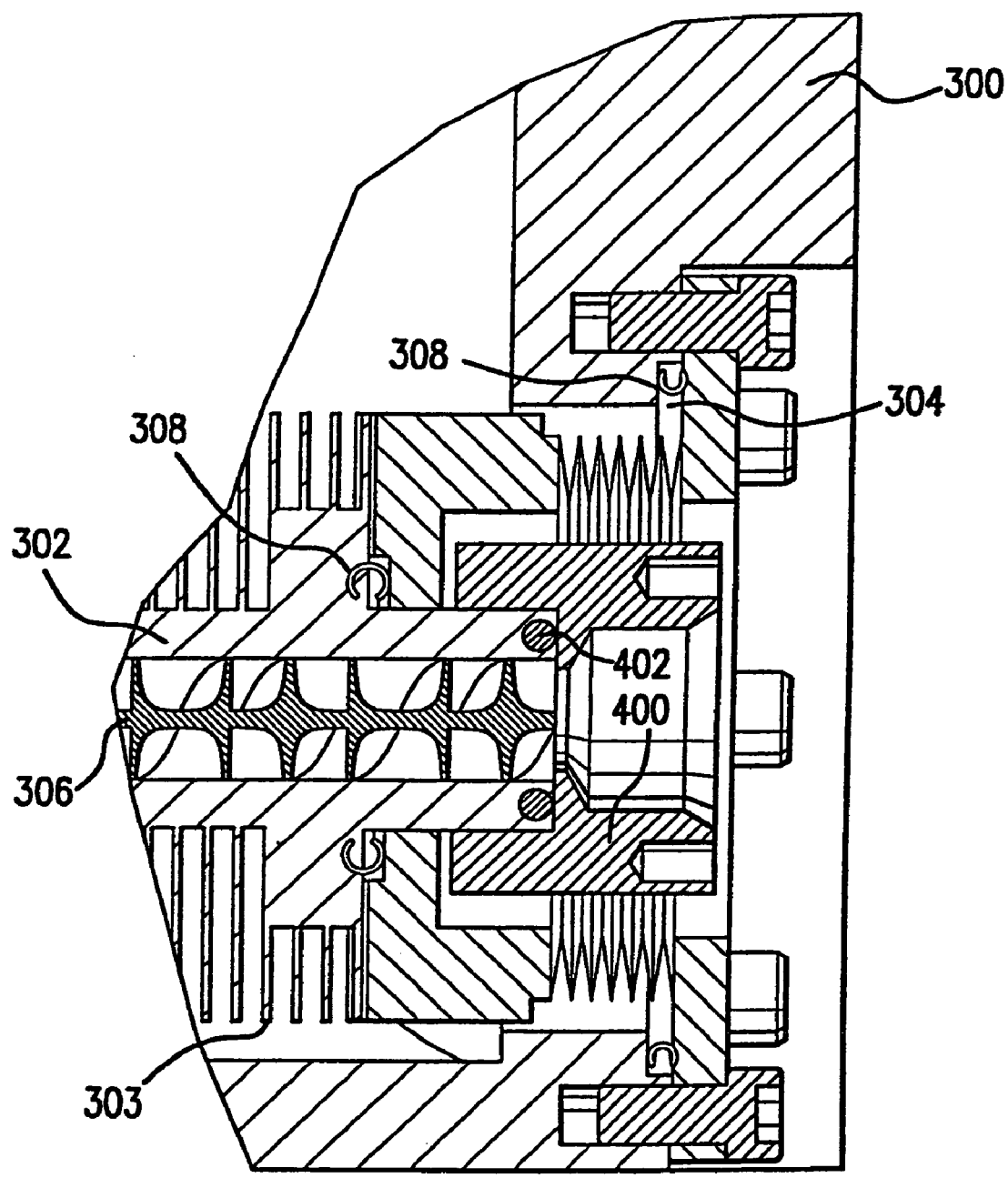

A cross sectional drawing of one of the heat exchangers is shown in FIG. 21. The middle section of the heat exchanger is cut out but both ends are shown. FIG. 21A shows an enlarged view of the end of the heat exchanger which accommodates thermal expansion and contraction.

The components of the heat exchanger includes a finned structure 302 which is machined from solid copper (CU 11000) and contains twelve fins 303 per inch. Water flow is through an axial passage having a bore diameter of 0.33 inch. A plastic turbulator 306 located in the axial passage prevents stratification of water in the passage and prevents the formation of a hot boundary layer on the inside surface of the passage. A flexible flange unit 304 is a welded unit comprised of inner flange 304A, bellows 304B and outer flange 304C. The heat exchanger unit includes three c-seals 308 to seal the water flowing in the heat exchanger from the laser gas. Bellows 304B permits expansion and contraction of the heat exchanger relative to the chamber. A double port nut 400 connects the heat exchanger passage to a standard 5/16 inch positional elbow pipe fitting which in turn is connected to a water source. O-ring 402 provides a seal between nut 400 and finned structure 302. In preferred embodiments cooling flow direction in two of the units is opposite the other two minimizing axial temperature gradients.

The Turbulator

In a preferred embodiment, the turbulator is comprised of four off-the-shelf, long in-line mixing elements which are typically used to mix epoxy components and are available from 3M Corporation (Static Mixer, Part No. 06-D1229-00). The in-line mixers are shown at 306 in FIGS. 21 and 21A. The in-line mixers force the water to flow along a generally helical path which reverses its clockwise direction about every pitch distance (which is 0.3 inch). The turbulator substantially improves heat exchanger performance. Tests by Applicants have shown that the addition of the turbulator reduces the required water flow by a factor of roughly 5 to maintain comparable gas temperature conditions.

Flow Path

In this preferred embodiment, gas flow into and out of the discharge region has been greatly improved over prior art laser chambers. The region upstream of the discharge and adjacent to the exit of the cross flow fan is shaped to form a smooth transition from a large cross section to the small cross section of the discharge. The cross section of the region directly downstream of the discharge increases smoothly for the small value of the discharge to a much greater value before the gas is forced to turn 90° into the heat exchangers. This arrangement minimizes the pressure drop and associated turbulence caused by high velocity flow over sharp steps.

Blower Motors and Large Blower

This first preferred embodiment of the present invention provides a large tangential fan driven by dual motors for circulating the laser gas. This preferred arrangement as shown in FIG. 24 provides a gas flow between the electrode of 67 m/sec which is enough to clear a space of about 1.7 cm in the discharge region between 4,000 Hz pulses.

A cross section blade structure of the fan is shown as 64A in FIG. 4. A prospective view is shown in FIG. 18A. The blade structure has a 5 inch diameter and is machined out of a solid aluminum alloy 6061-T6 bar stock. The individual blade in each section is slightly offset from the adjacent section as shown in FIG. 18A. The offset is preferably made non-uniform so as to avoid any pressure wave front creation. As an alternative, the individual blades can be slightly angled with respect to the blade axis (again to avoid creation of pressure wave fronts). The blades also have sharp leading edges to reduce acoustic reflections from the edge of the blade facing the discharge region.

Figure 18:
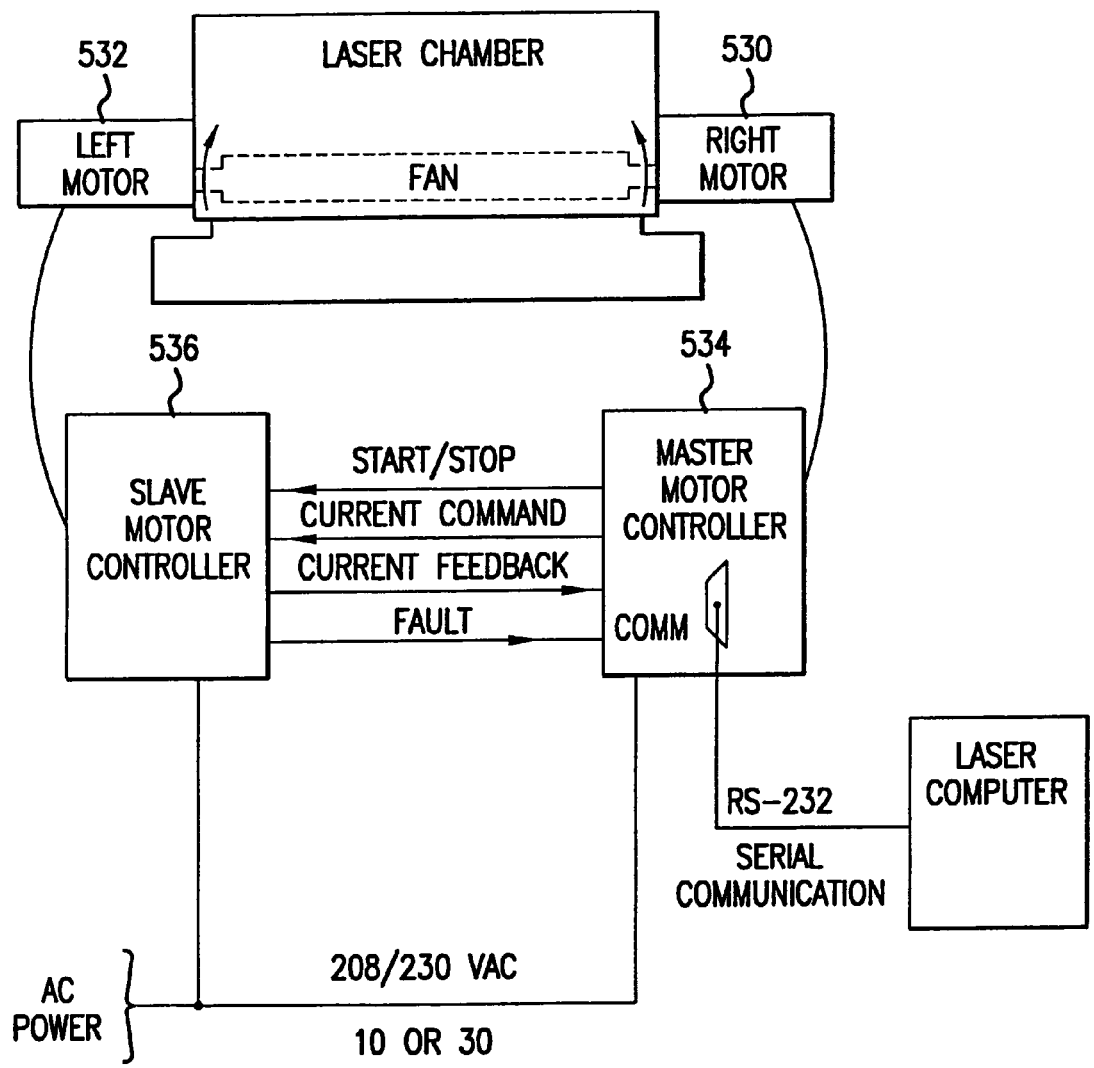
FIG. 18 shows a fan motor drive arrangement.
Figure 18A:
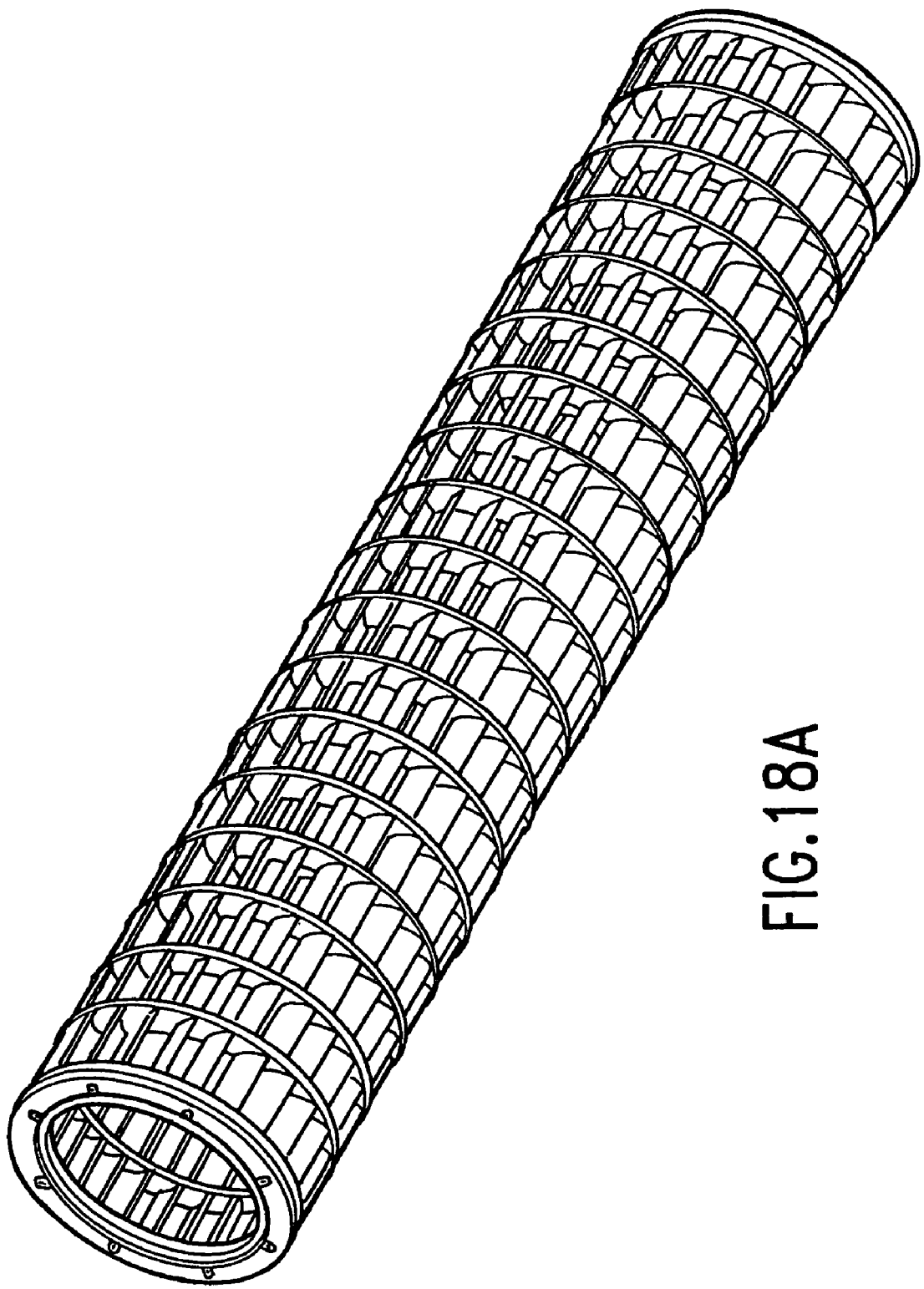
FIG. 18A show a preferred fan blade.

This embodiment as shown in FIG. 18 utilizes two 3 phase brushless DC motors each with a magnetic rotor contained within a metallic pressure cup which separates the stator portion of the motors from the laser gas environment as described in U.S. Pat. No. 4,950,840. In this embodiment, the pressure cup is thin-walled nickel alloy 400, 0.016 inch thick which functions as the laser gas barrier. The two motors 530 and 532 drive the same shaft and are programmed to rotate in opposite directions. Both motors are sensorless motors (i.e., they operate without position sensors). Right motor controller 534 which controls right motor 530 functions as a master controller controlling slave motor controller 536 via analog and digital signals to institute start/stop, current command, current feedback, etc. Communication with the laser controller 24A is via a RS-232 serial port into master controller 534.

High Duty Cycle LNP

Figure 17:
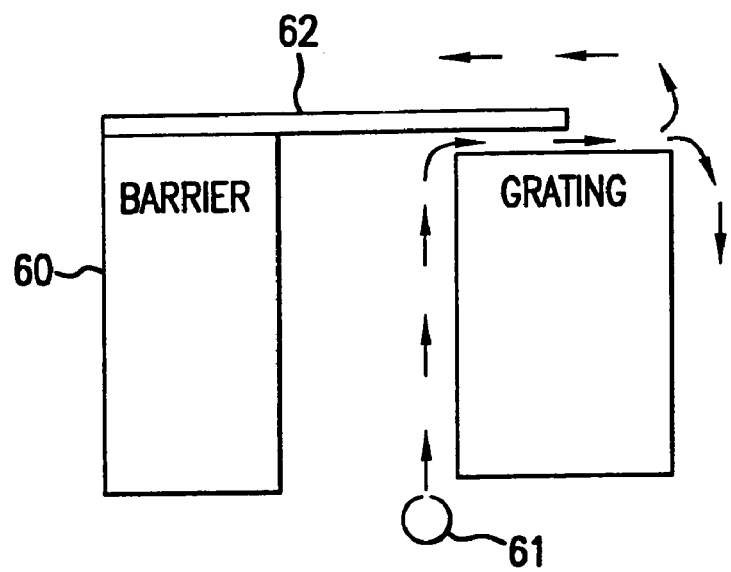
FIGS. 17, 17A, 17B and 17C show techniques for purging a grating face.
Figure 17A:
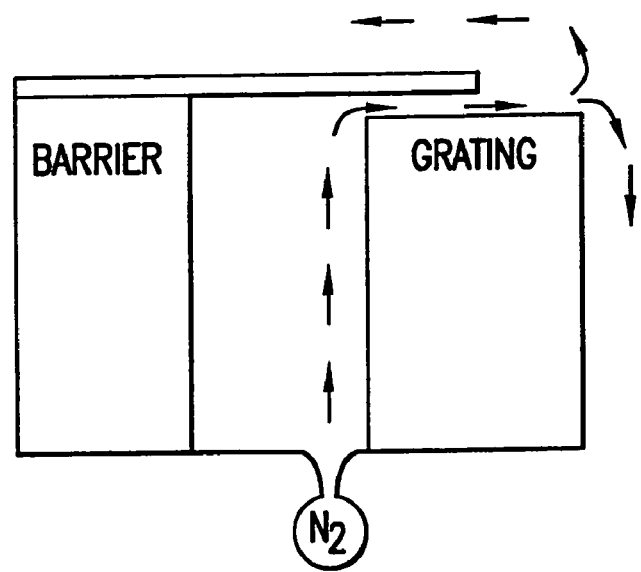
Figure 17B:
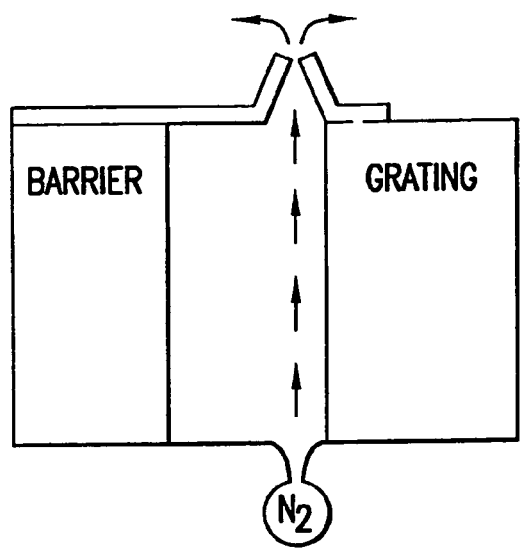
Figure 17C:
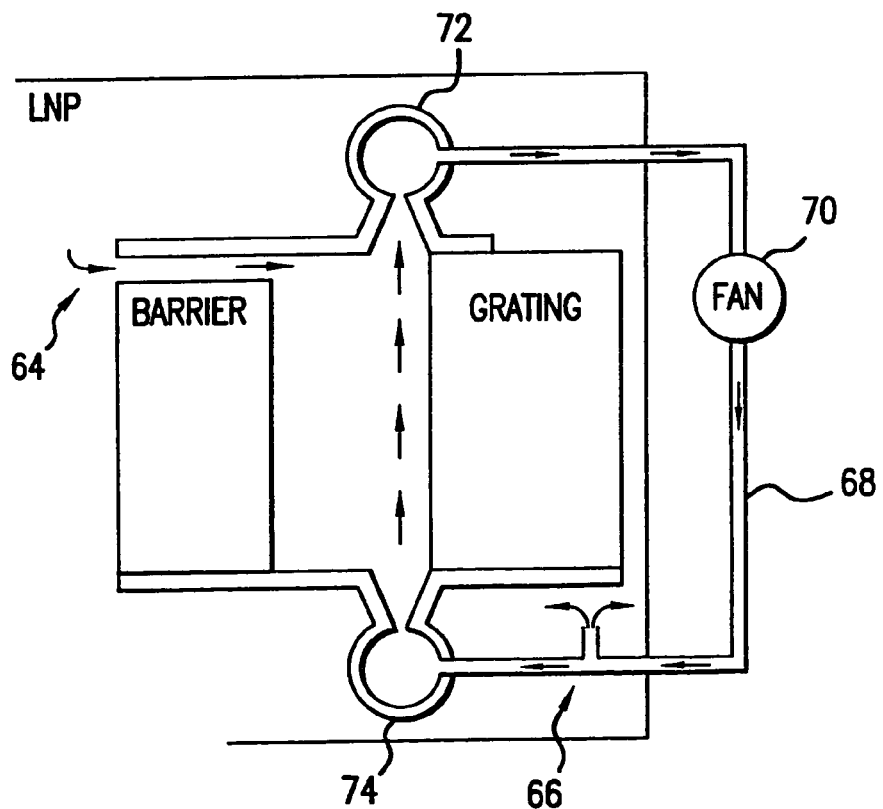

It is known to purge line narrowing packages; however, the prior art teaches keeping the purge flow from flowing directly on the grating face so that purge flow is typically provided through a port located at positions such as behind the face of the grating. Applicants have discovered, however, that at very high repetition rates a layer of hot gas (nitrogen) develops on the face of the grating distorting the wavelength. This distortion can be corrected at least in part by the active wavelength control discussed above. Another approach is to purge the face of the grating as shown in FIG. 17. In FIG. 17, small holes (1 mm on ¼ inch spacings) in the top of 10-inch long ⅜ inch diameter purge tube 61 provides the purge flow. The purge gas can be nitrogen from a pure nitrogen supply as described in a following section. However, for the LNP helium is the preferred purge gas since it can be more effective at removing heat from the LNP components. Other techniques are shown in FIGS. 17A, 17B and 17C.

Purge System

This first embodiment of the present invention includes an ultra-pure $N_2$ purge system which provides greatly improved performance and substantially increases component lifetime.

Figure 19:
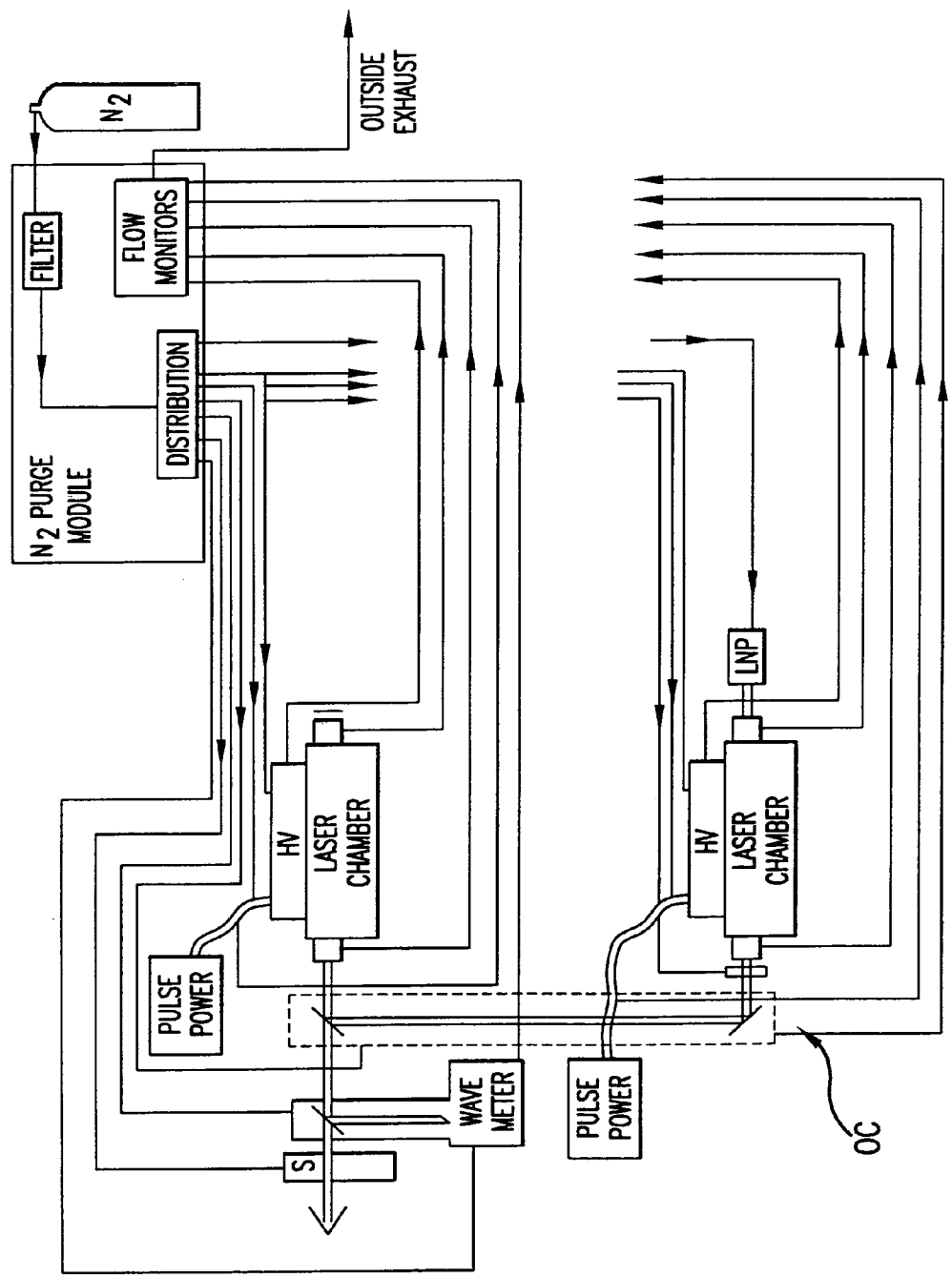

FIG. 19 is a block diagram showing important features of a first preferred embodiment the present invention. Five excimer laser components which are purged by nitrogen gas in this embodiment of the present system are LNP 2P, high voltage components 4P mounted on laser chamber 6P, high voltage cable 8P connecting the high voltage components 4P with upstream pulse power components 10P, output coupler 12P and wavemeter 14P. Each of the components 2P, 4P, 8P, 12P, and 14P are contained in sealed containers or chambers each having only two ports an $N_2$ inlet port and an $N_2$ outlet port. An $N_2$ source 16P which typically is a large $N_2$ tank (typically maintained at liquid nitrogen temperatures) at a integrated circuit fabrication plant but may be a relatively small bottle of $N_2$. $N_2$ source gas exits $N_2$ source 16P, passes into $N_2$ purge module 17P and through $N_2$ filter 18P to distribution panel 20P containing flow control valves for controlling the $N_2$ flow to the purged components. With respect to each component the purge flow is directed back to the module 17P to a flow monitor unit 22P where the flow returning from each of the purge units is monitored and in case the flow monitored is less than a predetermined value an alarm (not shown) is activated.

Figure 19A:
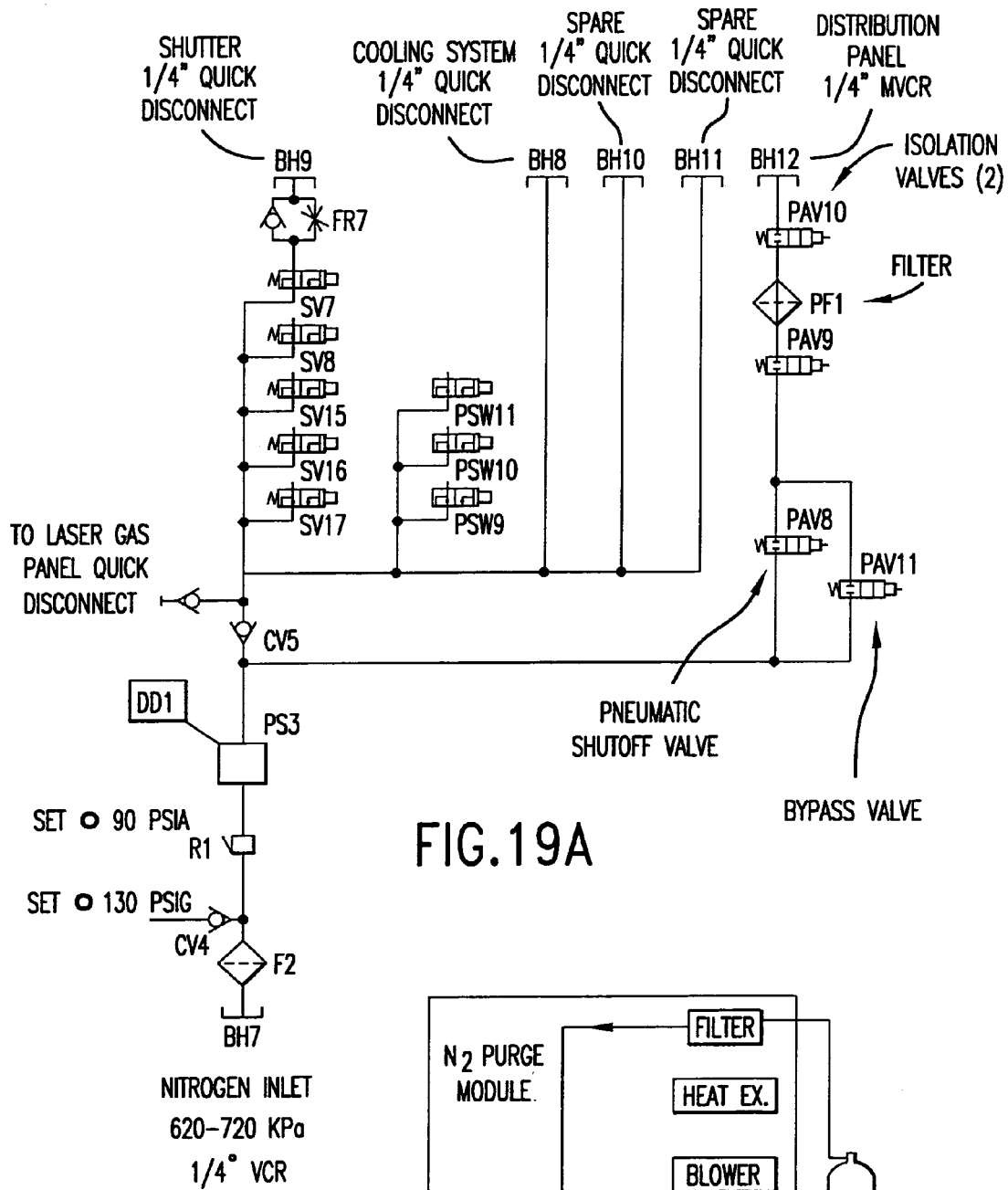

FIG. 19A is a line diagram showing specific components of this preferred embodiment including some additional $N_2$ features not specifically related to the purge features of the present invention.

$N_2$ Filter

An important feature of the present invention is the inclusion of $N_2$ filter 18. In the past, makers of excimer lasers for integrated circuit lithography have believed that a filter for $N_2$ purge gas was not necessary since $N_2$ gas specification for commercially available $N_2$ is almost always good enough so that gas meeting specifications is clean enough. Applicants have discovered, however, that occasionally the source gas may be out of specification or the $N_2$ lines leading to the purge system may contain contamination. Also lines can become contaminated during maintenance or operation procedures. Applicants have determined that the cost of the filter is very good insurance against an even low probability of contamination caused damage.

A preferred $N_2$ filter is Model 500K Inert Gas Purifier available from Aeronex, Inc. with offices in San Diego, Calif. This filter removes $H_2O$, $O_2$, CO, $CO_2$, $H_2$ and non-methane hydrocarbons to sub-parts-per-billion levels. It removes 99.9999999 percent of all particulate 0.003 microns or larger.

Flow Monitors

A flow monitor in unit 22 is provided for each of the five purged components. These are commercially available units having an alarm feature for low flow.

Piping

Preferably all piping is comprised of stainless steel (316SST) with electro polished interior. Certain types of plastic tubing, comprised of PFA 400 or ultra-high purity Teflon, may be also used.

Recirculation and Clean Up

Figure 19B:
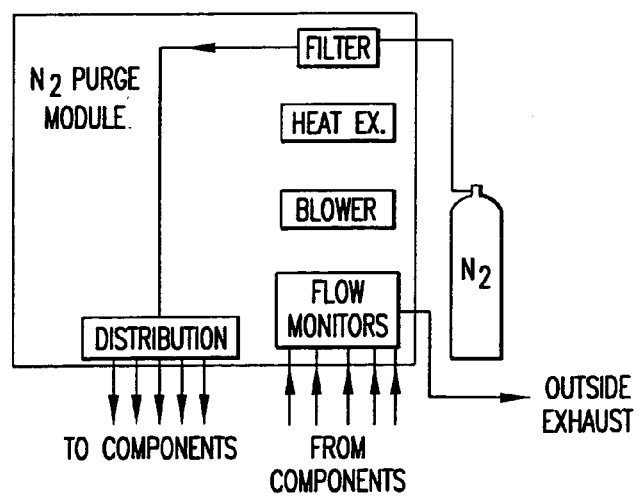

A portion or all of the purge gas could be recirculated as shown in FIG. 19B. In this case, a blower and a water cooled heat exchanger is added to the purge module. For example, purge flow from the optical components could be recirculated and purge flow from the electrical components could be exhausted or a portion of the combined flow could be exhausted. Also, an ozone clean-up element could be added to remove ozone from the enclosed beam path. This could include a filter made of one of several materials reactive with $O_3$.

Helium Purge of LNP

In preferred embodiments the LNP is purged with helium and the remainder of the beam path is surged with nitrogen. Helium has a much lower index of refraction than nitrogen so thermal effects in the LNP are minimized with the use of helium. However, helium is about 1000 times more expensive than nitrogen.

Improved Seals

Figure 19C:
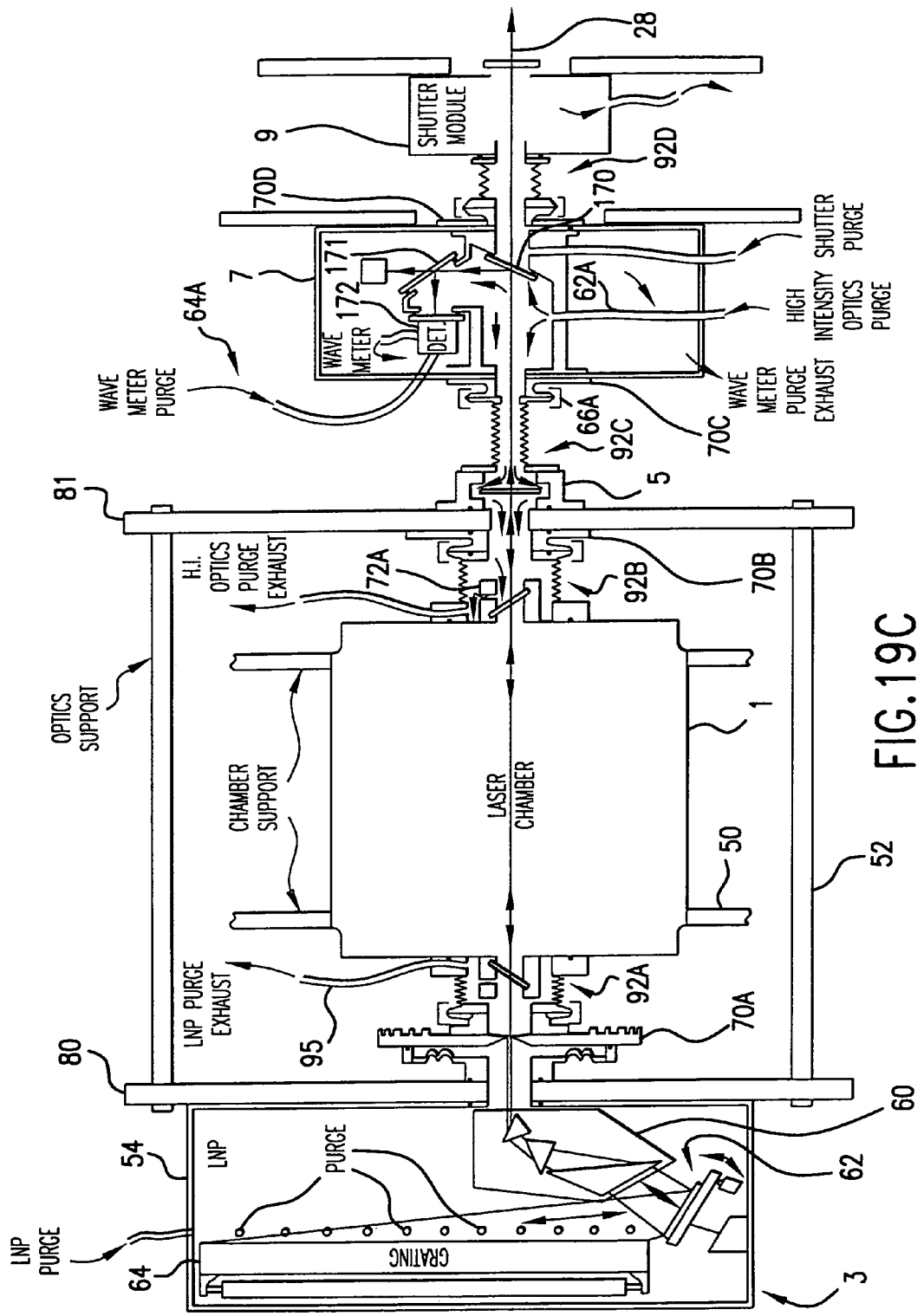
Figure 19D:
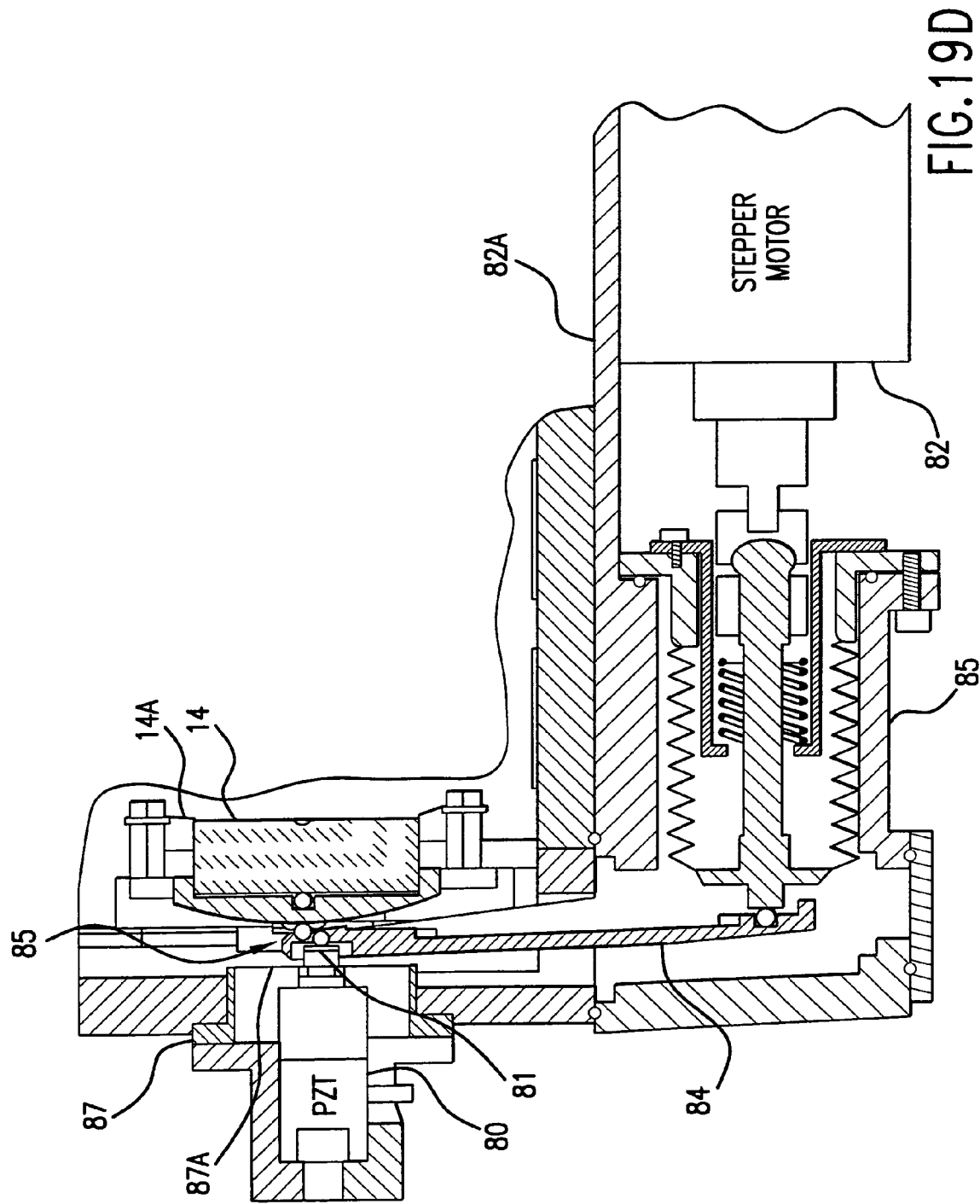
Figure 19E:
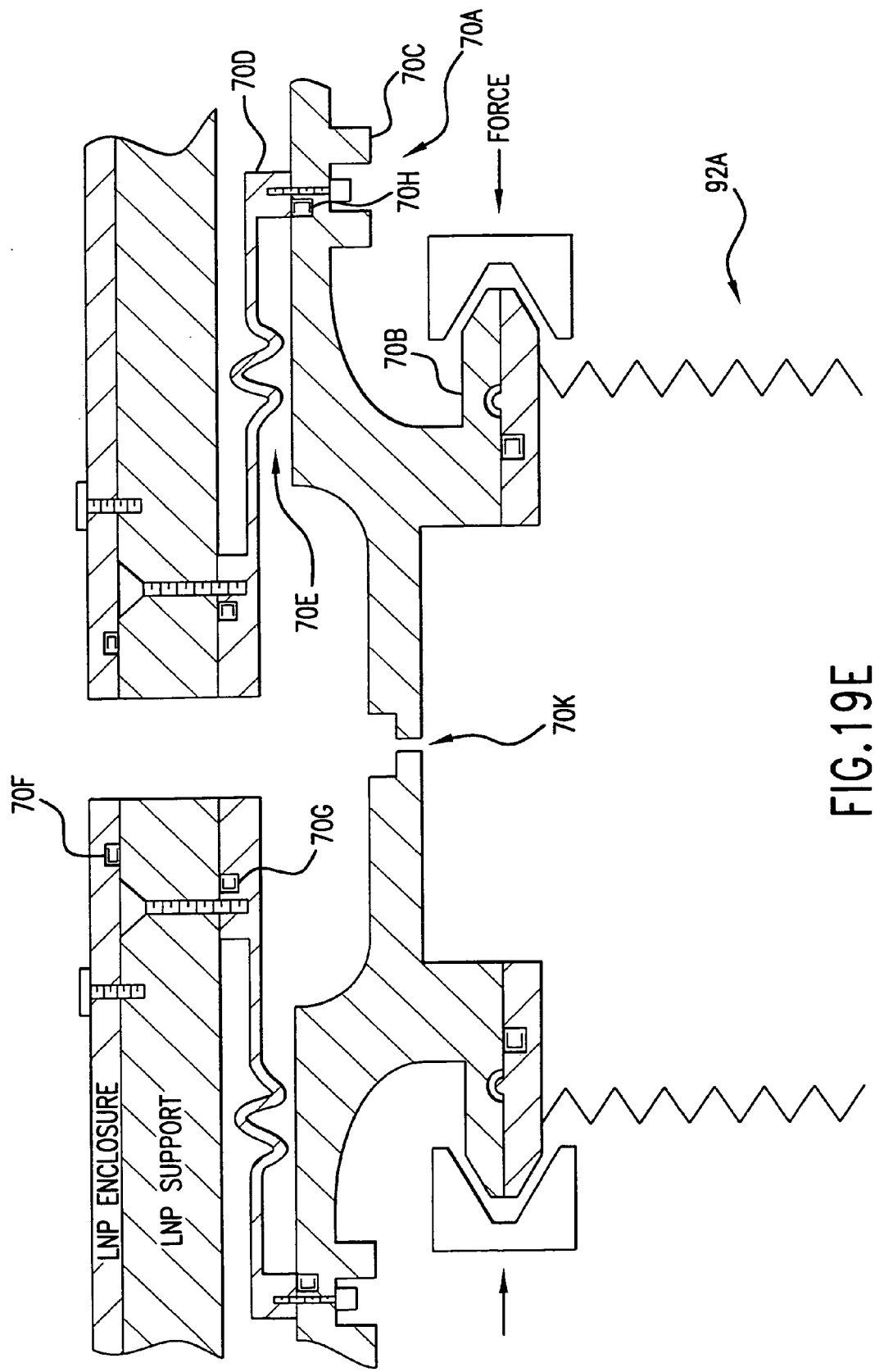
Figure 19G:
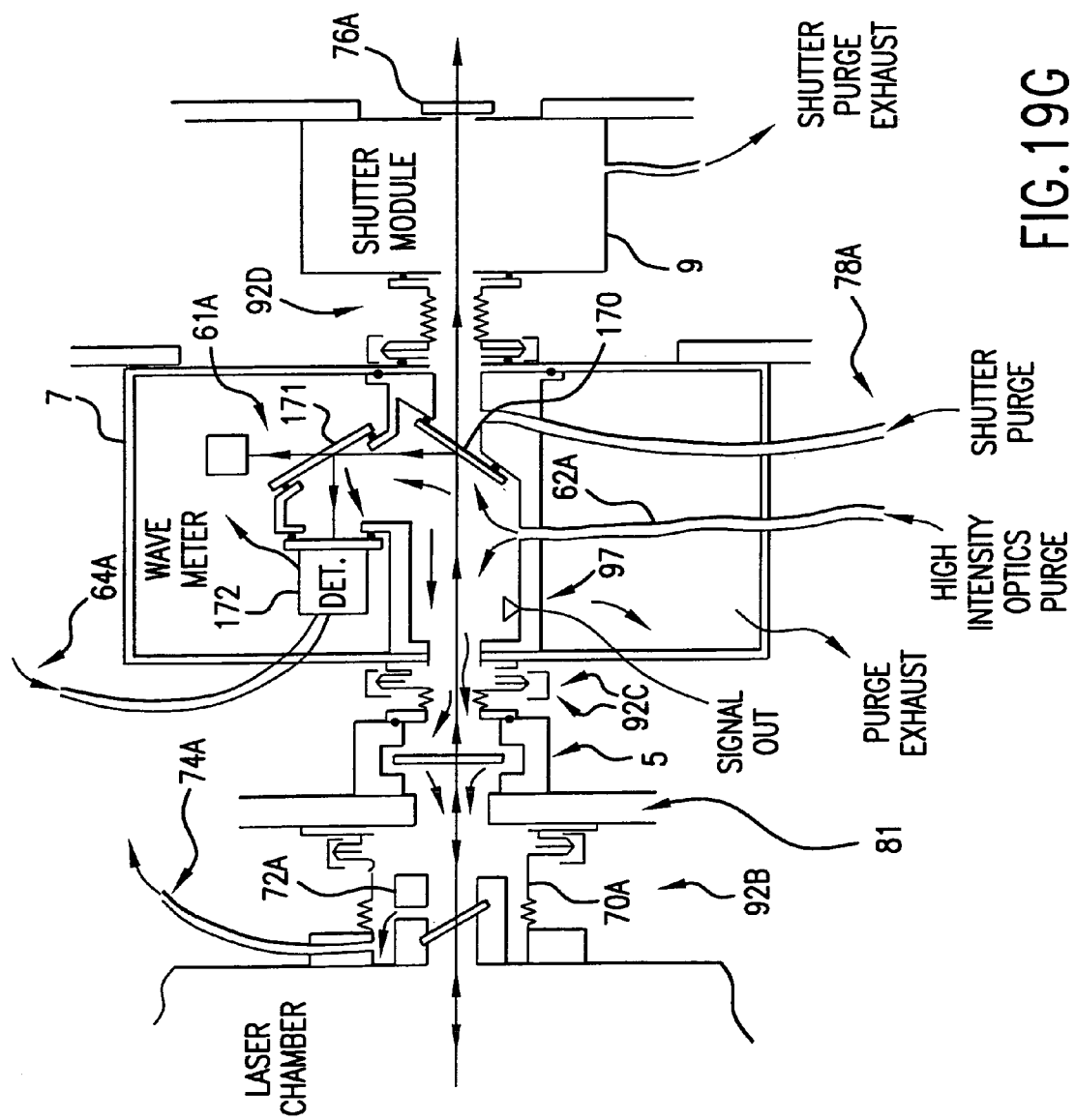

Preferred techniques for enclosing the beam path are described in U.S. patent application Ser. No. 10/000,991 filed Nov. 14, 2001, entitled "Gas Discharge Laser With Improved Beam Path" which is incorporated by reference herein. FIGS. 19C, D, E and F are extracted from that application. FIG. 19C is a drawing showing bellows seals between the various components of gas discharge system similar to the master oscillator is described above. FIG. 19D shows a modification including a bellows arrangement to the LNP stepper motor to seal the interface between the motor and the LNP enclosure. FIG. 19E shows a thermally decoupled aperture for the LNP which minimizes heating in the LNP and also encloses the LNP entrance so that it can be purged with helium. Helium exits the LNP through a chamber window unit as shown at 95 in FIG. 19C. FIGS. 19F 1, 2, 3, 4 and 5 show easy sealing bellows seal used to provide seals between the laser modules but allowing quick easy decoupling of the modules to permit quick module replacement. FIG. 19G shows a special purge arrangement to purge the high intensity portion of a wavemeter.

Advantages of the System

The system described herein represents a major improvement in long term excimer laser performance especially for ArF and $F_2$ lasers. Contamination problems are basically eliminated which has resulted in substantial increases in component lifetimes and beam quality. In addition, since leakage has been eliminated except through outlet ports the flow can be controlled to desired values which has the effect of reducing $N_2$ requirements by about 50 percent.

Sealed Shutter Unit With Power Meter

Figure 20:
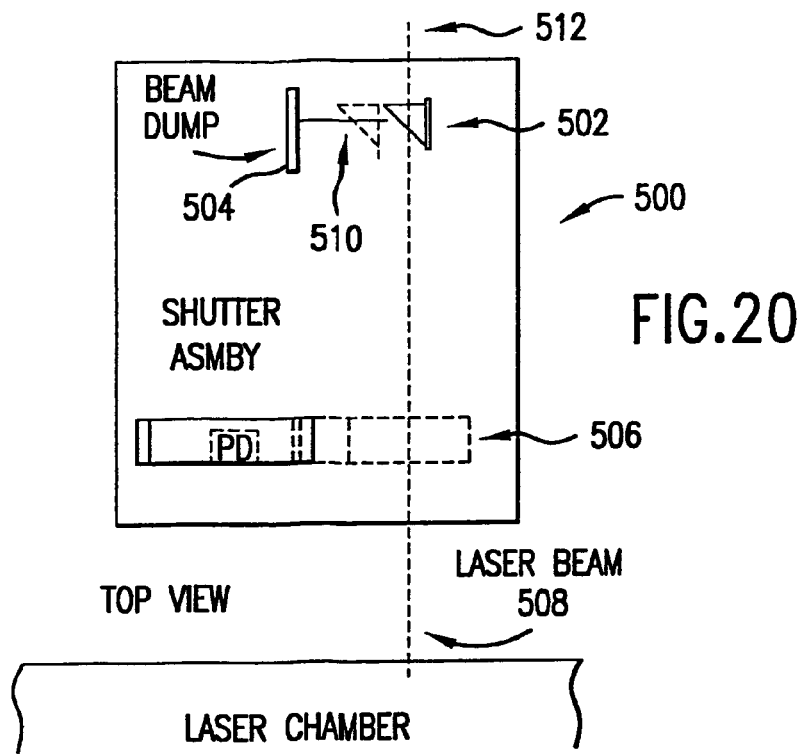
FIGS. 20, 20A and 20B show features of a preferred shutter.
Figures 20A, 20B:
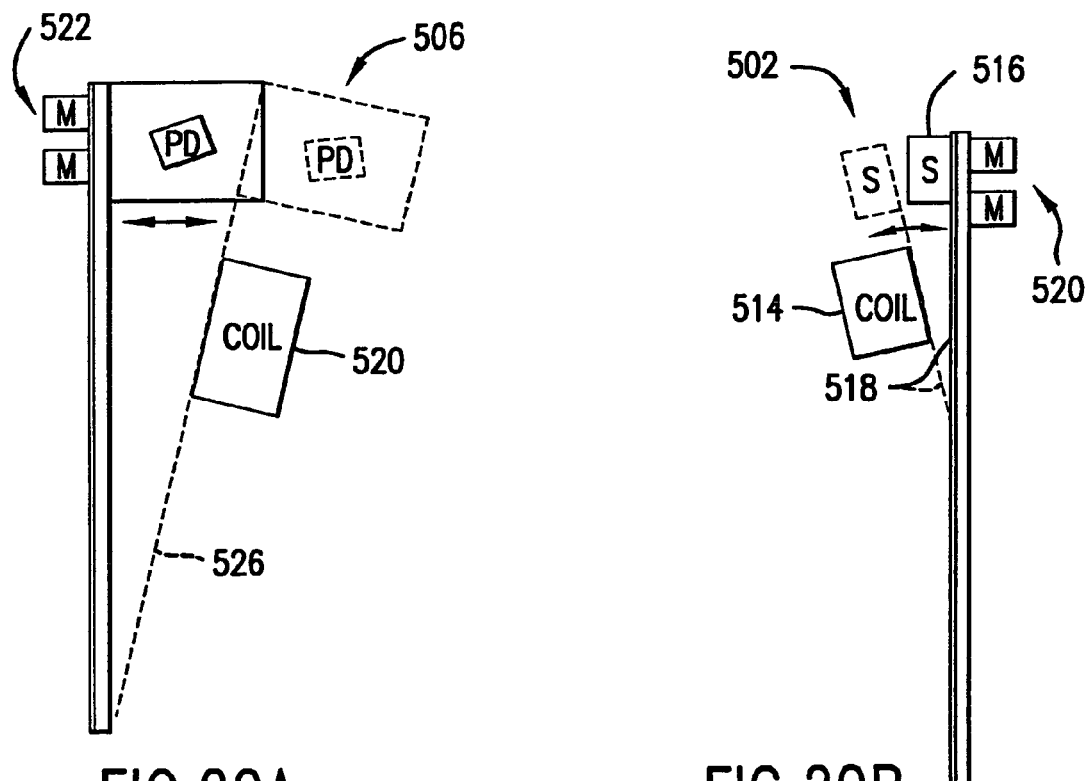

This first preferred embodiment includes a sealed shutter unit 500 with a built in power meter as shown in FIGS. 20, 20A and 20B. With this important improvement, the shutter has two functions, first, as a shutter to block the laser beam and, second, as a full beam power meter for monitoring beam power whenever a measurement is needed.

FIG. 20 is a top view showing the main components of the shutter unit. These are shutter 502, beam dump 504 and power meter 506. The path of the laser output beam with the shutter in the closed position is shown at 510 in FIG. 20. The path with the beam open is shown at 512. The shutter active surface of beam stop element 516 is at 45° with the direction of the beam exiting the chamber and when the shutter is closed the beam is both absorbed in the shutter surface and reflected to beam dump 504. Both the beam dump active surface and the shutter active surface is chrome plated for high absorption of the laser beam. In this embodiment, beam stop element 516 is mounted on flexible spring steel arm 518. The shutter is opened by applying a current to coil 514 as shown in FIG. 20B which pulls flexible arm 518 and beam stop element 516 to the coil removing beam stop element 516 from the path of the output laser beam. The shutter is closed by stopping the current flow through coil 514 which permits permanent magnets 520 to pull beam stop element 516 and flexible arm 518 back into the close position. In a preferred embodiment the current flow is carefully tailored to produce an easy transmit of the element and arm between the open and close positions.

Power meter 506 is operated in a similar fashion to place pyroelectric photo detector in the path of the output laser beam as shown in FIGS. 20 and 20A. In this case, coil 520 and magnets 522 pull detector unit 524 and its flexible arm 526 into and out of the beam path for output power measurements. This power meter can operate with the shutter open and with the shutter closed. Current to the coil is as with the shutter controlled to provide easy transit of unit 524 into and out of the beam path.

Special $F_2$ Laser Features

The above descriptions generally apply directly to an ArF laser system but almost all of the features are equally applicable to KrF lasers with minor modifications which are well known in the industry. Some significant modifications are required, however, for the $F_2$ version of this invention. These changes could include a line selector in the place of the LNP and/or a line selector between the two chambers or even downstream of the power amplifier. Line selectors preferably are a family of prisms. Transparent plates oriented at an angle with the beam could be used between the chambers to improve the polarization of the output beam. A diffuser could be added between the chambers to reduce the coherence of the output beam.

Figure 13:
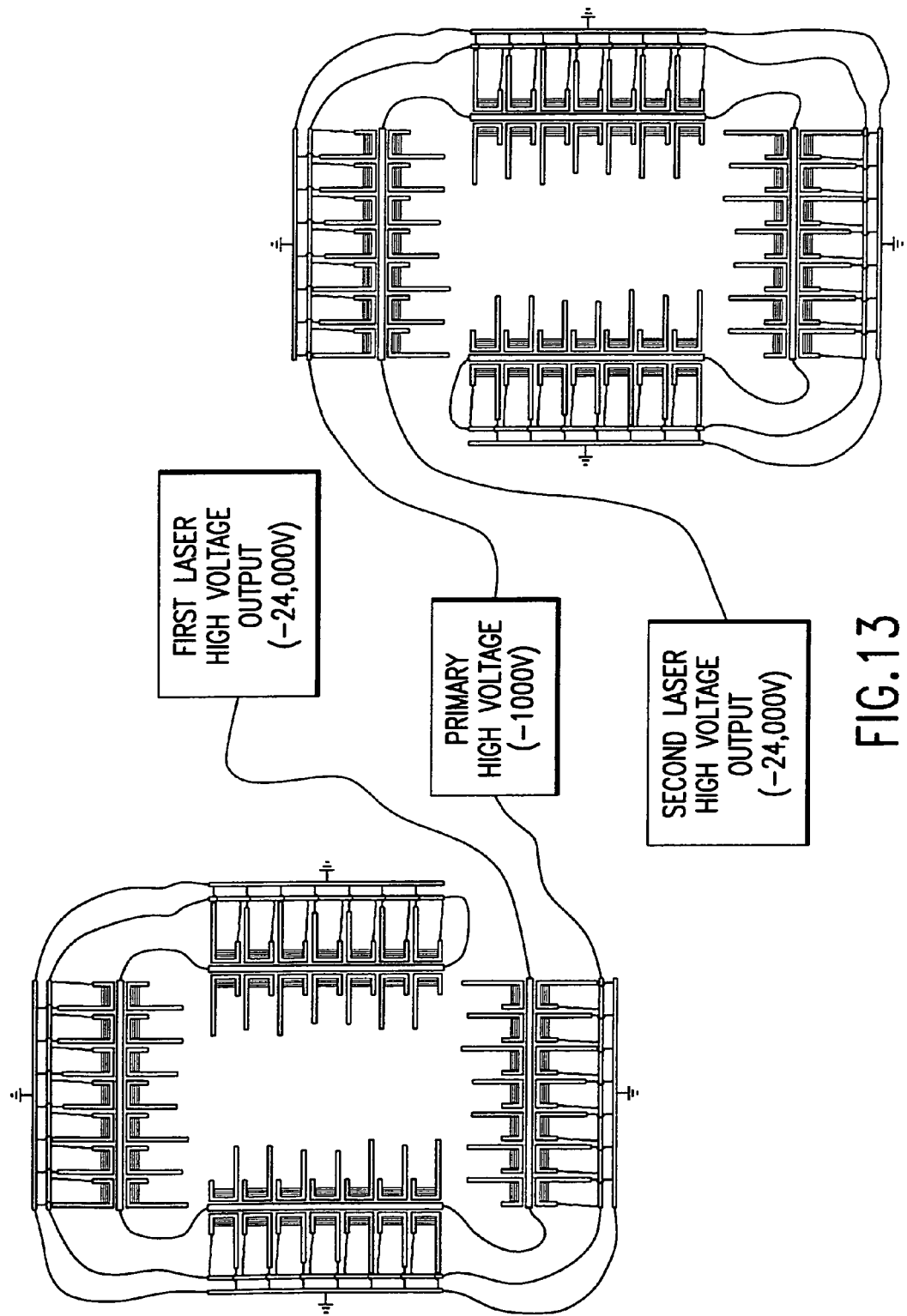
FIG. 13 shows a technique for minimizing jitter problems.

Various modifications may be made to the present invention without altering its scope. Those skilled in the art will recognize many other possible variations. For example, the pulse power circuit could be a common circuit up to the output of pulse transformer 56 as shown in FIG. 5. This approach provides for a further reduction in jitter as explained in U.S. patent application Ser. No. 09/848,043 which is incorporated herein by reference. FIG. 3B of that patent application showing the input and output to the pulse transformer is included herein as FIG. 13 for the convenience of the reader. Active feedback control of bandwidth can be provided by adjusting the curvature of the line narrowing grating using a motor driver to adjust the bending mechanism shown in FIG. 22A. Or much faster control of bandwidth could be provided by using piezoelectric devices to control the curvature of the grating. Other heat exchanger designs should be obvious modifications to the one configuration shown herein. For example, all four units could be combined into a single unit. There could be significant advantages to using much larger fins on the heat exchanger to moderate the effects of rapid changes in gas temperature which occurs as a result of burst mode operation of the laser. The reader should understand that at extremely high pulse rates the feedback control on pulse energy does not necessarily have to be fast enough to control the pulse energy of a particular pulse using the immediately preceding pulse. For example, control techniques could be provided where measured pulse energy for a particular pulse is used in the control of the second or third following pulse. Many variations and modifications in the algorithm for converting wavemeter etalon and grating data to wavelength values are possible. For example, Applicants have discovered that a very minor error results from a focusing error in the etalon optical system which causes the measured line width to be larger than it actually is. The error increases slightly as the diameter of the etalon fringe being measured gets larger. This can be corrected by scanning the laser and a range of wavelengths and watch for step changes as the measured fringes leave the windows. A correction factor can then be determined based on the position of the measured fringes within the windows. Many other layout configurations other than the one shown in FIG. 1 could be used. For example, the chambers could be mounted side-by-side or with the PA on the bottom. Also, the second laser unit could be configured as a slave oscillator by including an output coupler such as a partially reflecting mirror. Other variations are possible. Fans other than the tangential fans could be used. This may be required at repetition rates much greater than 4 kHz. The fans and the heat exchanger could be located outside the discharge chambers. Pulse timing techniques described in U.S. patent application Ser. No. 09/837,035 (incorporated by reference herein) could also be utilized. Since the bandwidth of the preferred embodiment can be less than 0.2 pm, measurement of the bandwidth with additional precision may be desired. This could be done with the use of an etalon having a smaller free spectral range than the etalons described above. Other techniques well known could be adapted for use to precisely measure the bandwidth. Accordingly, the above disclosure is not intended to be limiting and the scope of the invention should be determined by the appended claims and their legal equivalents.

We claim:

1. A multi-chamber gas discharge laser system comprising:
    a first laser unit comprising:
    a first discharge region containing:
        an excimer or molecular fluorine lasing gas medium;
        a first pair of electrodes defining the first discharge region containing the lasing gas medium,
    a line narrowing unit for narrowing a spectral bandwidth of output laser light pulse beam pulses produced in said first discharge region;
    a second laser unit comprising:
    a second discharge chamber containing:
        an excimer or molecular fluorine lasing gas medium;
        a second pair of electrodes defining the second discharge region containing the lasing gas medium;
    a pulse power system providing electrical pulses to the first pair of electrodes and to the second pair of electrodes producing gas discharges in the lasing gas medium between the respective first and second pair of electrodes, and
    laser parameter control mechanism modifying a selected parameter of a selected laser output light pulse beam pulse produced by said gas discharge laser system by controlling the timing of the occurrence of the gas discharge between the first pair of electrodes and the occurrence of the gas discharge between the second pair of electrodes.

2. The apparatus of claim 1 further comprising:
the first laser unit comprising a first laser chamber comprising a laser oscillator cavity;
the second laser unit comprising a second laser chamber comprising a laser amplifier section.

3. The apparatus of claim 1 further comprising:
the first laser unit comprising a master oscillator; and
the second laser unit comprising a power amplifier.

4. The apparatus of claim 2 further comprising:
the first laser unit comprising a master oscillator; and
the second laser unit comprising a power amplifier.

5. The apparatus of claims 1 further comprising:
the laser output light pulse beam pulse parameter comprising a spectral characteristic of the output laser light pulse beam pulse.

6. The apparatus of claims 2 further comprising:
the laser output light pulse beam pulse parameter comprising a spectral characteristic of the output laser light pulse beam pulse.

7. The apparatus of claims 3 further comprising:
the laser output light pulse beam pulse parameter comprising a spectral characteristic of the output laser light pulse beam pulse.

8. The apparatus of claims 4 further comprising:
the laser output light pulse beam pulse parameter comprising a spectral characteristic of the output laser light pulse beam pulse.

9. The apparatus of claim 1 further comprising:
the laser output light pulse beam pulse parameter comprising spectral width.

10. The apparatus of claim 2 further comprising:
the laser output light pulse beam pulse parameter comprising spectral width.

11. The apparatus of claim 3 further comprising:
the laser output light pulse beam pulse parameter comprising spectral width.

12. The apparatus of claim 4 further comprising:
the laser output light pulse beam pulse parameter comprising spectral width.

13. The apparatus of claim 5 further comprising:
the laser output light pulse beam pulse parameter comprising spectral width.

14. The apparatus of claim 6 further comprising:
the laser output light pulse beam pulse parameter comprising spectral width.

15. The apparatus of claim 7 further comprising:
the laser output light pulse beam pulse parameter comprising spectral width.

16. The apparatus of claim 8 further comprising:
the laser output light pulse beam pulse parameter comprising spectral width.

17. The apparatus of claims 1 further comprising:
the laser output light pulse beam pulse parameter comprising a pulse duration of the output laser light pulse beam pulse.

18. The apparatus of claims 2 further comprising:
the laser output light pulse beam pulse parameter comprising a pulse duration of the output laser light pulse beam pulse.

19. The apparatus of claims 3 further comprising:
the laser output light pulse beam pulse parameter comprising a pulse duration of the output laser light pulse beam pulse.

20. The apparatus of claims 4 further comprising:
the laser output light pulse beam pulse parameter comprising a pulse duration of the output laser light pulse beam pulse.

* * * * *